(12) United States Patent
Jeong et al.

(10) Patent No.: US 8,804,805 B2
(45) Date of Patent: Aug. 12, 2014

(54) DIGITAL BROADCASTING TRANSMITTER, DIGITAL BROADCASTING RECEIVER, AND METHOD FOR COMPOSING AND PROCESSING STREAMS THEREOF

(75) Inventors: Jin-hee Jeong, Yongin-si (KR); Hak-ju Lee, Incheon (KR); Se-ho Myung, Suwon-si (KR); Yong-Sik Kwon, Suwon-si (KR); Kum-ran Ji, Suwon-si (KR); June-hee Lee, Seongnam-si (KR); Chan-sub Park, Incheon (KR); Ga-hyun Ryu, Suwon-si (KR); Jung-jin Kim, Yongin-si (KR); Kyo-shin Choo, Yongin-si (KR); Sung-il Park, Suwon-si (KR); Jong-hwa Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 90 days.

(21) Appl. No.: 13/512,781

(22) PCT Filed: Nov. 30, 2010

(86) PCT No.: PCT/KR2010/008525
§ 371 (c)(1),
(2), (4) Date: May 30, 2012

(87) PCT Pub. No.: WO2011/065801
PCT Pub. Date: Jun. 3, 2011

(65) Prior Publication Data
US 2012/0236922 A1  Sep. 20, 2012

Related U.S. Application Data

(60) Provisional application No. 61/282,192, filed on Dec. 29, 2009, provisional application No. 61/282,200, filed on Dec. 29, 2009, provisional application No. 61/272,988, filed on Nov. 30, 2009.

(30) Foreign Application Priority Data

Nov. 29, 2010  (KR) .................. 10-2010-0120009

(51) Int. Cl.
*H03K 5/159* (2006.01)

(52) U.S. Cl.
USPC .......................................... 375/232

(58) Field of Classification Search
USPC .......... 375/232, 231, 260, 295; 370/231, 295, 370/260; 714/786
See application file for complete search history.

(56) References Cited

U.S. PATENT DOCUMENTS 8,201,062 B2 * 6/2012 Lee et al. ................. 714/786
2009/0028079 A1   1/2009 Song et al.
(Continued)

FOREIGN PATENT DOCUMENTS

| KR | 10-2009-0031324 A | 3/2009 |
| KR | 10-2009-0031382 A | 3/2009 |
| KR | 10-2009-0040861 A | 4/2009 |

OTHER PUBLICATIONS

Written Opinion (PCT/ISA/237) of the International Searching Authority, issued in corresponding International Application No. PCT/KR2010/008525 on Aug. 19, 2011.

(Continued)

*Primary Examiner* — Khai Tran
(74) *Attorney, Agent, or Firm* — Sughrue Mion, PLLC

(57) ABSTRACT

Disclosed is a method of processing a stream of a digital broadcasting receiver. The method comprises: arranging at least one of new mobile data and known data in at least a portion of an existing mobile data region and in at least a portion of a normal data region, in a stream which includes the normal data region and the existing mobile data region; and composing a transmission stream where at least one of the new mobile data and the known data is arranged, and wherein the arranging combines a block of data arranged in the existing mobile data region and a block of the new mobile data in the stream, and performs serially concatenated convolution code (SCCC) coding on the combined blocks.

12 Claims, 69 Drawing Sheets

(56) References Cited

U.S. PATENT DOCUMENTS

| | | |
|---|---|---|
| 2009/0028081 A1 | 1/2009 | Song et al. |
| 2009/0028247 A1 | 1/2009 | Suh et al. |
| 2009/0028272 A1 | 1/2009 | Song et al. |
| 2009/0029670 A1 | 1/2009 | Cho et al. |
| 2009/0029671 A1 | 1/2009 | Cho et al. |
| 2009/0031361 A1 | 1/2009 | Song et al. |
| 2009/0034442 A1 | 2/2009 | Song et al. |
| 2009/0034556 A1 | 2/2009 | Song et al. |
| 2009/0034629 A1 | 2/2009 | Suh et al. |
| 2009/0034630 A1 | 2/2009 | Cho et al. |
| 2009/0034652 A1 | 2/2009 | Song et al. |
| 2009/0034656 A1 | 2/2009 | Cho et al. |
| 2009/0036090 A1 | 2/2009 | Cho et al. |
| 2009/0037097 A1 | 2/2009 | Cho et al. |
| 2009/0037959 A1 | 2/2009 | Suh et al. |
| 2009/0040997 A1 | 2/2009 | Oh et al. |
| 2009/0041129 A1 | 2/2009 | Suh et al. |
| 2009/0042592 A1 | 2/2009 | Cho et al. |
| 2009/0044072 A1 | 2/2009 | Oh et al. |
| 2009/0044073 A1 | 2/2009 | Cho et al. |
| 2009/0044230 A1 | 2/2009 | Oh et al. |
| 2009/0044231 A1 | 2/2009 | Oh et al. |
| 2009/0046815 A1 | 2/2009 | Oh et al. |
| 2009/0051811 A1 | 2/2009 | Yoo et al. |
| 2009/0052521 A1 | 2/2009 | Song et al. |
| 2009/0052579 A1 | 2/2009 | Lee et al. |
| 2009/0052580 A1 | 2/2009 | Song et al. |
| 2009/0052581 A1 | 2/2009 | Song et al. |
| 2009/0052583 A1 | 2/2009 | Shin et al. |
| 2009/0052585 A1 | 2/2009 | Song et al. |
| 2009/0052587 A1 | 2/2009 | Song et al. |
| 2009/0055864 A1 | 2/2009 | Yoo et al. |
| 2009/0055865 A1 | 2/2009 | Yoo et al. |
| 2009/0055866 A1 | 2/2009 | Song et al. |
| 2009/0055867 A1 | 2/2009 | Kim et al. |
| 2009/0055871 A1 | 2/2009 | Song et al. |
| 2009/0055872 A1 | 2/2009 | Kwak et al. |
| 2009/0055875 A1 | 2/2009 | Lee et al. |
| 2009/0055882 A1 | 2/2009 | Song et al. |
| 2009/0055885 A1 | 2/2009 | Yoo et al. |
| 2009/0055886 A1 | 2/2009 | Song et al. |
| 2009/0059086 A1 | 3/2009 | Lee et al. |
| 2009/0060030 A1 | 3/2009 | Song et al. |
| 2009/0060044 A1 | 3/2009 | Suh et al. |
| 2009/0060051 A1 | 3/2009 | Song et al. |
| 2009/0064244 A1 | 3/2009 | Shin et al. |
| 2011/0188521 A1* | 8/2011 | Simon et al. ............... 370/509 |
| 2012/0114070 A1* | 5/2012 | Choi et al. ................. 375/295 |

OTHER PUBLICATIONS

International Search Report (PCT/ISA/210), issued by the International Searching Authority in corresponding International Application No. PCT/KR2010/008525 on Aug. 19, 2011.

* cited by examiner

A) BEFORE INTERLEAVING a) Mode 1 b) Mode 2 c) Mode 3 d) Mode 4 a) Mode 1 c) Mode 3 d) Mode 4 b) Mode 2 c) Mode 3 d) Mode 4

FIG. 40A

| ATSC Mobile 1.1 |
| ATSC Mobile 1.1 |
| ATSC Mobile 1.1 |
| ATSC Mobile 1.1 |
| Normal |
| Normal |
| Normal |
| ⋮ |
| Normal |
| Normal |
| Normal |
| ATSC Mobile 1.1 |
| ATSC Mobile 1.1 |
| ATSC Mobile 1.1 |
| ATSC Mobile 1.1 | a) Mode 1

FIG. 40B

| |
|---|
| ATSC Mobile 1.1 |
| ATSC Mobile 1.1 |
| ATSC Mobile 1.1 |
| ATSC Mobile 1.1 |
| ATSC Mobile 1.1 |
| ATSC Mobile 1.1 |
| ATSC Mobile 1.1 |
| ATSC Mobile 1.1 |
| Normal |
| Normal |
| ⋮ |
| Normal |
| Normal |
| ATSC Mobile 1.1 |
| ATSC Mobile 1.1 |
| ATSC Mobile 1.1 |
| ATSC Mobile 1.1 |
| ATSC Mobile 1.1 |
| ATSC Mobile 1.1 |
| ATSC Mobile 1.1 |
| ATSC Mobile 1.1 | b) Mode 2 c) Mode 3

FIG. 41

| Type 1 |
|---|
| Type 0 |
| Type 0 |
| Type 0 |
| Type 1 |
| Type 0 |
| Type 0 |
| Type 0 |
| Type 1 |
| Type 0 |
| Type 0 |
| Type 0 |

FIG. 42A ex 1: Type 0 | Type 1-1 | Type 1-2 | Type 1-3 | Type 1-4 | Type 0 | Type 1-1 | Type 1-2 | Type 1-3 | Type 1-4 | Type 0 | Type 1-1 | Type 1-2 | Type 1-3 | Type 1-4 | Type 0

FIG. 42B ex 2: Type 1-4 | Type 0 | Type 1-4 | Type 0 | Type 1-4 | Type 0 | Type 1-4 | Type 0 | Type 1-4 | Type 0 | Type 1-4 | Type 0 | Type 1-4 | Type 0 | Type 1-4 | Type 0

FIG. 42C ex 3: Type 1-4 | Type 0 | Type 1-3 | Type 0 | Type 1-4 | Type 0 | Type 1-3 | Type 0 | Type 1-4 | Type 0 | Type 1-3 | Type 0 | Type 1-4 | Type 1-3 | Type 0

FIG. 42D ex 4: Type 1-4 | Type 1-2 | Type 1-3 | Type 0 | Type 1-4 | Type 1-2 | Type 1-3 | Type 0 | Type 1-4 | Type 1-2 | Type 1-3 | Type 0 | Type 1-4 | Type 1-2 | Type 1-3 | Type 0

FIG. 42E ex 5: Type 1-4 | Type 1-2 | Type 1-3 | Type 1-1 | Type 1-4 | Type 1-2 | Type 1-3 | Type 1-1 | Type 1-4 | Type 1-2 | Type 1-3 | Type 1-1 | Type 1-4 | Type 1-2 | Type 1-3 | Type 1-1

FIG. 42F ex 6: Type 1-4 | Type 1-4 | Type 1-4 | Type 1-4 | Type 1-4 | Type 1-4 | Type 1-4 | Type 1-4 | Type 1-4 | Type 1-4 | Type 1-4 | Type 1-4 | Type 1-4 | Type 1-4 | Type 1-4 | Type 1-4

_US 8,804,805 B2_

DIGITAL BROADCASTING TRANSMITTER, DIGITAL BROADCASTING RECEIVER, AND METHOD FOR COMPOSING AND PROCESSING STREAMS THEREOF

CROSS-REFERENCE TO RELATED APPLICATIONS

This application claims priority from Provisional Application Nos. 61/272,988, 61/282,192 and 61/282,200, filed on Nov. 30, 2009, Dec. 29, 2009 and Dec. 29, 2009, respectively, and Korean Patent Application No. 10-2010-0120009, filed on Nov. 29, 2010 in the Korean Intellectual Property Office, the entire disclosures of which are incorporated herein by reference.

BACKGROUND

1. Field

Methods and apparatuses consistent with the exemplary embodiments relate to a digital broadcasting transmitter, digital broadcasting receiver, and method tier composing and processing streams thereof, and more particularly, to a digital broadcasting transmitter which constitutes and transmits transmission streams which include normal data and mobile data, and a digital broadcasting receiver which receives and processes the transmission streams and processes, and methods thereof.

2. Description of the Related Art

As digital broadcasting becomes widespread, various types of electronic devices support digital broadcasting services in particular, besides digital broadcasting televisions (TVs) and set top boxes which are provided in homes, portable devices which individuals carry, thr example, mobile phones, navigations, personal digital assistants (PDAs), and Moving Picture Experts Group Audio Layer 3 (MP3) players also have functions supporting digital broadcasting services.

Therefore, there has been discussion on digital broadcasting standards for providing digital broadcasting services in such portable devices.

Discussion on Advanced Television Systems Committee-Mobile/Handheld (ATSC-MH) standards was one of them. According to an ATSC-MH standard, a technology is being disclosed for providing mobile data together within transmission streams for transmitting normal data and transmitting such data.

Since mobile data is data which is received and processed in portable devices, it is processed in formats more robust than normal data due to migratory characteristics of portable devices, and is included in transmission streams.

FIGS. 1A~1B illustrate a configuration of a transmission stream which includes mobile data and normal data according to an exemplary embodiment.

FIG. 1A is a structure of a stream where mobile data and normal data are each arranged in a packet allocated to each data and multiplexed.

The stream in FIG. 1A is convened into a structure as shown in FIG. 1B by interleaving. According to FIG. 1B, MH, that is, mobile data are divided into mobile data in A region and mobile data in B region by the interleaving. A region represents a region within a certain range based on a portion where mobile data which is a same or bigger than a certain size is gathered in a plurality of transmitting units, and B region represents a region except A region in the stream structure. Dividing the stream structure into A region and B region is merely an exemplary embodiment, and thus, such division may be made differently according to circumstances. That is, a division may be made such that A region does not include normal data, and B region is any transmitting unit which has normal data.

B region is relatively vulnerable to errors as transmission errors, compared to A region. In digital broadcasting data, known data, for instance, a training sequence may be included to be used for correcting errors. However, this known data is not arranged in B region according to a related-art ATSC-MH standard, and thus, B region is vulnerable to errors.

In addition, as a stream structure is set as in FIGS. 1A~1B, there are limitations to transmitting and/or receiving mobile data. That is, under this stream structure, it may not be possible to use a portion allocated to normal data, and thus, there is a concern that efficiency of a stream is deteriorating.

Accordingly, there has been growing needs for a technology which enables efficient use of a stream.

SUMMARY

One or more exemplary embodiments provide a digital broadcasting transmitter, a digital broadcasting receiver, and a method for forming and processing streams, and more particularly, a digital broadcasting transmitter which forms and transmits a transmission stream which includes normal data and mobile data, and a digital broadcasting receiver which receives and processes the transmission stream, and methods thereof.

According to an aspect of an exemplary embodiment, a stream processing method of a digital broadcasting transmitter may include arranging at least one of new mobile data and known data in at least a portion of an existing mobile data region and in at least a portion of a normal data region, in a stream which includes the normal data region and the existing mobile data region; and composing a transmission stream where at least one of the new mobile data and the known data is arranged, and wherein the arranging combines a block of data arranged in the existing mobile data region and a block of the new mobile data in the stream, and performs serially concatenated convolution code (SCCC) coding on the combined blocks.

The block of data arranged in the existing mobile data region and the block of the new mobile data may be combined differently according to at least one of a setting state of a Reed Solomon (RS) frame mode, a block mode and a slot mode.

The SCCC coding may be performed by at least one of a ½ rate, a ⅓ rate, and a ¼ rate.

A rate of the SCCC coding may be applied differently according to a setting state of an SCCC outer code mode.

The stream may be divided into frame units, wherein one frame may be divided into a plurality of sub-frames, and in at least a portion of the plurality of sub-frames, signaling information on a current frame may be included, while in remaining sub-frames of the plurality of sub-frames, signaling information on a next frame may be included.

According to an aspect of another exemplary embodiment, a digital broadcasting transmitter may include a data preprocessor which arranges at least one of new mobile data and known data in at least a portion of an existing mobile data region and in at least a portion of a normal data region, in a stream which includes the normal data region and the existing mobile data region; and a multiplexer which composes a transmission stream where at least one of the new mobile data and the known data is arranged, and wherein the data preprocessor combines a block of data arranged in the existing mobile data region and a block of the new mobile data in the stream, and performs SCCC coding on the combined blocks.

The data preprocessor may combine the block of data arranged in the existing mobile data region and the block of the new mobile data differently according to at least one of a setting state of an RS frame mode, a block mode and a slot mode.

The SCCC coding may be performed by at least one of a ½ rate a ⅓ rate, and a ¼ rate.

A rate of the SCCC coding may be applied differently according to a setting state of an SCCC outer code mode.

The stream may be divided into frame units, wherein one frame may be divided into a plurality of sub-frames, and in at least a portion of the plurality of sub-frames, signaling information on a current frame may be included, while in remaining sub-frames of the plurality of sub-frames, signaling information on a next frame may be included.

According to an aspect of another exemplary embodiment, a stream processing method of a digital broadcasting receiver may include receiving a stream formed by combining existing data arranged in an existing mobile data region and new mobile data arranged in at least one of a normal data region and the existing mobile data region in block units, and performing SCCC coding on the stream; demodulating the stream; equalizing the demodulated stream; and decoding at least one of the existing data and the new mobile data from the equalized stream.

The stream may be divided into frame units, wherein one frame may be divided no a plurality of sub-frames, and in at least a portion of the plurality of sub-frames, signaling information on a current frame may be included, while in remaining sub-frames of the plurality of sub-frames, signaling information on a next frame may be included.

The SCCC coding may be performed by at least one of a ½ rate, a ⅓ rate, and a ¼ rate.

According to an aspect of another exemplary embodiment, a digital broadcasting receiver may include a receiver which receives a stream formed by combining existing data arranged in an existing mobile data region and new mobile data arranged in at least one of a normal data region and the existing mobile data region in block units, and performing serially concatenated convolution code (SCCC) coding on the stream; a demodulator which equalizes the demodulated stream; and a decoder which decodes at least one of the existing data and the new mobile data from the equalized stream.

The stream may be divided into frame units, wherein one frame may be divided into a plurality of sub-frames, and in at least a portion of the plurality of sub-frames, signaling information on a current frame may be included, while in remaining sub-frames of the plurality of sub-frames, signaling information on a next frame may be included.

The SCCC coding may be performed by at least one of a ½ rate, a ⅓ rate, and a ¼ rate.

BRIEF DESCRIPTION OF THE DRAWINGS

The above and/or other aspects will be more apparent with reference to the accompanying drawings, in which:

FIGS. 37A to 40C are views illustrating a pattern of arranging mobile data according to various modes;

FIGS. 41 to 43 are views illustrating a state where various types of slots are repeatedly arranged consecutively;

DETAILED DESCRIPTION

Figure 1A:
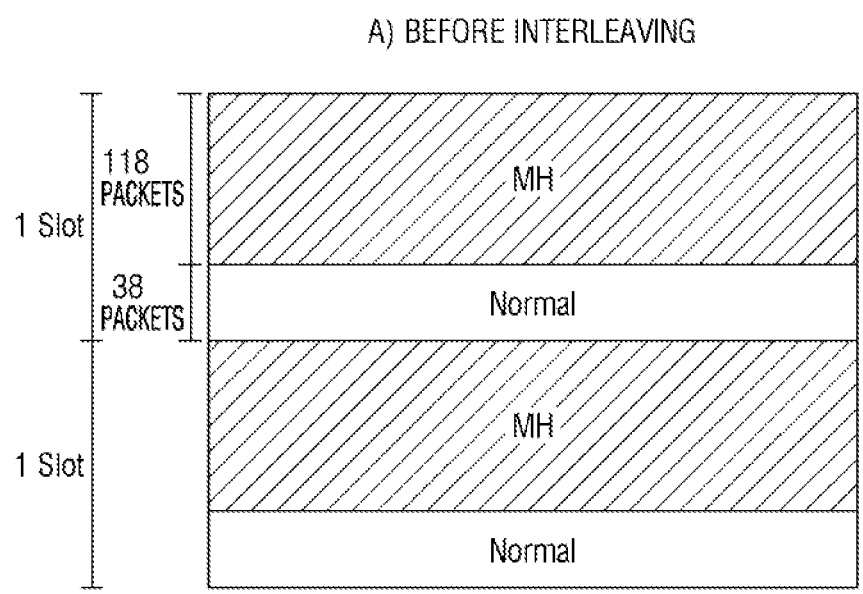
FIGS. 1A to 1B illustrate an example of a configuration of a transmission stream according to an ATSC-MH standard.

Certain exemplary embodiments are described below in detail with reference to the accompanying drawings.

In the following description, like drawing reference numerals are used for the like elements, even in different drawings. The matters defined the description, such as detailed construction and elements, are provided to assist in a comprehensive understanding of exemplary embodiments. However, exemplary embodiments can be practiced without those specifically defined matters. Also, well-known functions or constructions are not described in detail since they may obscure the inventive concept with unnecessary detail.

Although a few exemplary embodiments have been shown and described, it would be appreciated by those skilled in the art that changes may be made in these embodiments without departing from the principles and spirit of the inventive concept, the scope of which is defined in claims and their equivalents.

[Digital Broadcasting Transmitter]

Figure 2:
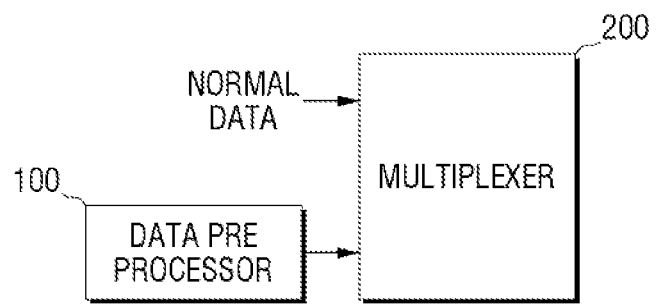
FIGS. 2 to 4 are block diagrams illustrating configurations of digital broadcasting transmitters according to various exemplary embodiments.

FIG. 2 illustrates a digital broadcasting transmitter which includes a data preprocessor 100 and multiplexer 200, according to an exemplary embodiment.

The data preprocessor 100 receives mobile data, processes the received mobile data, and converts the processed mobile data into a format adequate for transmission.

The multiplexer 200 forms or constitutes a transmission stream which includes mobile data output from the data preprocessor 100. In a case where normal data must be transmitted together, the multiplexer 200 multiplexes mobile data and normal data to form a transmission stream.

The data preprocessor 100 may process mobile data such that the mobile data is also arranged in an entire or a portion of a packet allocated to normal data in the entire stream.

As illustrated, in FIG. 1A, the ATSC-MH standard provides that some packets among the entire packets of the stream are arranged to be allocated to normal data. More specifically, as in FIG. 1A, a stream may be divided into a plurality of slots in time units, and each slot may include a total of 156 packets. Of these packets, 38 packets are allocated to normal data, and the remaining 118 packets may be allocated to mobile data. For convenience of explanation, herein, the aforementioned 118 packets are referred to as a region allocated to mobile data, or a first region, while the aforementioned 38 packets are referred to as a region allocated, to normal data, or a second region. In addition, normal data refers to various types of existing data which may be received and processed in legacy TVs, while mobile data refers to a type of data which may be received and processed in mobile devices. Depending on circumstances, mobile data may be expressed in various terms such as robust data, turbo data, and additional data, etc. Herein, describing that a packet or packets are allocated to normal data (or mobile data) means that the packet or packets are originally allocated to normal data (or mobile data) as shown in FIG. 1A.

The data preprocessor 100 arranges data for mobile devices in a packet region allocated to mobile data, and may arrange mobile data in an entire or a portion of a packet allocated to normal data. Mobile data arranged in the packet region allocated to mobile data (the first region) and mobile data arranged in an entire or a portion of a packet allocated to normal data (the second region) may be the same data, or a different kind of data.

Meanwhile, the data preprocessor 100 may arrange mobile data in various types according to setting states such as frame mode and mode. Arrangement forms of mobile data will be explained hereinafter with reference to the accompanying drawings.

The multiplexer 200 multiplexes normal data and the streams output from the data preprocessor 100 and forms a transmission stream.

Figure 3:
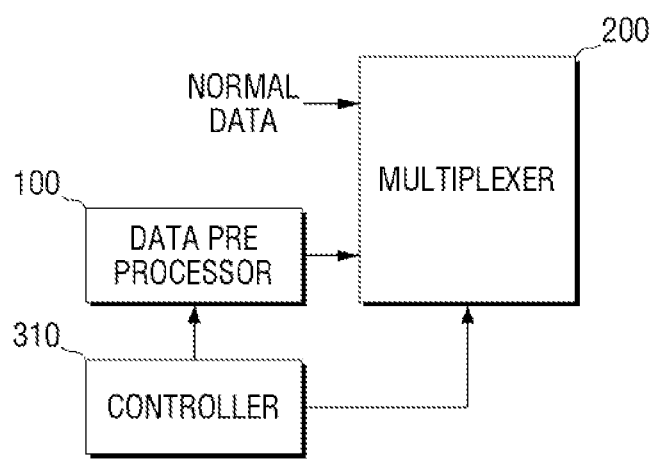

FIG. 3 illustrates an exemplary embodiment where a controller 310 has been added to a digital broadcasting transmitter. According to FIG. 3, the controller 310 provided in the digital broadcasting transmitter determines a setting state of the frame mode, and controls operations of the data preprocessor 100.

More specifically, when it is determined that a first frame mode is set, the controller 310 controls the data preprocessor 100 to arrange mobile data only in the first region and not in the packets allocated to normal data. That is, in the first frame mode, the data preprocessor 100 outputs streams which only include mobile data in the first region. Accordingly, in the packets allocated to normal data, the normal data is arranged by the multiplexer 200, forming the transmission stream.

Meanwhile, when it is determined that a second frame mode is set, the controller 310 controls the data preprocessor 100 to arrange mobile data in the packets allocated to mobile data, that is, in the first region, and also arrange mobile data in at least one portion of the packets allocated to normal data, that is, in the second region.

In this case, the controller 310 may determine a setting state of a mode provided in addition to the frame mode, that is, a mode which determines the number of packets, where mobile data is to be arranged, among the packets allocated to normal data. Accordingly, the controller 310 may control the data preprocessor 100 to arrange mobile data in packets as many as the number of the packets corresponding to the setting state of the mode from among the entire packets allocated to normal data.

Herein, the mode may be provided in various types. More specifically for example, it may be set as one of a first mode which arranges mobile data in a portion of the packets among the entire packets allocated to normal data, and a second mode which arranges mobile data in the entire packets allocated to normal data.

Herein, the first mode may be a mode which arranges mobile data only in a portion of a data region of some packets allocated to normal data. That is, the first mode may be embodied as a mode which arranges mobile data in a portion of a data region among the entire data region of some normal data packets, and arranges normal data in the remaining data region.

Differently, the first mode may be embodied as a mode which arranges mobile data in the entire region of some normal data packets.

Besides, the mode may be provided in various types in consideration of the number of packets allocated to normal data, size of mobile data, type, transmitting time, and transmitting environment.

Assuming that the number of packets allocated to normal data is 38 as in FIG. 1A, the mode may be set as one of the following, but not being limited thereto:

1) a first mode which arranges mobile data in ¼ packets of 38 packets, 2) a second mode which arranges mobile data in 2/4 packets of 38 packets, 3) a third mode which arranges mobile data in ¾ packets of 38 packets, and 4) a fourth mode which arranges mobile data in the entire 38 packets.

The data preprocessor 100 may insert known data besides mobile data in a transmission stream. Known data refers to a sequence which is known to both the digital broadcasting transmitter transmitting the transmission stream and a digital broadcasting receiver receiving the transmission stream. The digital broadcasting receiver may receive known data transmitted by the digital broadcasting transmitter, check the difference between the previously known sequence, and understand the degree of error correction, etc. The known data may be expressed differently as training data, a training sequence, a training, a standard signal, or an additional standard signal, etc., but herein will be referred to as "known data".

The data preprocessor 100 may insert at least one of mobile data and known data into various regions of the entire transmission stream, to improve receiving performance.

Figure 1B:
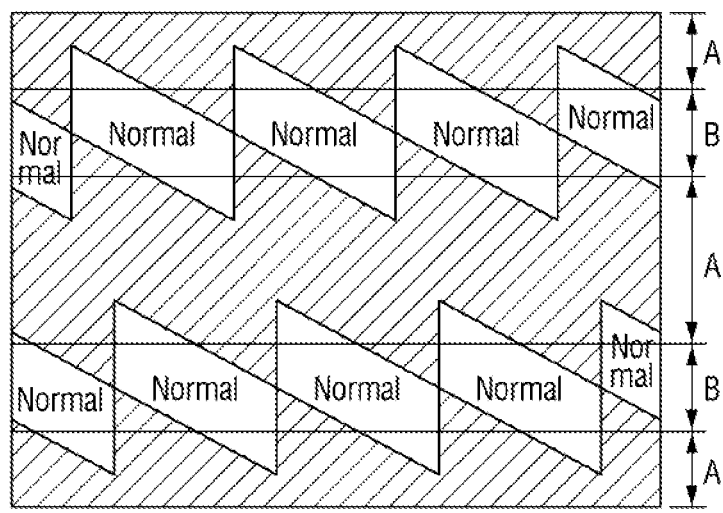

Referring to the configuration of the stream illustrated in FIG. 1B, in A region, MH, that is, mobile data is gathered, whereas in B region, MH is formed in a corn type. Here, A region is referred to as a body region, while B region is referred to as a head/tail region. There was a conventional problem that in the head/tail region, known data is not arranged, and thus, causes poor performance compared to the body region.

Accordingly, the data preprocessor 100 inserts known data in the transmission stream at an adequate location so that the known data can be arranged in the head/tail region as well. The known data may be arranged in a long training sequence format where data having sizes greater than or equal to a predetermined size can be consecutively connected, or in a dispersed format where the data is dispersed discontinuously.

Inserting mobile data and known data may be made in various ways according to exemplary embodiments, which will be explained in more detail hereinafter with reference to the accompanying drawings. However, before that, an exemplary embodiment of a detailed configuration of the digital broadcasting transmitter will be explained in more detail.

[Detailed Configuration of Digital Broadcasting Transmitter]

Figure 4:
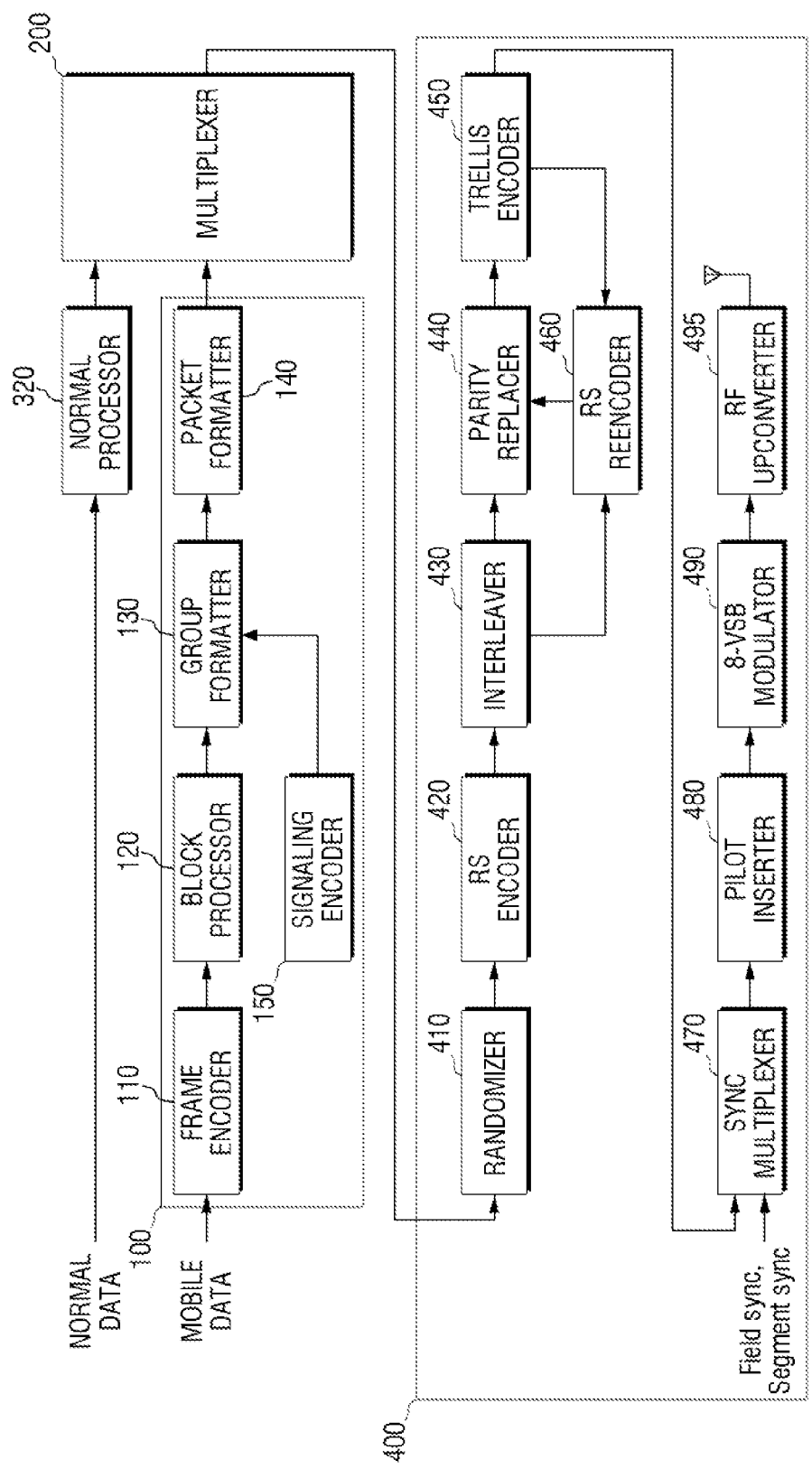

FIG. 4 is a block diagram of an example of a detailed configuration of a digital broadcasting transmitter according to an exemplary embodiment. According to FIG. 4, the digital broadcasting transmitter may include a normal processor 320 and an exciter 400, besides the data preprocessor 100 and the multiplexer 200. In FIG. 4, an illustration of a controller 310 has been omitted, but it is obvious that the controller 310 may also be included in the digital broadcasting transmitter. In addition, some of the digital broadcasting transmitter illustrated in FIG. 4 may be removed, and new elements may be added, and the arrangement order and the number of the elements may be changed in various farms as well.

According to FIG. 4, the normal processor 320 receives normal data and converts the normal data into a format suitable to a configuration of a transmission stream. That is, the digital broadcasting transmitter composes at transmission stream which includes normal data and mobile data, and transmits the stream, but the receiver which receives normal data should also be able to properly receive and process the normal data. Therefore, the normal processor 320 performs packet timing and program clock reference (PCR) adjustment of the normal data (or may be referred to as main service data) so that it has a format suitable to an MPEG/ATSC standard used in normal data decoding. Specific explanation thereof was disclosed in the ATSC-MH standard, and thus, further explanation is omitted.

The data preprocessor 100 includes a frame encoder 110, a block processor 120, a group formatter 130, a packet formatter 140 and a signaling encoder 150.

The frame encoder 110 performs Reed Solomon (RS) frame encoding. More specifically, the frame encoder 110 receives one service, and builds a predetermined number of RS frames. For instance, if one service is in units of M/H ensembles, each consisting of a plurality of M/H parades, the frame encoder 110 forms a predetermined number of RS frames for each M/H parade. More specifically, the frame encoder 110 randomizes input mobile data, performs Reed Solomon-cyclic redundancy check (RS-CRC) encoding, and divides each RS frame according to a preset frame mode to output a predetermined number of RS frames.

Figure 5:
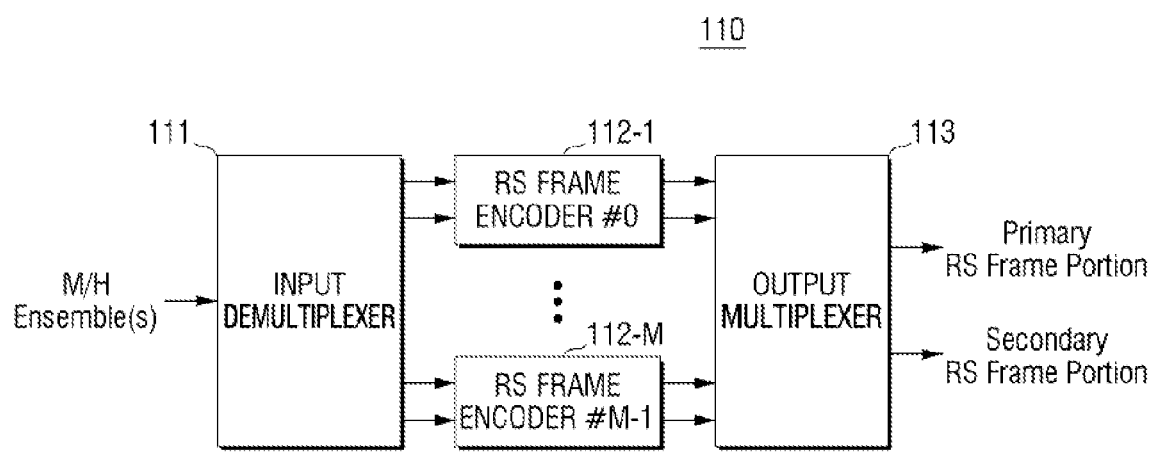
FIG. 5 is a block diagram illustrating an example of a configuration of a frame encoder.

FIG. 5 is a block diagram illustrating an example of a configuration of a frame encoder 110. According to FIG. 5, the frame encoder 110 includes an input demultiplexer 111, a plurality of RS frame encoders 112-1 through 112-M, and an output multiplexer 113.

When mobile data in predetermined service units (for example, an M/H ensemble(s)) is input, the input demultiplexer 111 demultiplexes the mobile data to generate a plurality of M/H ensembles, for example, primary ensembles and secondary ensembles according to the frame mode, and outputs these ensembles to each RS frame encoder 112-1 through 112-M. Each RS frame encoder 112-1 through 112-M performs randomization, RS-CRC encoding, and dividing regarding the input ensembles, and outputs to the output multiplexer 113. The output multiplexer 113 multiplexes frame portions output from each RS frame encoder 112-1 through 112-M, and outputs a primary RS frame portion and a secondary RS frame portion. In this case, according to the setting state of the frame mode, only the primary RS frame portion may be output.

Figure 6:
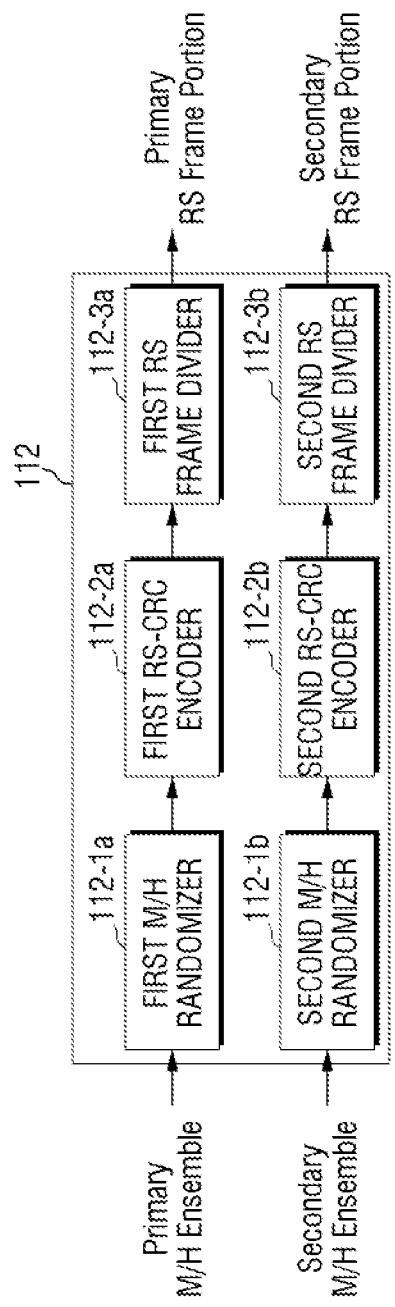
FIG. 6 is a block diagram illustrating an example of a configuration of a Reed Solomon (RS) frame encoder of among the frame encoders in FIG. 5.

FIG. 6 is a block diagram illustrating an example of an RS frame encoder configuration which may be embodied as one of each RS frame encoders 112-1 through 112-M. According to FIG. 6, the frame encoder 112 includes a plurality of M/H randomizers 112-1a, 112-1b, a plurality of RS-CRC encoders 112-2a, 112-2b, and a plurality of RS frame dividers 112-3a, 112-3b.

When a primary M/H ensemble and a secondary M/H ensemble are input from the input demultiplexer 111, the M/H randomizers 112-1a, 112-1b perform respective randomization, and the RS-CRC encoders 112-2a, 112-2b perform respective RS-CRC encoding. The RS frame dividers 112-3a, 112-3b adequately separate the ensembles so that the mobile data can be adequately block-coded at the block processor 120 arranged after the frame encoder 110, and outputs the separated ensembles to the output multiplexer 110. The output multiplexer 113 adequately combines and multiplexes each frame portion so that the block processor 120 can block-code the frame portions, and outputs to the block processor 120.

The block processor 120 codes, that is, block-codes, the mobile data in RS frames output from the frame encoder 110 in block units.

Figure 7:
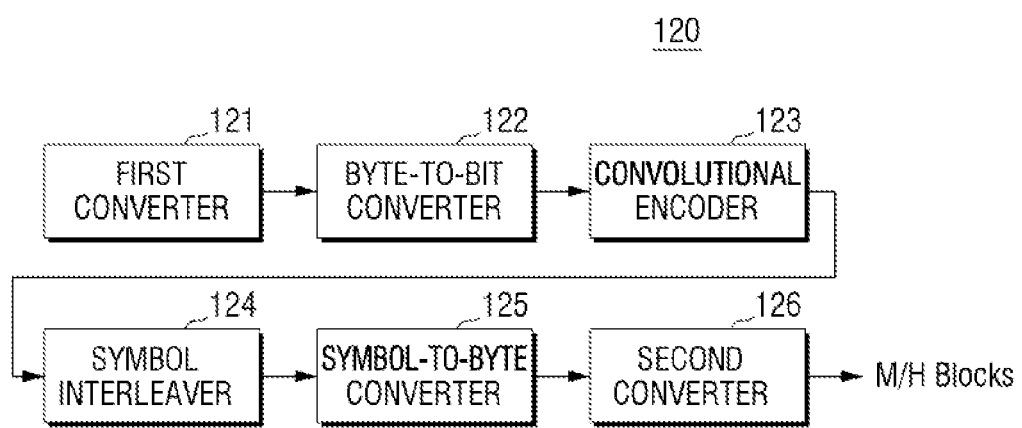
FIG. 7 is a block diagram illustrating an example of a configuration of a block processor.

FIG. 7 is a block diagram illustrating an example of a configuration of the block processor 120.

According to FIG. 7, the block processor 120 includes a first converter 121, a byte-to-bit converter 122, a convolutional encoder 123, a symbol interleaver 124, a symbol-to-byte converter 125, and a second converter 126.

The first converter 121 converts the RS frames input from the frame encoder 110 into block units. That is, it combines the mobile data in the RS frames according to a predetermined block, mode, and outputs serially concatenated convolutional code (SCCC) blocks.

For example, when the block mode is "00", one M/H block becomes one SCCC block.

Figure 8:
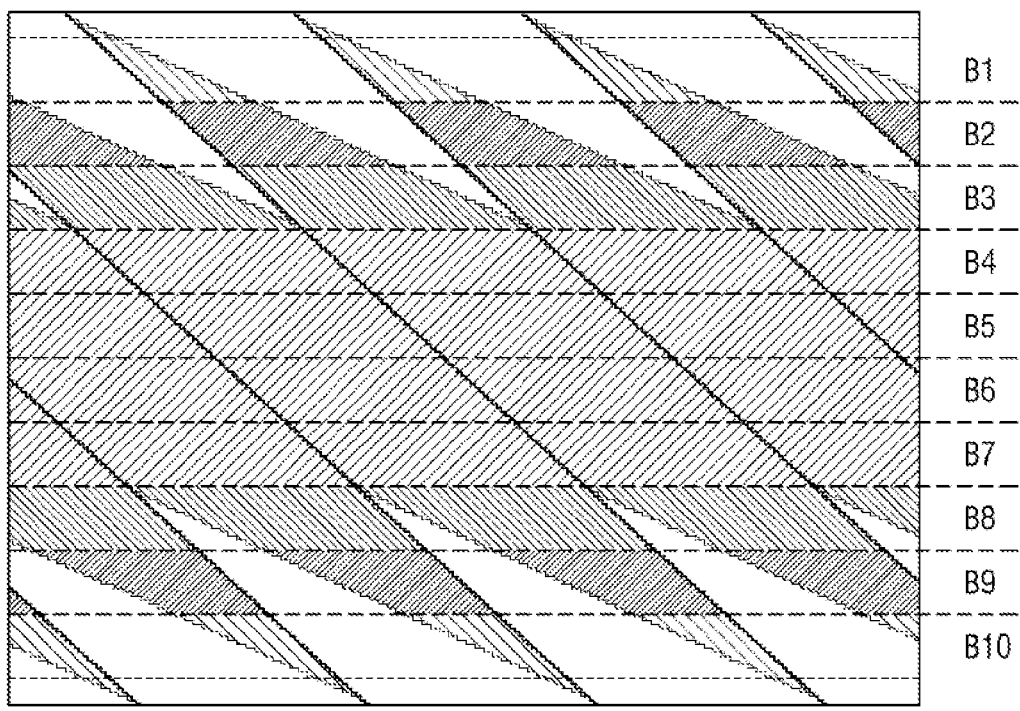
FIG. 8 is a view explaining an example of dividing a block of a stream.

FIG. 8 illustrates a state of an M/H block which divided mobile data into block units. With reference to FIG. 8, one mobile data unit, for example, an M/H group may be divided into 10 blocks B1-B10. When the block mode is "00", each block B1-B10 is output as an SCCC block. Meanwhile, when the block mode is "01", two M/H blocks are combined as one SCCC block and is output. Combination pattern may be set in various ways. For example, B1 and B6 are combined as one to form SCB1, and each of B2 and B7, B3 and B8, B4 and B9, and B5 and B10 are combined as one, respectively, to form SCB2, CSB3, SCB4, and SCB5. Besides, blocks may be combined in various methods and in various numbers according to various block modes.

The byte-to-bit converter 122 converts the SCCC blocks from a byte unit into a bit unit. This is because the convolutional encoder 123 operates in bit units. Accordingly, the convolutional encoder 123 convolutionally encodes the converted data.

Then, the symbol interleaver 124 performs symbol interleaving. The symbol interleaving may be performed in some kind of a block interleaving. Interleaved data is converted into byte units again by the symbol-to-byte converter 125, reconverted into M/H block units by the second converter 126, and is output.

The group formatter 130 receives a stream processed in the block processor 120 and formats the stream into group units. More specifically, the group formatter 130 maps the mobile data output from the block processor 120 in an adequate location within the stream, and adds known data, signaling data, and initialization data. Besides, the group formatter 130 performs a function of adding placeholder bytes for normal data, MPEG headers, and non-systematic RS parities, etc., and dummy bytes for adjusting group formatting.

Signaling data refers to various information necessary for processing a transmission stream. Signaling data may be adequately processed by the signaling encoder 150, and be provided to the group formatter 130.

In order to transmit mobile data, a transmission parameter channel (TPC) and a first information channel (FIC) may be used. The TPC is for providing various parameters such as various forward error correction (FEC) mode information and M/H frame information, and the FIC is for a fast service of a receiver, and includes cross layer information between a physical layer and an upper layer. When such TPC information and FIC information are provided to the signaling encoder 150, the signaling encoder 150 adequately processes the provided information and provides the processed information as signaling data.

Figure 9:
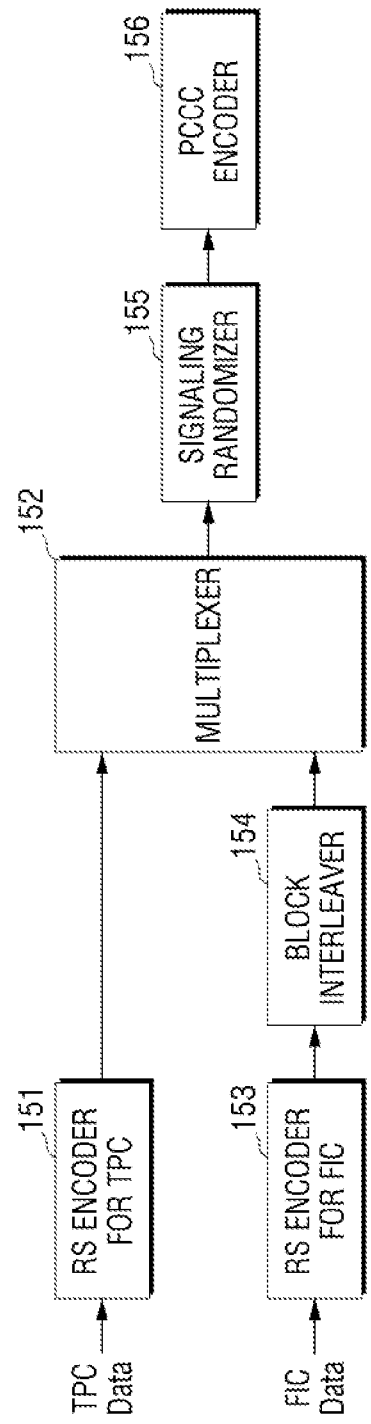
FIG. 9 is a block diagram illustrating an example of a configuration of a signaling encoder.

FIG. 9 is a block diagram illustrating an example of a configuration of the signaling encoder 150.

According to FIG. 9, the signaling encoder 150 includes an RS encoder 151 for TPC, a multiplexer 152, an RS encoder 153 for FIC, a block interleaver 154, a signaling randomizer 155, and a parallel concatenated convolutional code (PCCC) encoder 156. The RS encoder 151 for TPC RS encodes input TPC data and forms TPC code words. The RS encoder 153 for FIC and the block interleaver 154 RS encodes and block interleaves the data for FIC, and forms FIC code words. The multiplexer 152 arranges the FIC code words next to the TPC code words and forms a series of sequence. The formed sequence is randomized in the signaling randomizer 155, and is coded by the PCCC encoder 156, and is output to the group formatter 130 as signaling data.

Meanwhile, while, the known data refers to a sequence commonly known between a digital broadcasting transmitter and a digital broadcasting receiver as aforementioned. According to a control signal provided from an additionally provided element (for example, the controller 310 in FIG. 3), the group formatter 130 may insert the known data at an adequate location, and have the known data be arranged in an adequate location on the stream after being interleaved in the exciter 400. For example, it may insert the known data at an adequate location so that the known data may be arranged in B region as well in the stream structure of FIG. 1B. Meanwhile, the group formatter 130 my determine the known data inserting location in consideration of an interleaving rule.

Meanwhile, the initialization data refers to data which is used by a Trellis encode 450 provided in the exciter 400 to initialize internal memories of the Trellis encoder 450 at an adequate point, as explained later in detail.

The group formatter 130 may include a group format configuring unit (not illustrated) which inserts various regions and signals in an input stream and forms the stream in a group format, and a data deinterleaver which deinterleaves the stream formed in a group format, as aforementioned.

The data deinterleaver arranges the stream inversely of an interleaver 430 arranged in the exciter 400. The stream deinterleaved in the data interleaver may be provided to the packet formatter 140.

The packet formatter 140 removes various placeholders provided in the stream in the group formatter 130, and may add MPEG headers having a PID which is a packet identifier of the data for mobile devices. Accordingly, the packet formatter 140 outputs a stream of a predetermined number of packets for each group. For example, the packet formatter 140 may output 118 packets of mobile data.

As aforementioned, the data preprocessor 100 is embodied as various configurations, and forms mobile data in adequate formats. Especially, in a case of providing a plurality of mobile services, each element included, in the data preprocessor 100 may be embodied in plural.

The multiplexer 200 multiplexes normal data processed in the normal processor 320 and mobile data processed in the data preprocessor 100, and forms a transmission stream. The transmission stream output in multiplexer 200 may include known data as well for improvement of reception performance at a digital broadcasting receiver receiving the transmission stream.

The exciter 400 performs encoding, interleaving, trellis encoding, and demodulating on the transmission stream formed in the multiplexer 200. The exciter 400 may be referred to as a data postprocessor according to circumstances.

According to FIG. 4, the exciter 400 includes a randomizer 410, an RS encoder 420, an interleaver 430, a parity replacer 440, a trellis encoder 450, an RS re-encoder 460, a sync multiplexer 470, a pilot inserter 480, an 8-VSB modulator 490, and an RF upconverter 495.

The randomizer 410 randomizes the transmission stream output in the multiplexer 200. The randomizer 410 may basically perform the same functions as a randomizer according to an ATSC standard.

The randomizer 410 may exclusive-or (XOR) calculate an MPEG header of the mobile data and the entire normal data with a pseudo random binary sequence (PRBS) with a maximum length of 16 bits, while not performing XOR calculation regarding a payload byte of the mobile data. However, even in this case, a PRBS generator may continue shifting of a shift register. That is, the PRBS generator bypasses the payload byte of the mobile data.

The RS encoder 420 performs RS encoding on the randomized stream.

More specifically, when a portion corresponding to the normal data is input, the RS encoder 420 performs a systematic RS encoding in the same method as in an ATSC system. That is, it adds a parity of 20 bytes at an end of each of the 187-byte packets. On the other hand, when a portion corresponding to the mobile data is input, the RS encoder 420 performs a non-systematic RS encoding. In this case, the RS FEC data of 20 bytes obtained by the non-systematic RS encoding is arranged at a predetermined parity byte location within each mobile data packet. Accordingly, the digital broadcasting transmitter according to the present exemplary embodiment has compatibility with a legacy receiver of the ATSC standard. In a case where both art MPEG PID and an RS parity are all used as mobile data, the RS encoder 420 is bypassed.

The interleaver 430 interleaves the stream encoded in the RS encoder 420. The interleaving can be made in the same method as a legacy ATSC system. That is, the interleaver 430 may be embodied as a configuration where it consecutively selects a plurality of routes consisting of different numbers of shift registers using a switch, while performing data writing and reading, and thus, interleaving is performed as many as the number of shift registers on those routes.

The parity replacer 440 corrects a parity changed according to memory initialization in the trellis encoder 450. In the case of using the MPEG PID and the RS parity as data for mobile devices, the parity replacer 440 is bypassed.

That is, the trellis encoder 450 receives the interleaved stream and performs trellis encoding. The trellis encoder 450 generally uses 12 trellis encoders. Accordingly, the Trellis encoder 450 may include a demultiplexer which divides the stream into 12 independent streams and inputs the stream in each trellis encoder, and a multiplexer which combines the streams trellis encoded in each trellis encoder into one stream.

Each trellis encoder uses a plurality of internal memories to perform trellis encoding in a method of performing logical operation to a newly-input value and a value prestored in the internal memories.

Meanwhile, as aforementioned, the transmission stream may include known data A digital broadcasting receiver receiving the transmission stream may check a state of the received known data to determine the degree of error correction. As aforementioned, the known data must be transmitted in a state that the receiver knows. However, since it is impossible to know values stored in the internal memories provided in each trellis encoder, the values must be initialized to arbitrary values before the known data is input. Accordingly, the Trellis encoder 450 performs memory initialization prior to trellis encoding of the known data. The memory initialization is also referred to as trellis reset.

Figure 10:
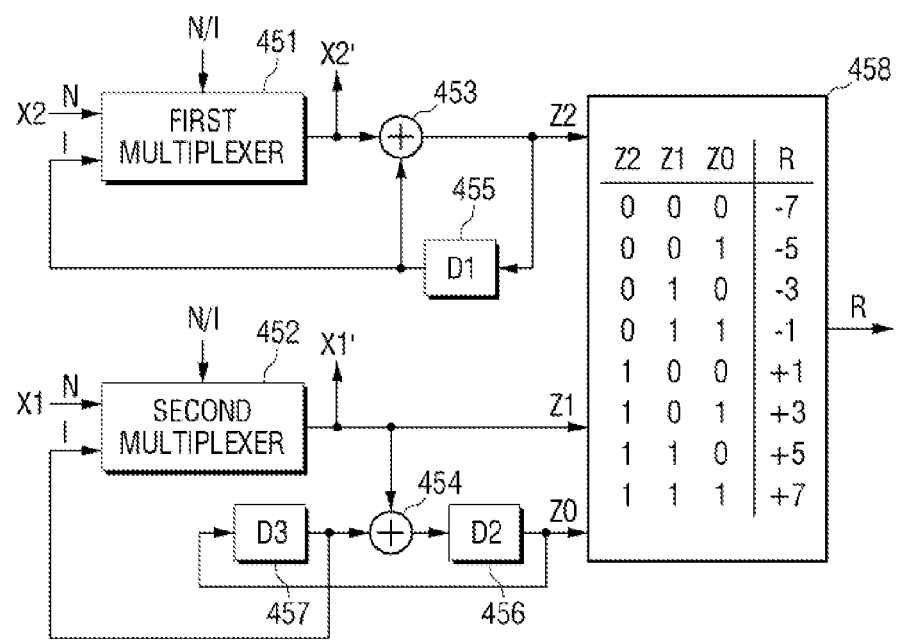
FIGS. 10 to 13 are views illustrating various examples of a configuration of a trellis encoder.

FIG. 10 is an example of one configuration of among a plurality of trellis encoders provided in the Trellis encoder 450.

According to FIG. 10, a trellis encoder includes first and second multiplexers 451, 452, first and second adders 453, 454, first to third memories 455, 456, 457, and a mapper 458.

The first multiplexer 451 receives value I stored in the first memory 455 and data N included in the stream, and outputs one value according to a control signal N/I, that is N or I. More specifically, when data in the stream corresponding to an initialization data section is input, a control signal to select I is approved, and the first multiplexer 451 outputs I. In the other sections of the stream, N is output. Likewise, the second multiplexer 452 outputs I only when data corresponding to the initialization data section is input.

Therefore, in the case of the first multiplexer 451, when input data is not the initialization data section, data interleaved at the interleaver 430 is output to the rear end as it is, and an output value of the interleaved data is input to a first adder 453 to be added to a value pre-stored in the first memory 455. The first adder 453 performs a logical operation on input values, for example, an XOR operation, and outputs value Z2. However, when the initialization section is input to the first multiplexer 451, a value stored in the first memory 455 is selected by the first multiplexer 451 and is output. Therefore, since the same two values are input to the first adder 453, its logical operation value always becomes a certain value. That is, in the case of performing an XOR operation, "0" is output. Since the output value of the first adder 453 is input to the first memory 455, the value of the first memory 455 is initialized to "0".

In the case of the second multiplexer 452, when the initialization data section is input, a value stored in the third memory 457 is selected by the second multiplexer 452 and is output. The output value is input to the second adder 454 to be added to a value stored in the third memory 457. The second adder 454 performs a logical operation on the two same input values, and outputs an output value to the second memory 456. As aforementioned, since the input values of the second adder 454 are the same, the XOR operation generates "0" which is input to the second memory 456. Accordingly, the second memory 456 is initialized. Meanwhile, a value stored in the second memory 456 is shifted and stored in the third memory 457. Therefore, when a next data in the initialization section is input, the current value of the second memory 456, that is, "0" is input to the third memory 457, and the third memory 457 is also initialized.

The mapper 458 receives the output value of the first adder 453, the output value of the second multiplexer 452, and the output value of the second memory 456, and maps these output values to a corresponding symbol value R to output the symbol value R. For example, when Z0, Z1, and Z2 are output as values of "0", "1", and "1", respectively, the mapper 458 outputs "−1" symbol.

Meanwhile, since the RS encoder 420 is located before the Trellis encoder 450, the value input to the Trellis encoder 450 is in a state where a parity is already added. Therefore, as the initialization performed in the trellis encoder and some data values are changed, the parity must also be changed.

The RS reencoder 460 changes the values of the initialization data section using X1' and X2' output in the Trellis encoder 450, and generates a new parity. The RS reencoder 460 may be referred to as a non-systematic RS encoder.

FIG. 10 illustrates an exemplary embodiment where the memory value is initialized into "0", but the memory value may be initialized into a value other than "0".

FIG. 10 is illustrates another exemplary embodiment of the Trellis encoder 450.

Figure 11:
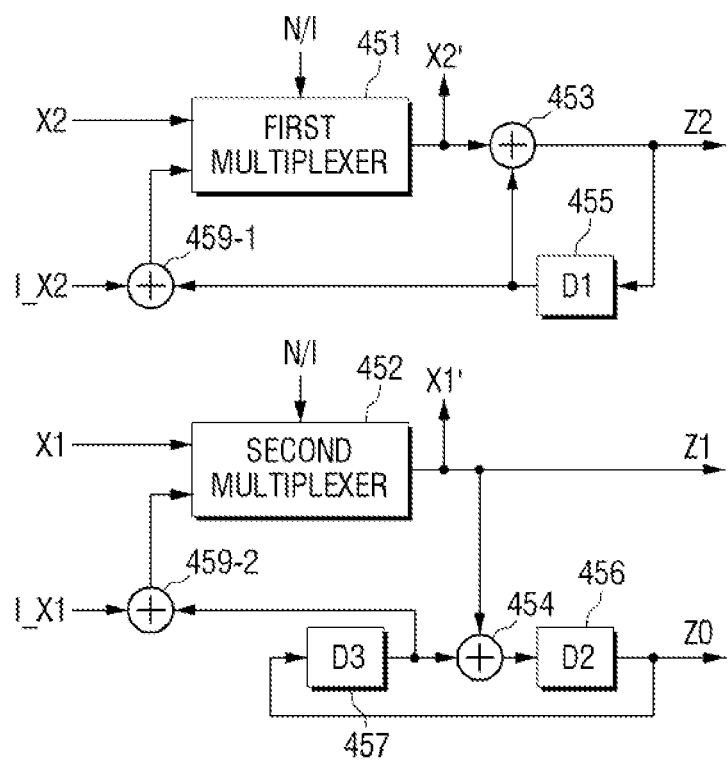

According to FIG. 11, first and second multiplexers 451, 452, first to fourth adders 453, 454, 459-1, 459-2, and first to third memories 455, 456, 457 may be included. Illustration on the mapper 458 is omitted in FIG. 11.

According to the above, the first multiplexer 451 may output one of X2, which is a stream input value, and a value output from the third adder 459-1. In the third adder 459-1, I_X2 and a value stored in the first memory 455 are input, I_X2 refers to a memory reset value input externally. For example, to initialize the first memory 455 to "1", I_X2 should be "1". If the stored value of the first memory 455 is "0", an output value of the third adder 459-1 becomes "1", and the first multiplexer 451 outputs "1". Accordingly, the first adder 453 performs an XOR operation is "1" which is the output value of the first multiplexer 451 and "0" which is the stored value of the first memory 455, and stores a result value "1" to the first memory 455. As a result, the first memory 455 is initialized to 1.

When data in the initialization data section is input, the second multiplexer 452 also selects an output value of the fourth adder 459-2 to output. The fourth adder 459-2 outputs a value of an XOR operation of I_X1, which is an externally input memory reset value, and a value stored in the third memory 457. For example, in a case where "1" and "0" are stored in the second and third memories 456, 457, respectively, to initialize the two memories to states of "1" and "1", respectively, "1" which is the value of the XOR operation of "0" stored in the third memory 457 and "1" which is the I_X1 value is output from the second multiplexer 452. An XOR operation is performed on output value "1" and value "0" stored in the third memory 457 at the second adder 454, and result value "1" is input to the second memory 456. Meanwhile, value "1" which was originally stored in the second memory 456 is shifted to the third memory 457, and the third memory 457 also becomes "1. In this state, when "1" is input as the second I_X1 as well, an XOR operation is performed on value "1", which is the second I_X1 value, and value "1" which is stored in the third memory 457, and result value "0" is output from the second multiplexer 452. When an XOR operation is performed an "0" output from the second multiplexer 452 and "1" which is stored in the third memory 457 at the second adder 454, result value "1" is input to the second memory 456, and "1" which is stored in the second memory 456 is shifted to the third memory 457, and is stored. As a result, the second, and, third memories 456, 457 may all be initialized to "1".

Figure 12:
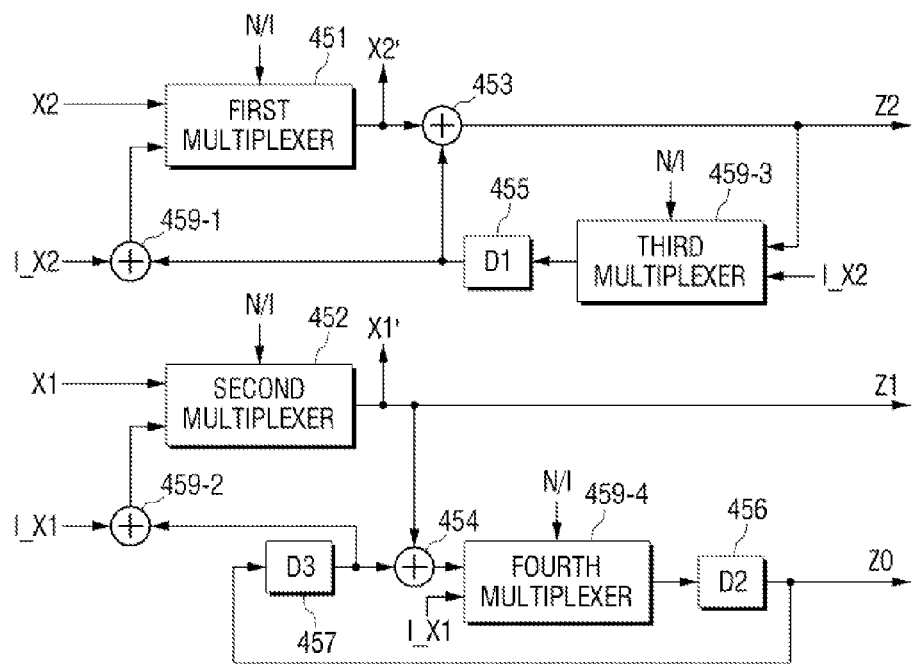
Figure 13:
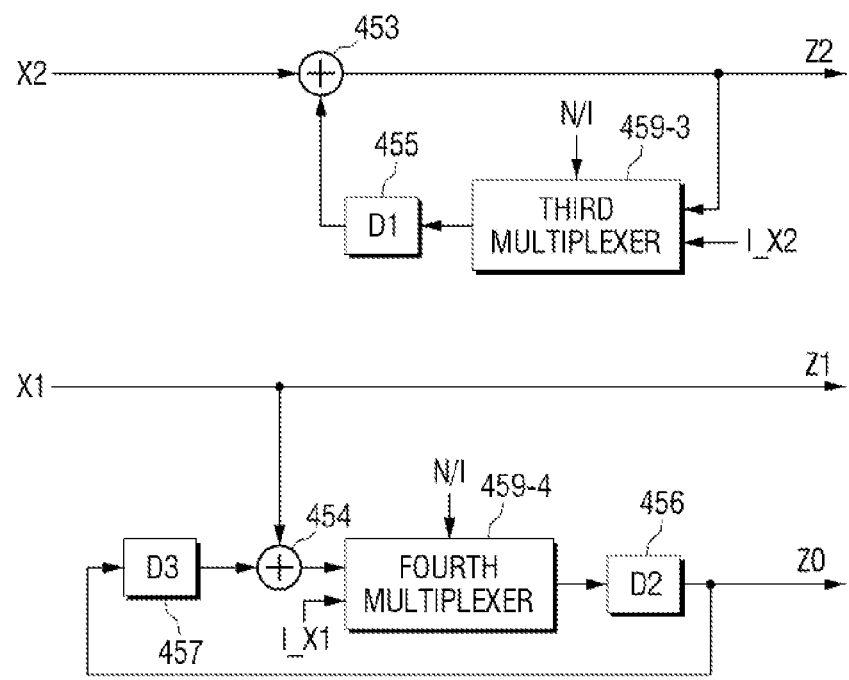

FIG. 12 and FIG. 13 illustrate various exemplary embodiments of the Trellis encoder 450.

According to FIG. 12, a trellis encoder in the Trellis encoder 450 may be embodied to further include third and fourth multiplexers 459-3, 459-4, in addition to the structure of FIG. 11. The third and fourth multiplexers 459-3, 4594 may output an output value of first and second adders 453, 454 or I_X2 and I_X1, respectively, according to each control signal N/I. Accordingly, values of first to third memory 455, 456, 457 may be initialized to desired values.

FIG. 13 illustrates a case where a trellis encoder is embodied as a more simple structure. According to FIG. 13, the trellis encoder may include first and second adders 453, 454, first to third memories 455, 456, 457, and third and fourth multiplexers 459-3, 459-4. Accordingly, the first to third memories 455, 456, 457 may be initialized according to values of I_X1 and I_X2 input to the third and fourth multiplexers 459-3, 459-4, respectively. That is, according to FIG. 13, I_X2 and I_X1 are input to the first memory 455 and second memory 456, and become a first memory 455 value and a second memory 456 value, respectively.

Further detailed explanations on the operations of the trellis encoder of FIGS. 12 and 13 is omitted.

Referring to FIG. 4 again, a field sync and a segment sync, etc. may be added to a stream trellis encoded by the Trellis encoder 450, in the sync multiplexer 470.

Meanwhile, as aforementioned, in a case where the data preprocessor 100 arranges mobile data in packets allocated to normal data, a digital broadcasting receiver should know information that mobile data exists in the normal data packets. Such information may be informed in various methods, but one of these methods ma be using a field sync. This will be explained hereinafter.

The pilot inserter 480 inserts a pilot into a transmission stream processed in the sync multiplexer 470, and the 8-VSB modulator modulates the transmission stream. In the RF upconverter 495, the modulated stream is converted into an upper RF broadband signal for transmission and the converted signal is transmitted through an antenna.

As aforementioned, the transmission stream may be transmitted to the receiver in a state where the normal data, the mobile data, and the known data are included in the transmission stream.

Figure 14:
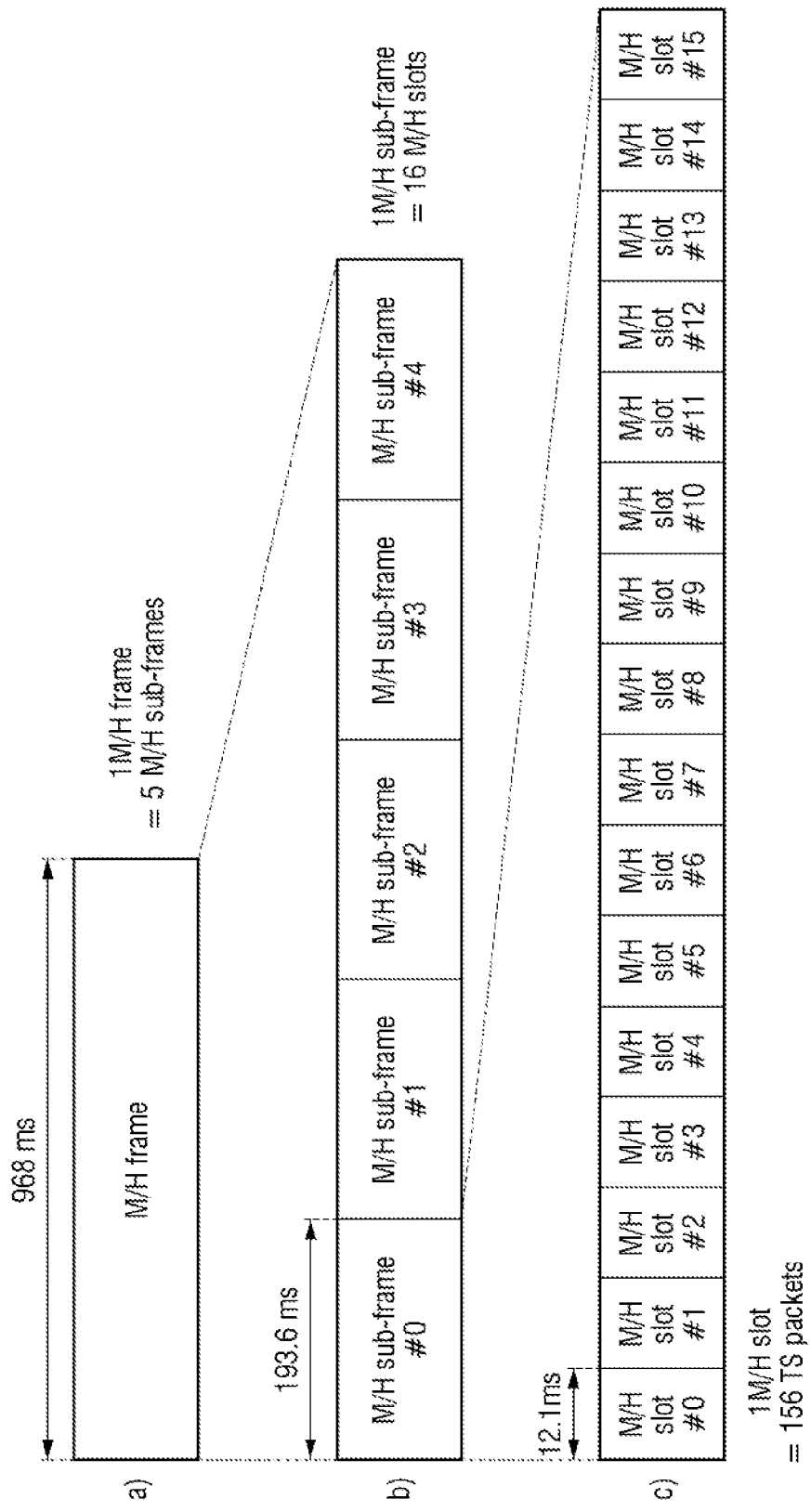
FIG. 14 is a view explaining an example of a structure of a mobile data frame.

FIG. 14 illustrates a data frame of mobile data in a transmission stream, that is, a unit structure of an NASH frame. According to FIG. 14, one M/H frame may have a size of a total of 968 ins in time unit, and may be divided into 5 sub frames. One sub-frame may have 193.6 ins in time unit. In addition, each sub-frame may be divided into 16 slots. Each slot has 12.1 ms in time unit, and may include a total of 156 transmission stream packets. As aforementioned, 38 packets thereof are allocated to normal data, and a total of 118 packets are allocated to mobile data. That is, one M/H group consists of 118 packets.

In this state, the data preprocessor 100 arranges the mobile data and the known data in the packets allocated to the normal data, thereby increasing transmission efficiency of the mobile data, while improving the reception performance as well.

[Various Exemplary Embodiments of Transmission Stream Configuration]

FIGS. 15 to 21 illustrate transmission stream configurations or structures according to various exemplary embodiments. Hereinafter, mobile data and known data (or training) arranged in the second region before interleaving are also be referred to as "new MH data" or "new mobile data" and "new training" or "new known data", respectively. However, mobile data arranged in the first region before interleaving is also referred to new MH data or new mobile data if these mobile data are different from mobile data already arranged in the first region which is also referred to as "existing mobile data". Likewise, known data provided for these new MH data or new mobile data may be referred to as new known data or new training. However, as new known data may take the same form as existing known data for existing mobile data, new known data is also simply referred to as known data, as necessary. Also, a region originally allocated to mobile data may be referred to as an existing mobile dam region, e.g., the first region, while a region in which new MH data (or new mobile data) or new known data (or new training) is arranged is referred to as a new mobile data region.

Figure 15:
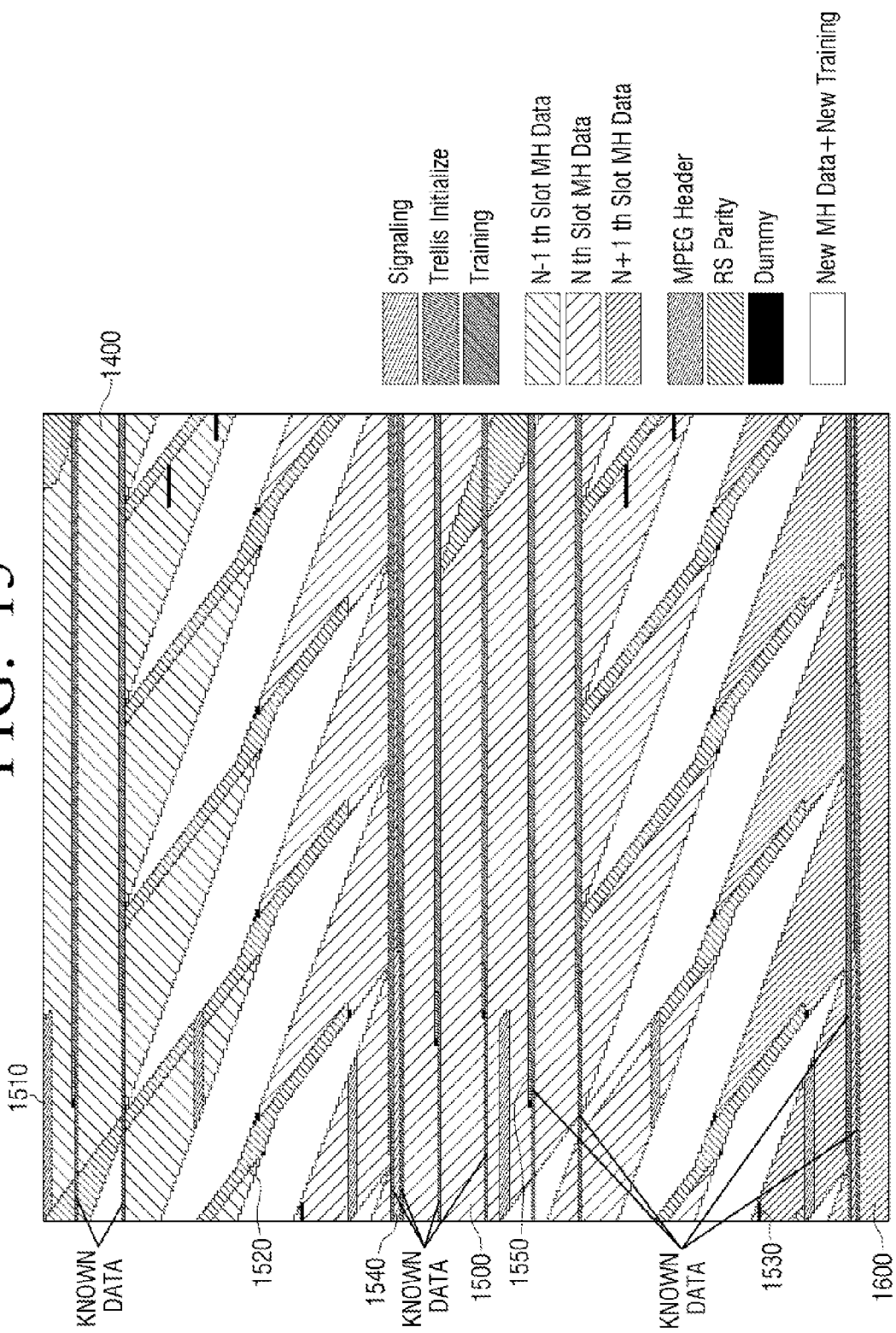
FIGS. 15 to 21 are views illustrating an example of a configuration of a stream according to various exemplary embodiments.

FIG. 15 illustrates a steam configuration in which interleaving is performed in a state where mobile data is arranged in packets allocated to normal data, that is, the second region. In the stream of FIG. 15, known data may also be arranged together with mobile data in the second region.

Accordingly, a portion which is not used for mobile data use in the existing ATSC-MH standard, that is, 38 packets can also be used for mobile use. In addition, since the second region is used independently from the existing mobile data region (that is, the first region), it becomes able to provide additional one or more services. It is possible to further increase transmission efficiency if new mobile data is used as the same service as existing mobile data.

Meanwhile, the transmission stream configuration in FIG. 15, in which new mobile data and new known data are arranged, may be notified to a digital broadcasting receiver of the transmission stream configuration in FIG. 15 using signaling data or a field sync.

Arranging mobile data and known data (e.g., new MH data and new training) in the 38 packets allocated to normal data may be performed by the data preprocessor 100 specifically at the group formatter 130.

Meanwhile, in FIG. 15, known data in a six long training sequence format is arranged in the body region, that is, A region, where existing mobile data is gathered. In addition, signaling data is arranged between first and second long training sequences for error robustness of the signaling data. On the other hand, in a packet portion allocated to normal data, new known data may be arranged in a dispersed format and not only in a long training sequence format.

In addition, a hatching region that reference number 1510 indicates represents an MPEG header region, a hatching region that 1520 indicates represents an RS parity region, a hatching region that 1530 indicates represents a dummy region, a hatching region that 1540 indicates represents a signaling data region, and hatching region that 1550 indicates represents an initialization data region. According to FIG. 15, initialization data is arranged right before known data is shown. Meanwhile, reference number 1400 represents (N−1)-th slot m/H data, reference number 1500 represents N-th slot M/H data, and reference 1600 represents (N+1)-th slot M/H data.

Figure 16:
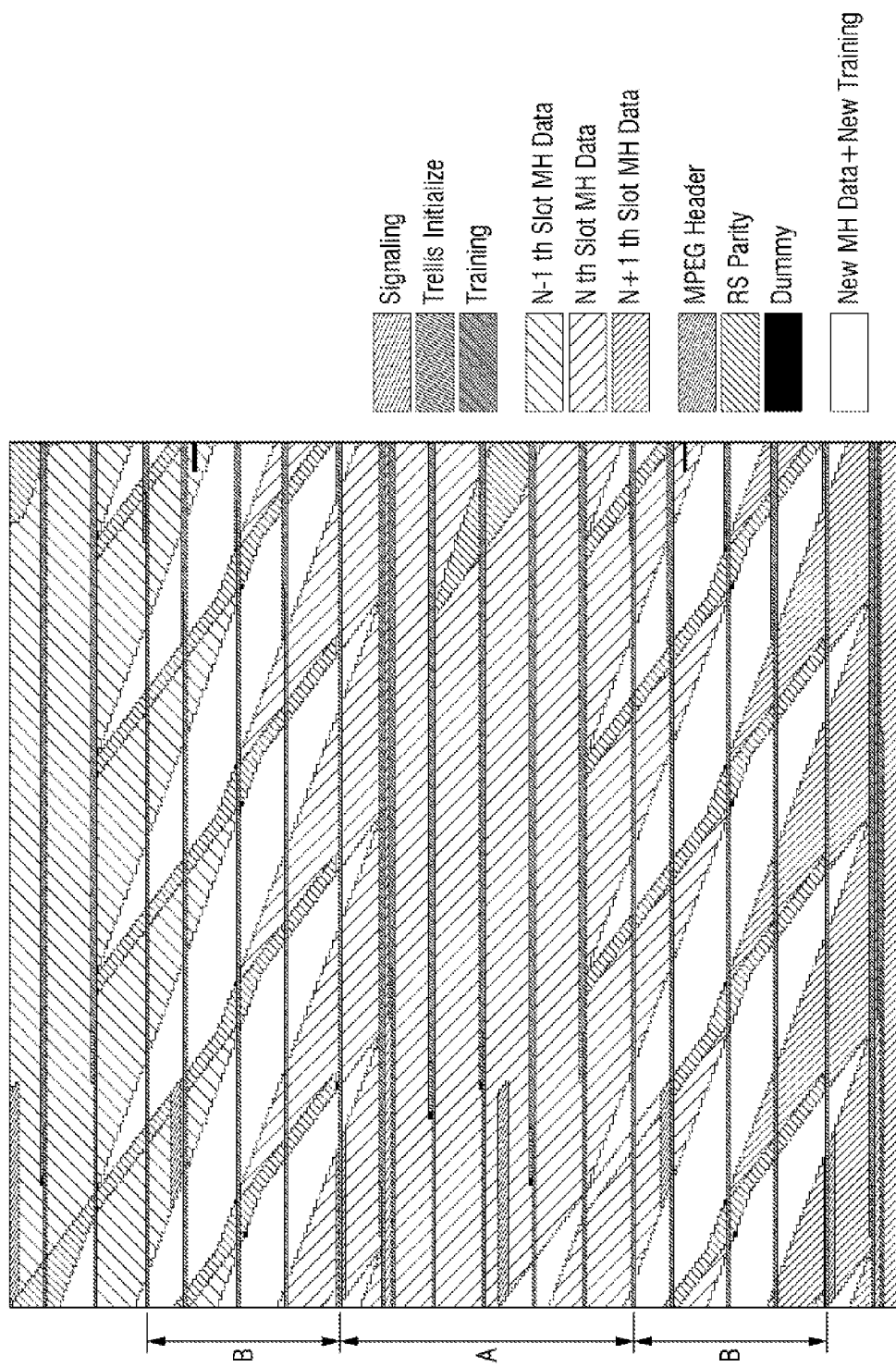

FIG. 16 illustrates a structure of a transmission stream for transmitting mobile data and known data using a portion of the first region allocated to mobile data, together with packets allocated to normal data, that is, the second region.

According to FIG. 16, in A region, that is, the body region, where existing mobile data is gathered, known data in a six long training sequence format is a arranged. Also in B region, that is, the head/tail region, known data is arranged in a long training sequence format. In order for known data to be arranged in a long training sequence format B region, not only a portion of the 38 packet region but also a portion of the 118 packet region allocated mobile data includes known data. In the remaining portion of the 38 packet region where known data is not included, new mobile data is arranged. Accordingly, it becomes able to also improve the error correcting performance on B region as well.

Meanwhile, as new known data is added also in a portion of the region for existing mobile data, it is possible to add information on a location for the new known data to signaling data, or perform configuring a header of a packet for existing mobile data use where new known data is inserted in a format that cannot be perceived by a legacy mobile data receiver for existing mobile services, for instance in a null packet format. Accordingly, the legacy mobile data receiver does not perceive at all, and thus, a malfunction due to an error will not occur.

Figure 17:
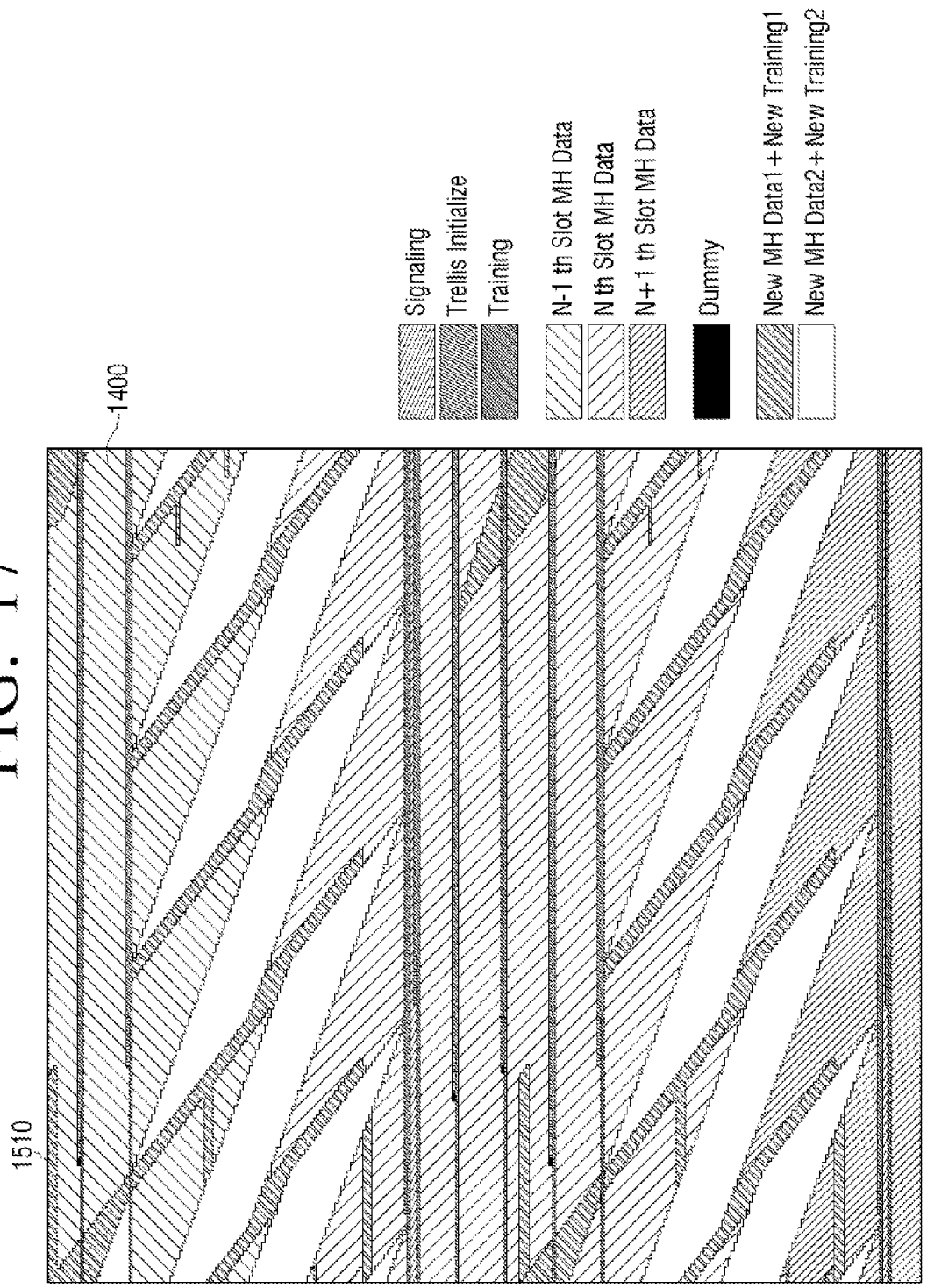

FIG. 17 illustrates a stream configuration in which at least one of mobile data and known data is arranged in locations such as an MPEG header region, an RS parity region, at least a portion of a dummy region, and an existing, mobile data region, etc. In this case, a plurality of new mobile data may be arranged according to location.

That is, compared to FIG. 15, in can be seen from FIG. 17 that new mobile data and new known data are formed in an MPEG header region, an RS parity region, and/or a portion of a dummy region. New mobile data arranged in these regions, and new mobile data arranged in the normal data packet may be the same data or different data.

Meanwhile, other than these regions, new mobile data may be arranged in all existing mobile data regions, according to an exemplary embodiment.

When a stream is configured as in FIG. 17, transmission efficiency of mobile data and known data may further be increased compared to FIGS. 15 and 16. Especially, it becomes able to provide a plurality of mobile data services.

In a case of configuring a stream as in FIG. 17, it is possible to include new signaling data in a new mobile data region and notify a digital broadcasting receiver whether or not new mobile data is included in this region, using signaling data or a field sync.

Figure 18:
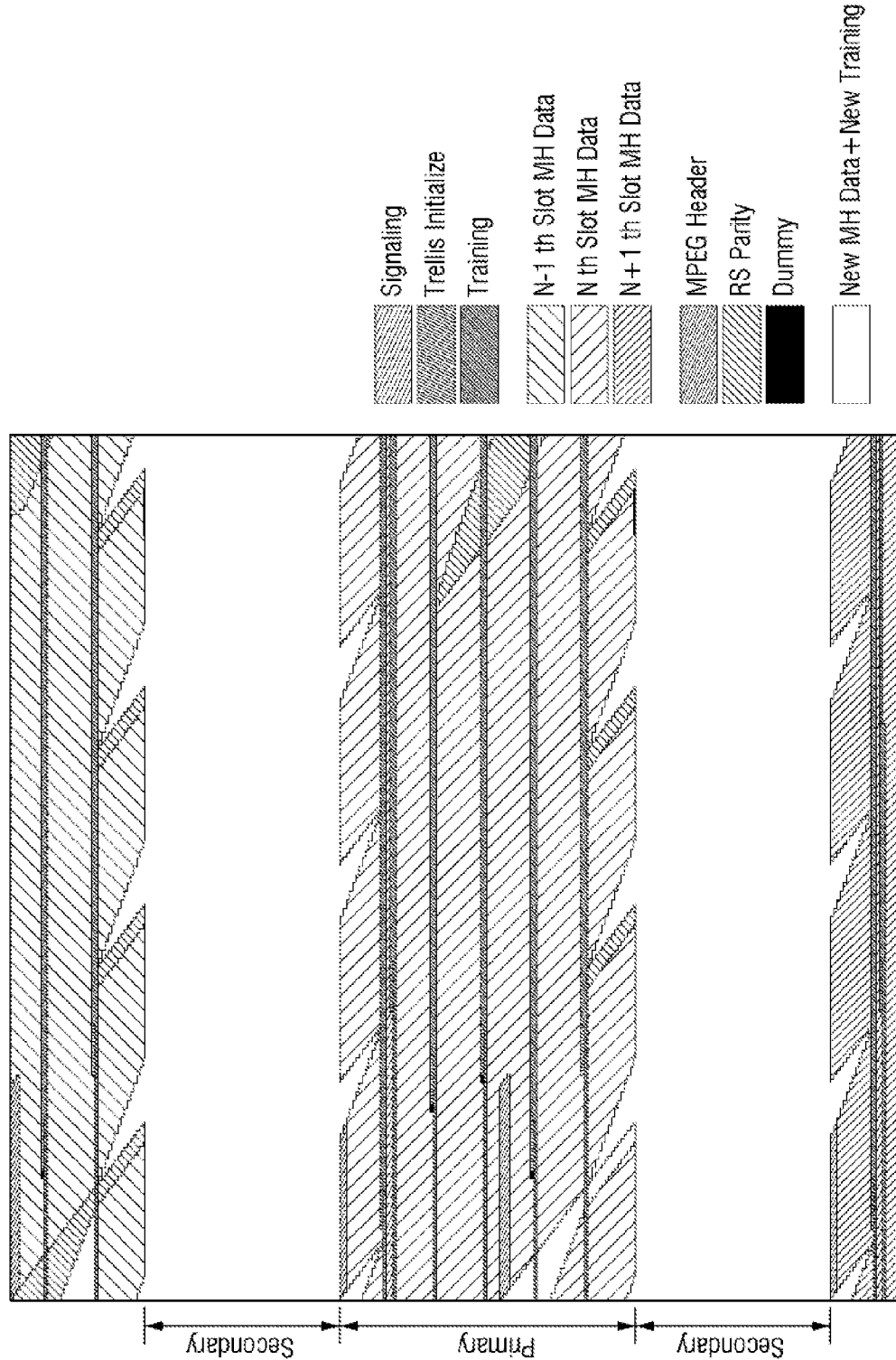

FIG. 18 illustrates a stream configuration where new mobile data and new known data are arranged not only in the second region but also in B region, that is, in the first region corresponding to the secondary service region.

As in FIG. 18, the entire stream is divided into a primary service region and a secondary service region, and the primary service region may correspond to the body region, and the secondary service region may correspond to the head/tail region. As aforementioned, in the head/tail region, generally, known data is not included, but data of different slots exists, and thus, performance deteriorates compared to the body region. Thus, new known data and/or new mobile data may be arranged in the head/tail region to enhance reception performance, according to an exemplary embodiment. In the head/tail region, new known data may be arranged in a long training sequence format just as in the body region, but this is not limited thereto, and thus, new known data may be arranged in a dispersed format, or in both a long training sequence for and a dispersed type sequence format.

Meanwhile, as an existing mobile data region is used as a new mobile data region, it is possible to configure a header of a packet in the new mobile data region where new mobile data and/or new known data are included into a header of a format that cannot be perceived by a legacy receiver, and maintain a compatibility with the legacy receiver according to the existing ATSC-MH standard.

Differently, an existing signaling data or a new signaling data may notify the legacy receiver that new mobile data and/or new known data are arranged in the existing mobile data region.

Figure 19:
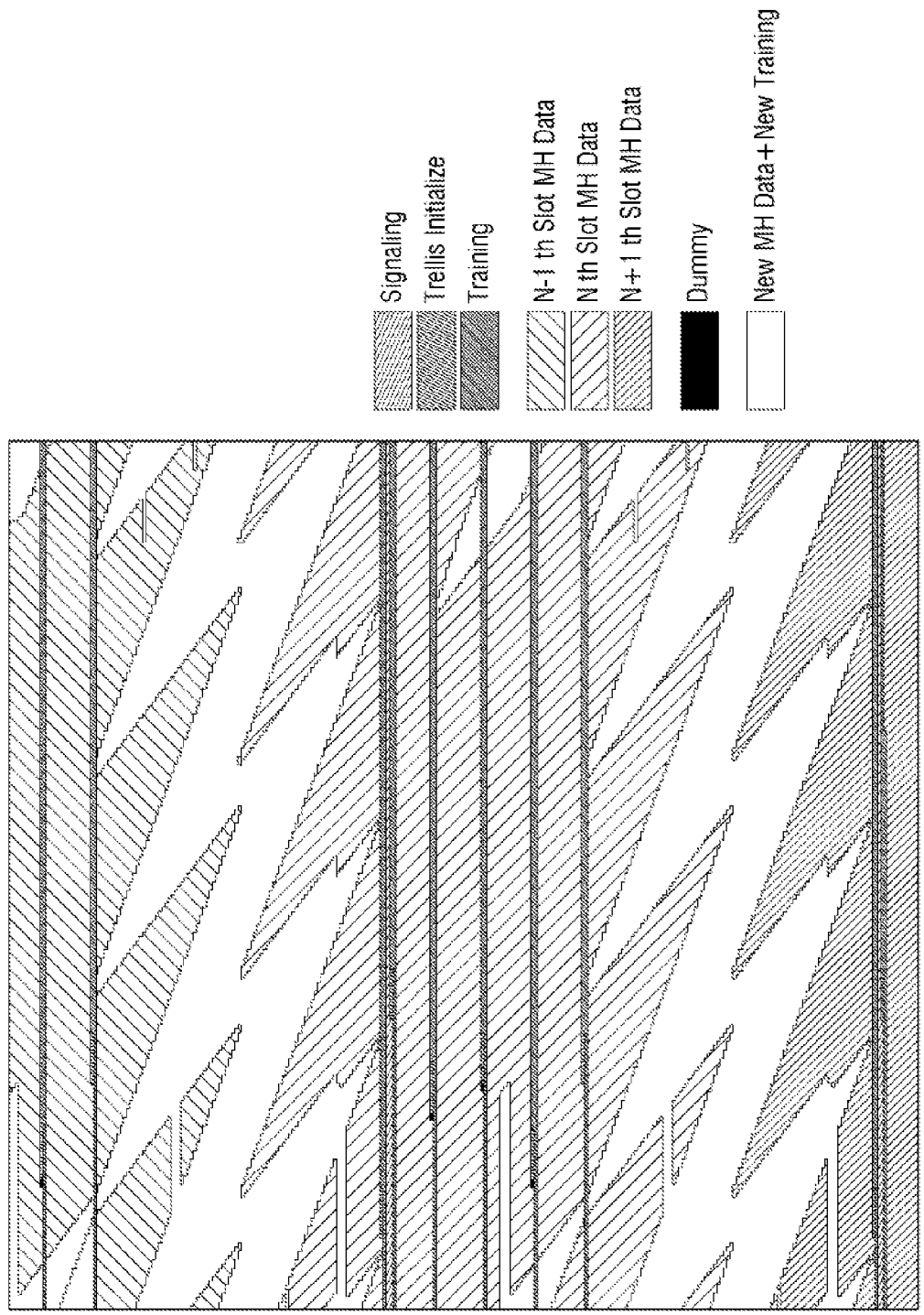

FIG. 19 illustrates an example of a transmission stream for transmitting new mobile data and new known data using a normal data region, an MPEG header, an RS parity region, at least a portion of a region for a dummy of existing mobile data, and an existing mobile data region, etc. FIG. 17 illustrates a case of transmitting new mobile data arranged in the above regions which is different from new mobile data arranged in a normal data region. In FIG. 19, however, the same new mobile data is arranged in both a normal data region and the above regions.

Figure 20:
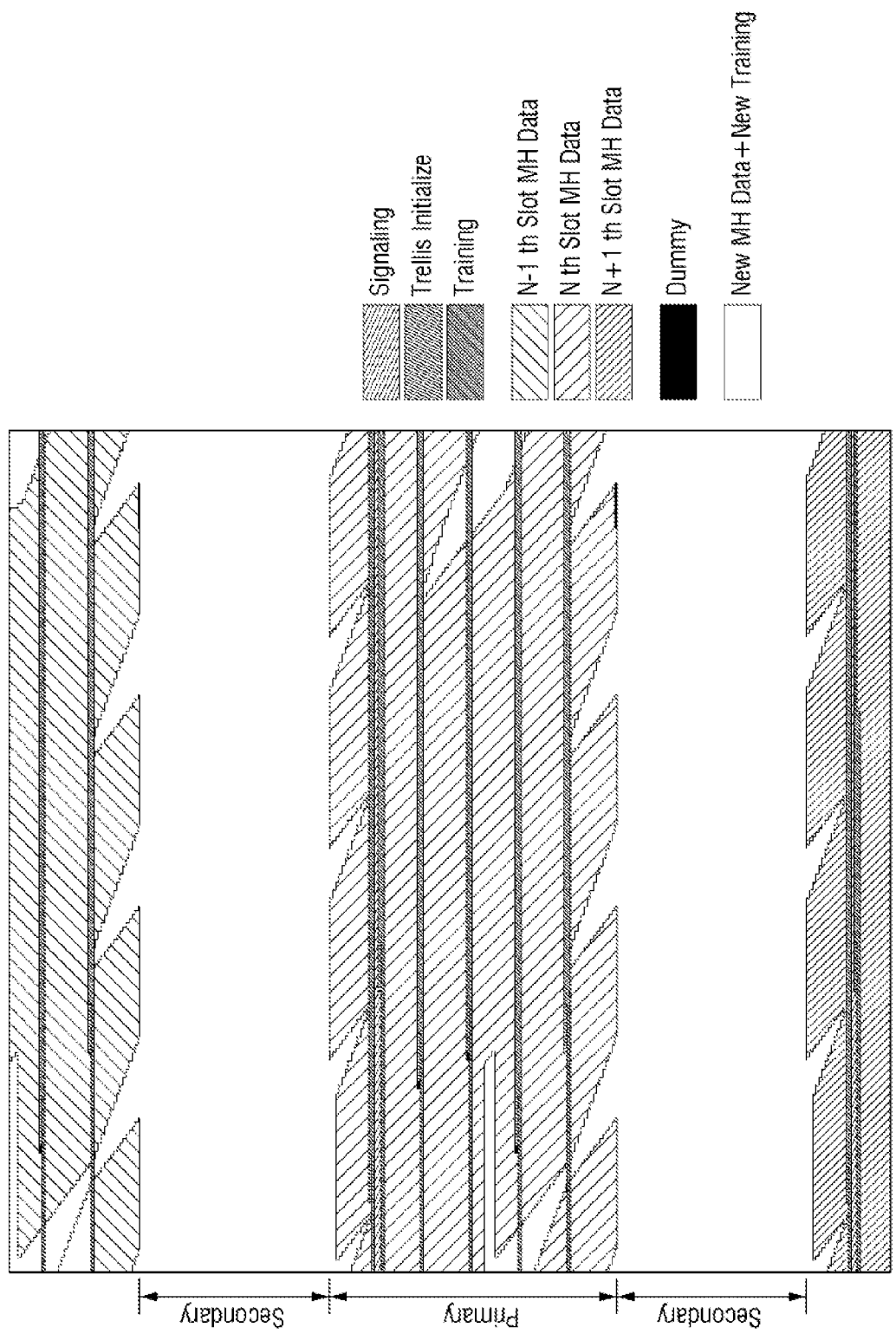

FIG. 20 illustrates an example of a transmission stream configuration in a case of transmitting new mobile data and new known data using the entire B region, a normal data region, an MPEG header region, an RS parity region, and at least a portion of a region for a dummy of the existing mobile data.

In this case as well, it is desirable to make a region where new mobile data and new known data are arranged not be perceived by a legacy receiver for compatibility with the legacy receiver.

Figure 21:
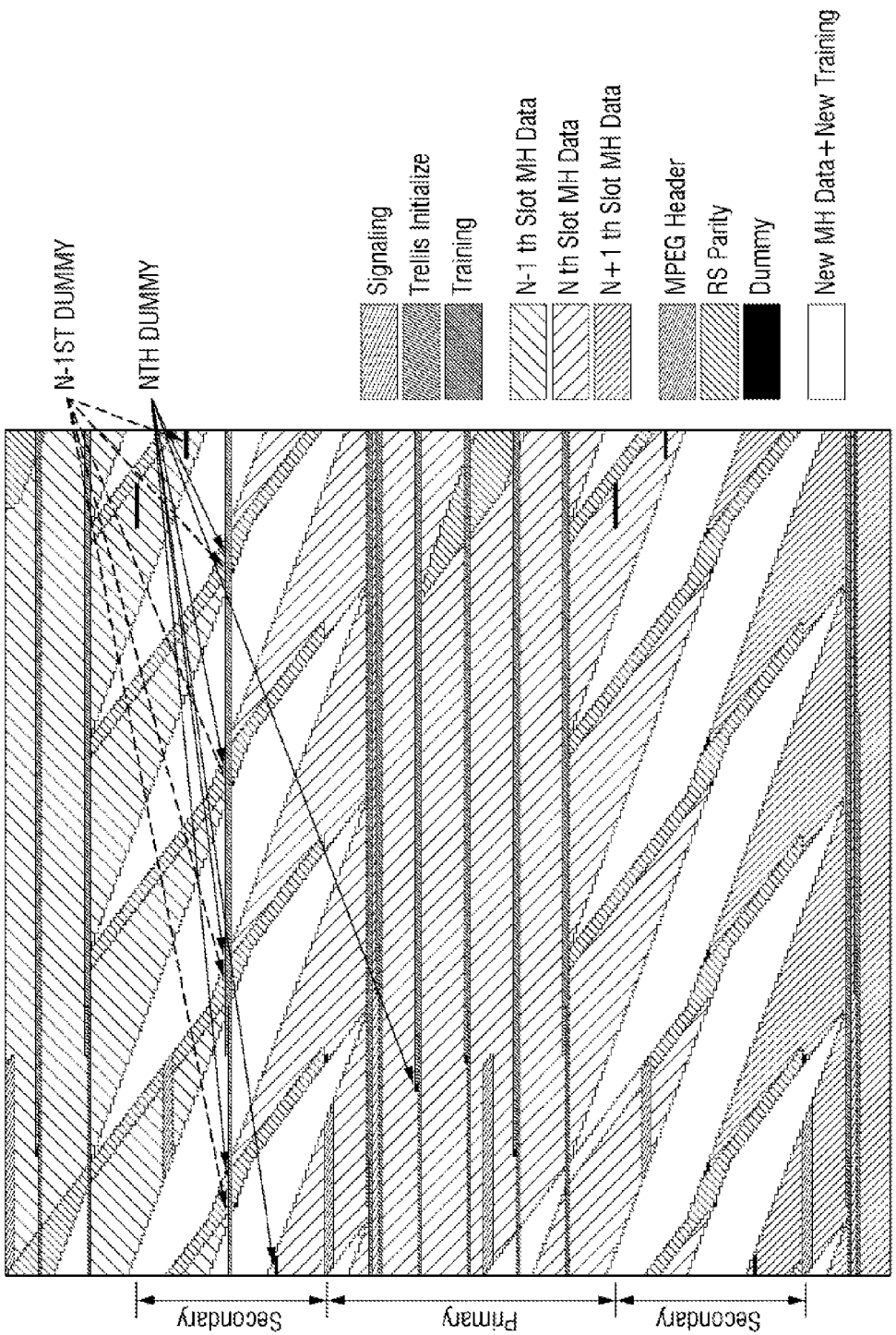

FIG. 21 is a stream configuration of a transmission stream in a case of substituting a dummy of a region for existing mobile data for a parity or a new mobile data region, and arranging new mobile data and new known data using the substituted dummy and a normal data region. According to FIG. 21, a dummy of an N−1 slot and a dummy of N slot are illustrated.

As aforementioned, FIGS. 15 to 21 illustrate the stream configurations after interleaving. The data preprocessor 100 arranges mobile data and known data at adequate locations have stream configurations such as in FIGS. 15 to 21 after interleaving.

More specifically, the data preprocessor 100 arranges mobile data in a normal data region, that is, in the 38 packets on the stream configuration in FIG. 1A, according to a predetermined pattern. In this case, mobile data may be arranged in the entire payload of the packets, or in some regions within the packets. In addition, mobile data may be arranged not only in the normal data region but also in a region which is arranged as a head/tail region in an existing mobile data region after interleaving.

Meanwhile, known data may be arranged within a mobile data packet or a normal data packet. In this case, known data may be arranged in a vertical direction or at certain intervals in the FIG. 1A configuration so that the known data can be in a long training sequence format or a similar format after interleaving.

In addition, the known data may be arranged in a dispersed format other than the long training sequence format as aforementioned. Hereinafter is an explanation on various examples of arranging known data.

[Arrangement of Known Data]

As aforementioned, the known data is arranged at an adequate location by the group formatter 130 within the data preprocessor 100, and then, is interleaved together with the stream by the interleaver 430 within the exciter 400. FIGS. 22 to 28 illustrate known data arrangement methods according to various exemplary embodiments.

Figure 22:
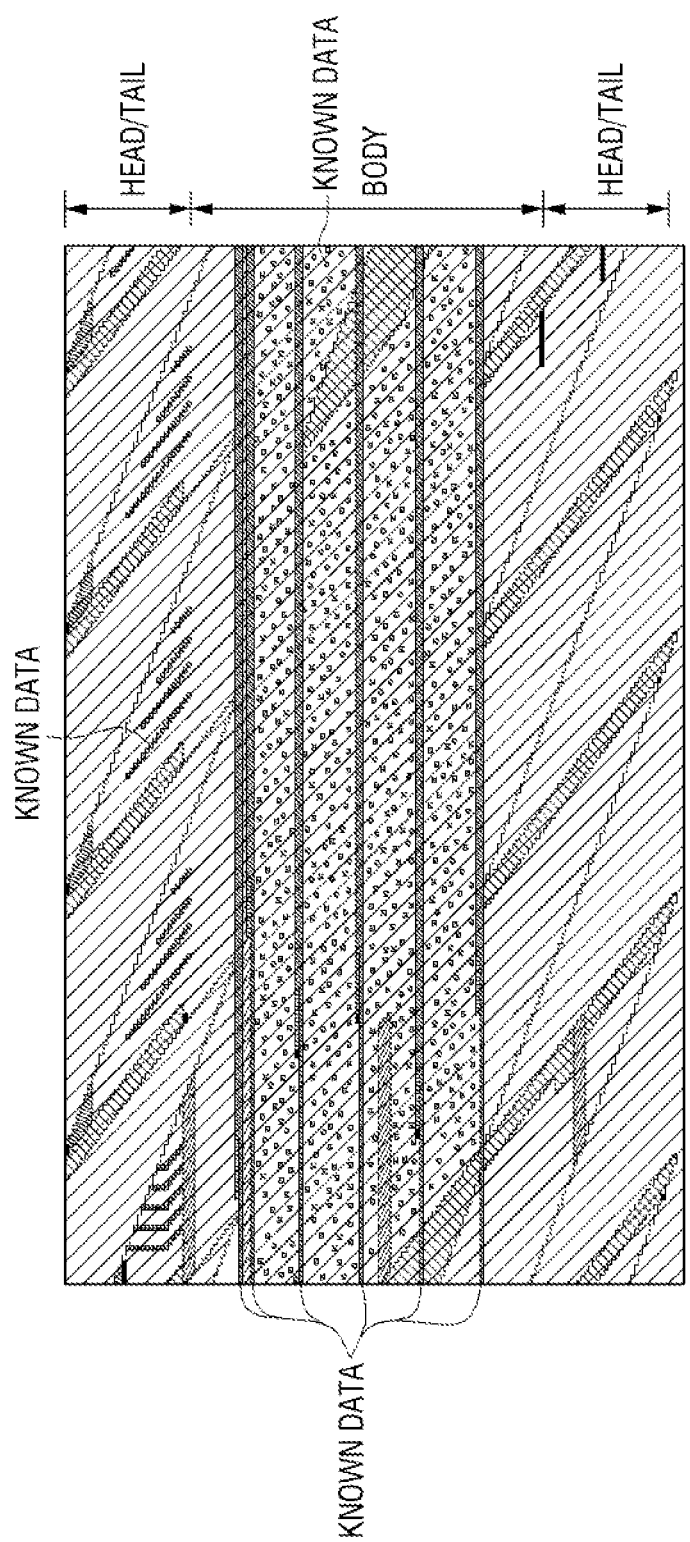
FIGS. 22 to 28 are views illustrating a configuration of a known data inserting pattern according to various exemplary embodiments.

FIG. 22 illustrates a state where dispersed type known data is arranged together with an existing long training sequence in the body region, and known data is additionally arranged in a cone portion within the head/tail region. Accordingly, it becomes able to improve performance of synchronization of a receiver and channel assuming performance, as new known data is added while maintaining existing known data.

Arranging known data as in FIG. 22 is performed by the group formatter 130 as aforementioned. The group formatter 130 may determine location for inserting known data considering an interleaving rule of the interleaver 430. The interleaving rule may differ according to various exemplary embodiments, but if the interleaving rule is known, the group formatter 130 may appropriately decide the location of the known data. As an example, if known data is inserted in a certain size in a portion of a payload in every 4 packets or in a separately provided field, known data dispersed in a certain pattern may be obtained by interleaving.

Figure 23:
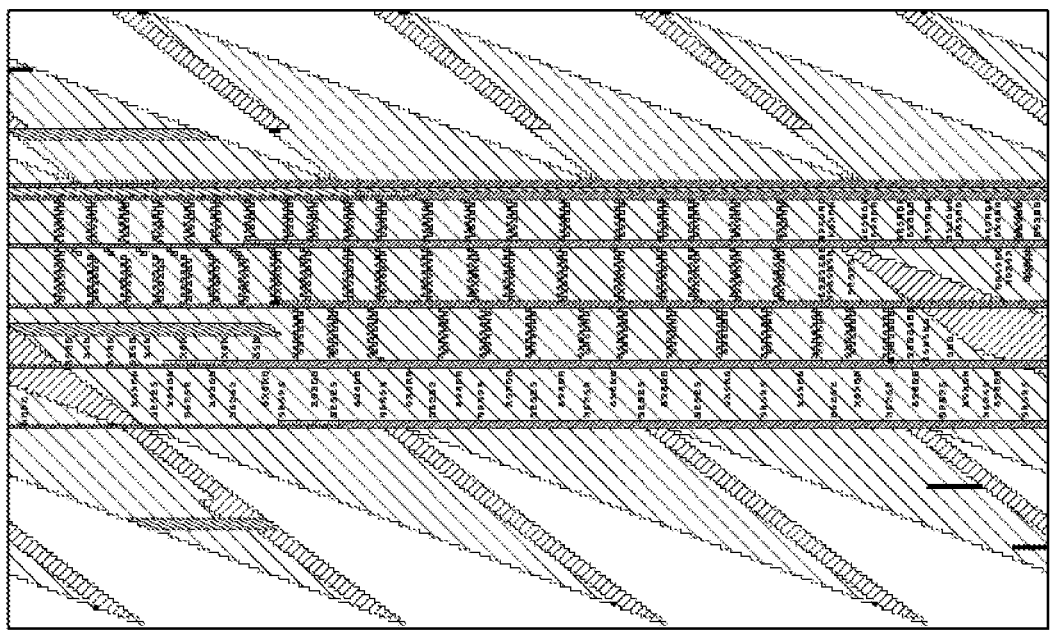

FIG. 23 is a stream configuration illustrating an example of a different known data inserting method.

According to FIG. 23, dispersed type known data is not arranged in the cone region, but the dispersed type data is arranged together with a long training sequence only in the body region.

Figure 24:
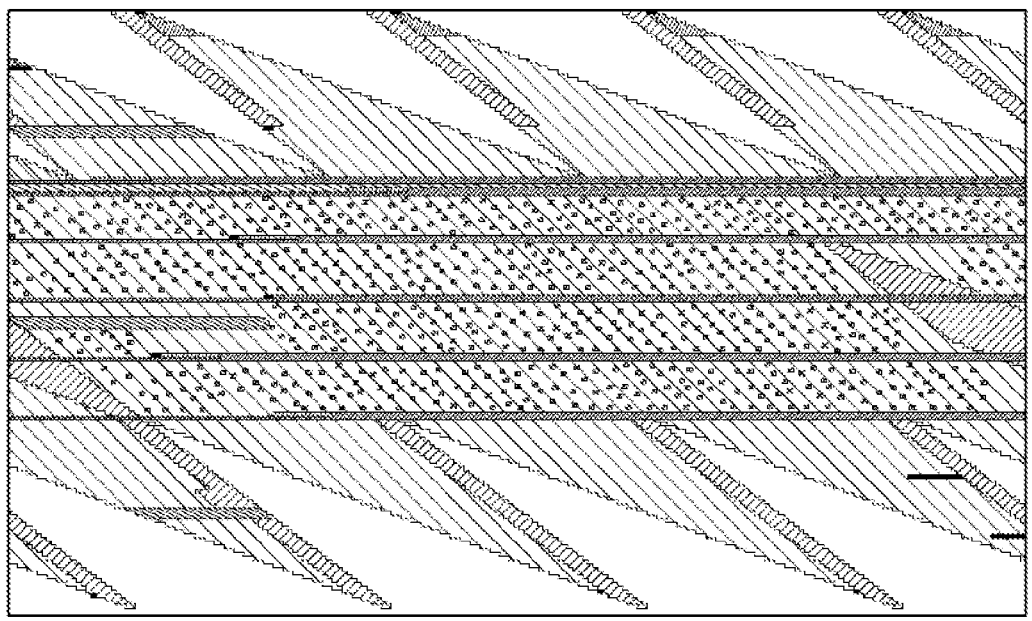

Next, FIG. 24 is a stream configuration illustrating a state where a length of a long training sequence is reduced, while dispersed type known data is arranged as many as the number reduced. Accordingly, it is possible to improve a Doppler tracking performance while maintaining data efficiency.

Figure 25:
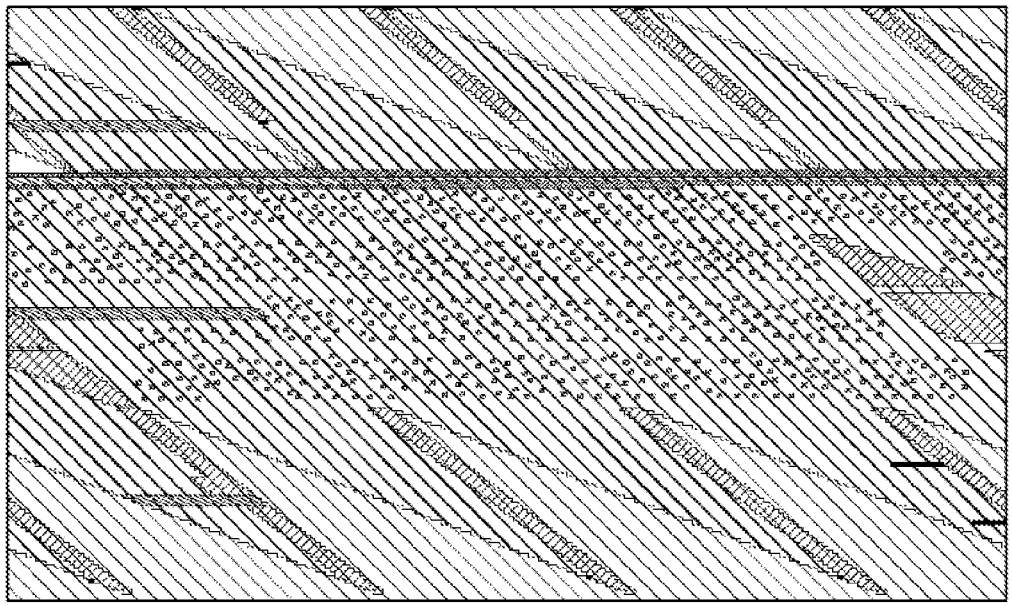

FIG. 25 is a stream configuration of another known data inserting method.

According to FIG. 25, among a total of six long training sequences within the body region, only the first sequence is kept, and the remaining sequences are substituted to dispersed type known data. Accordingly, it may be possible to improve a Doppler tracking performance while maintaining initial synchronization and channel estimating performance by the first long training sequence where the body region starts.

Figure 26:
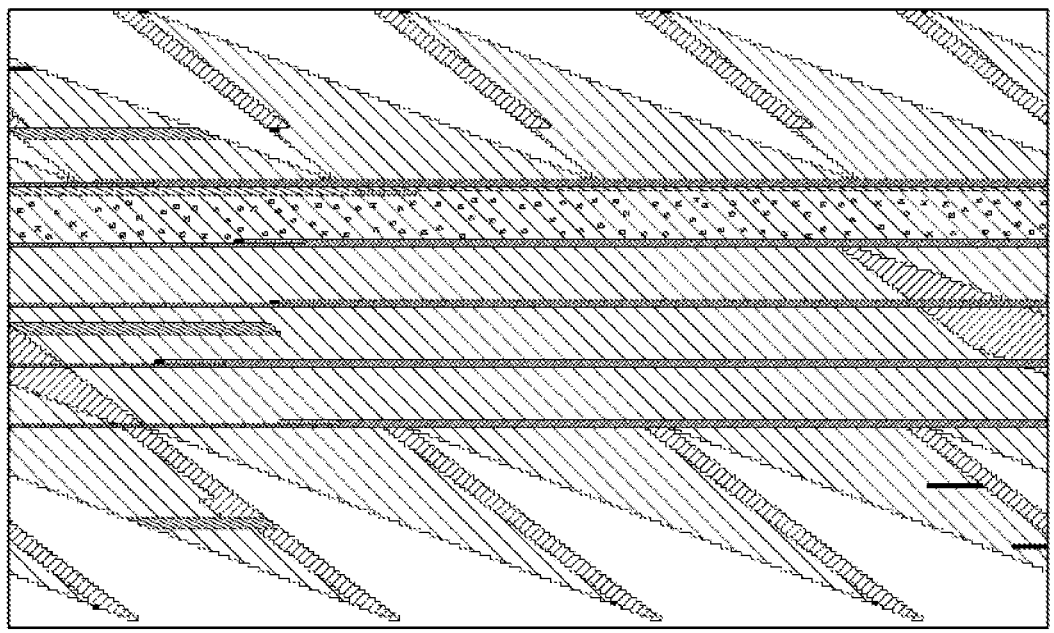

FIG. 26 is a stream configuration illustrating an example of another known data inserting method. According to FIG. 26, among total six long training sequences, the second sequence has been substituted to dispersed type known data.

Figure 27:
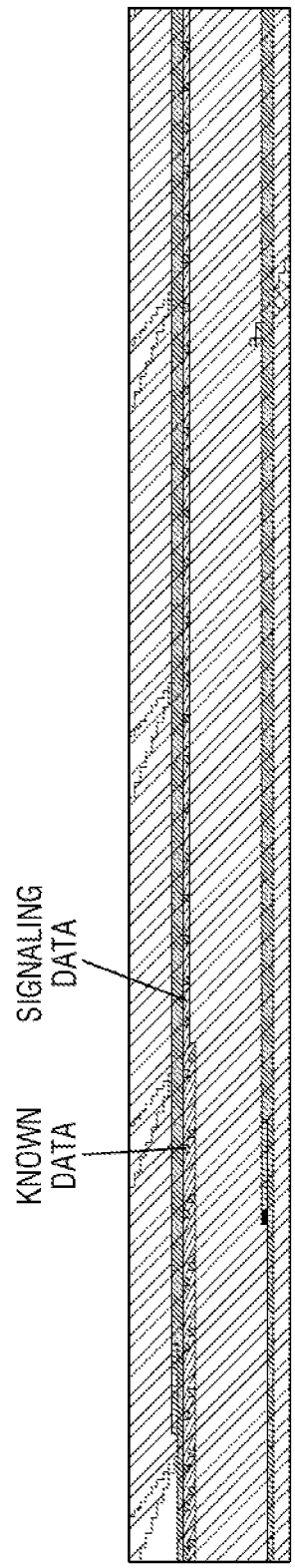

FIG. 27 illustrates a state where known data substituted to dispersed type known data is arranged in turns with signaling data in the stream configuration of FIG. 26.

Figure 28:
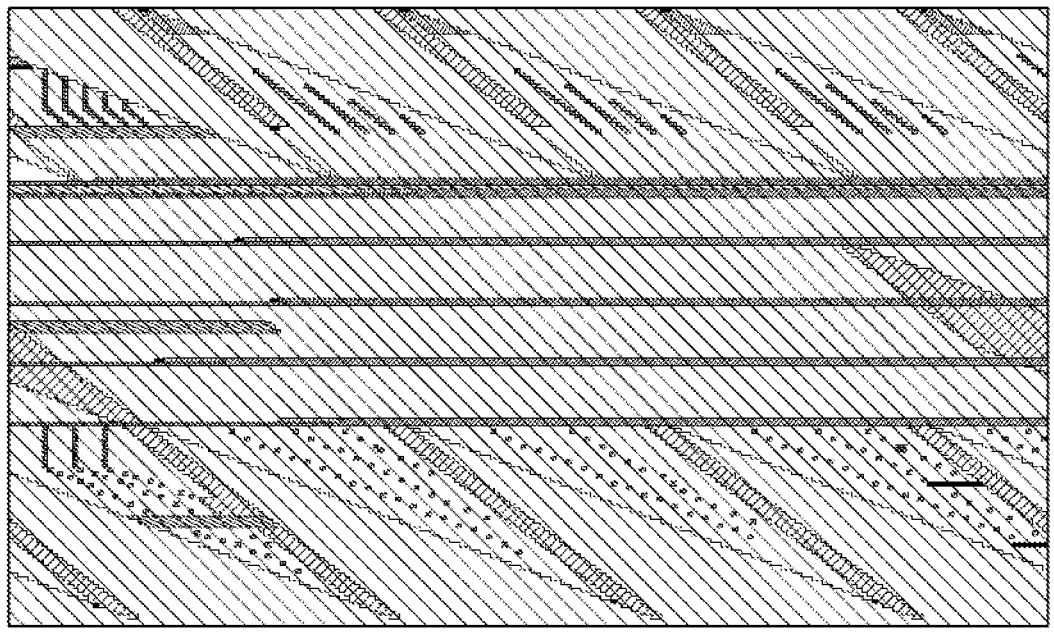

FIG. 28 illustrates a stream configuration of a state where dispersed known data is added not only in the head region but also the tad region.

As aforementioned, known data may be arranged in various formats.

Meanwhile, in a case of newly arranging mobile data in the packets allocated, to normal data, the arrangement pattern may be changed variously. Hereinbelow is an explanation on a stream configuration which includes mobile data arranged in various methods.

[Arrangement of Mobile Data]

The data preprocessor 100 checks a setting state of a frame mode. The frame mode may be provided in various ways. For example, in a first frame mode, packets allocated to normal data are used for normal data, and packets allocated to mobile data are used for mobile data. In a second frame mode, at least a portion of packets allocated to normal data are used for mobile data. Such frame modes may be set at the discretion of a digital broadcasting transmitting provider considering the intentions and transmitting taw environment.

When it is determined that the first frame mode which arranges normal data to the entire packets allocated normal data is set, the data preprocessor 100 arranges mobile data only to packets allocated to mobile data in the existing ATSC-MH method.

On the other hand, when it is determined that the second frame mode is set, the data preprocessor 100 determines a setting state of a mode again. A mode refers to a setting regarding a kind of pattern of arranging mobile data and the number of packets where mobile data will be arranged, in packets allocated to normal data, that is the second region. According to exemplary embodiment, various modes may be provided.

More specifically, the mode may be set to be one of a first mode which arranges mobile data to only a portion of the entire packets allocated to normal data and a second mode which arranges mobile data to the entire packets allocated to normal data. In this case, the first mode may be set differently also depending on whether or not it is a mode utilizing, a data region of some packets, that is, the entire payload region, or a mode utilizing only a portion of the payload region in the mobile data.

In another example, in a case where packets corresponding to the second region allocated to normal region, the mode may be set as one of the following:

A first mode which arranges mobile data to ¼ packets of the 38 packets,

A second, mode which arranges mobile data to ²⁄₄ packets of the 38 packets,

A third mode which arranges mobile data to ¾ packets of the 38 packets, and

A fourth mode which arranges mobile data to the entire 38 packets.

Figure 29:
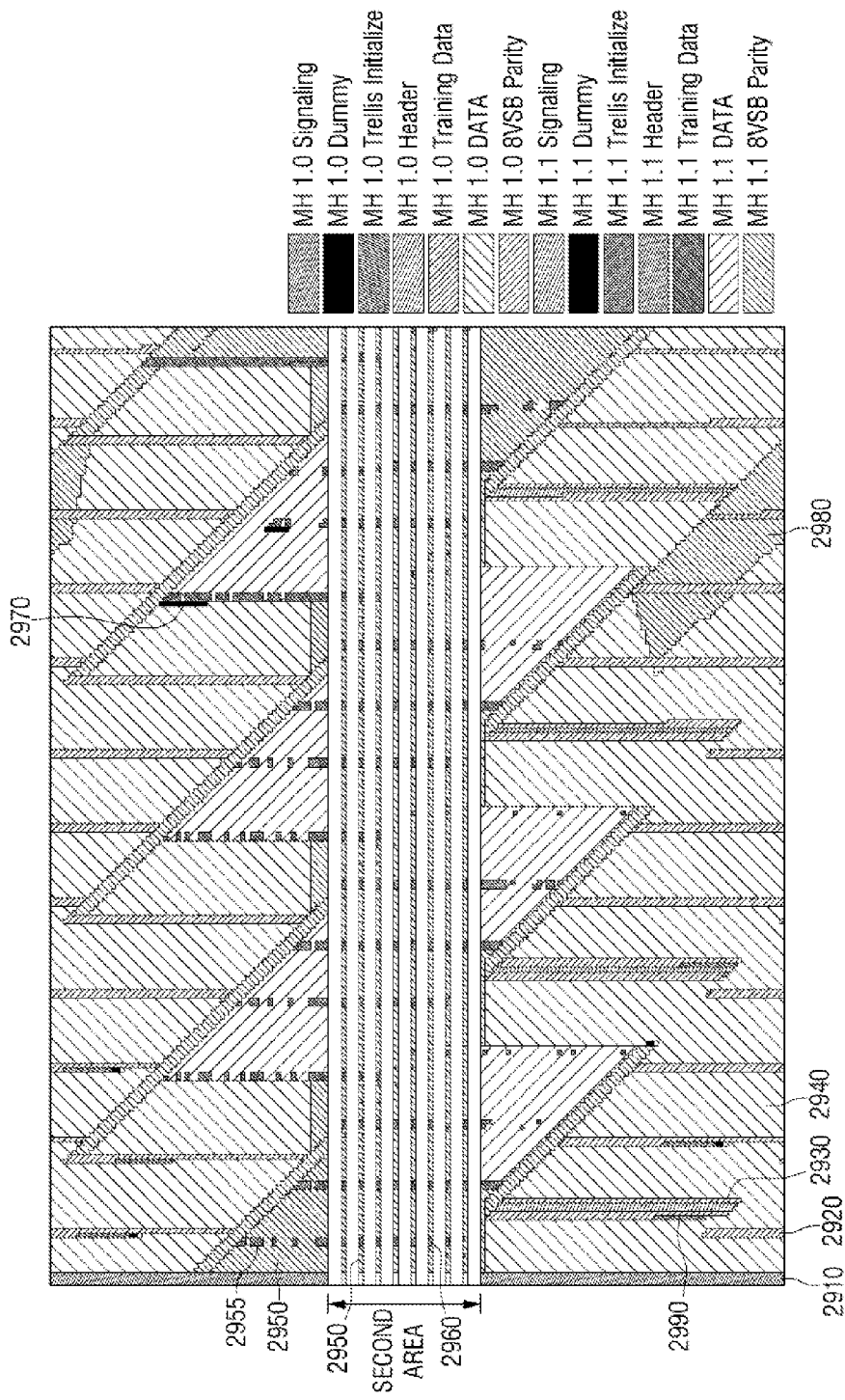
FIG. 29 is a view illustrating a pattern where mobile data is arranged in a normal data region according to a first mode.

FIG. 29 is a stream configuration illustrating a state where the group formatter 130 arranged mobile data and known data according to the first mode, under an exemplary embodiment which transmits new mobile data using the second region and head/tail region.

According to FIG. 29, new mobile data 2950 (or MH 1.1 data) and new known data 2960 (or MH 1.1 training data) are arranged in a predetermined pattern in the second region, and new mobile data and new known data are also arranged in the head/tail region other than the second region.

In addition, it can be seen that MPEG header 2910, known data 2920, signaling data 2930, existing mobile data 2940, and dummy 2970 are arranged in a vertical direction on the stream. In this state, normal data is filled into an empty space within the second region, and after encoding and interleaving are performed, a stream having the structure of FIG. 30 is created.

Figure 30:
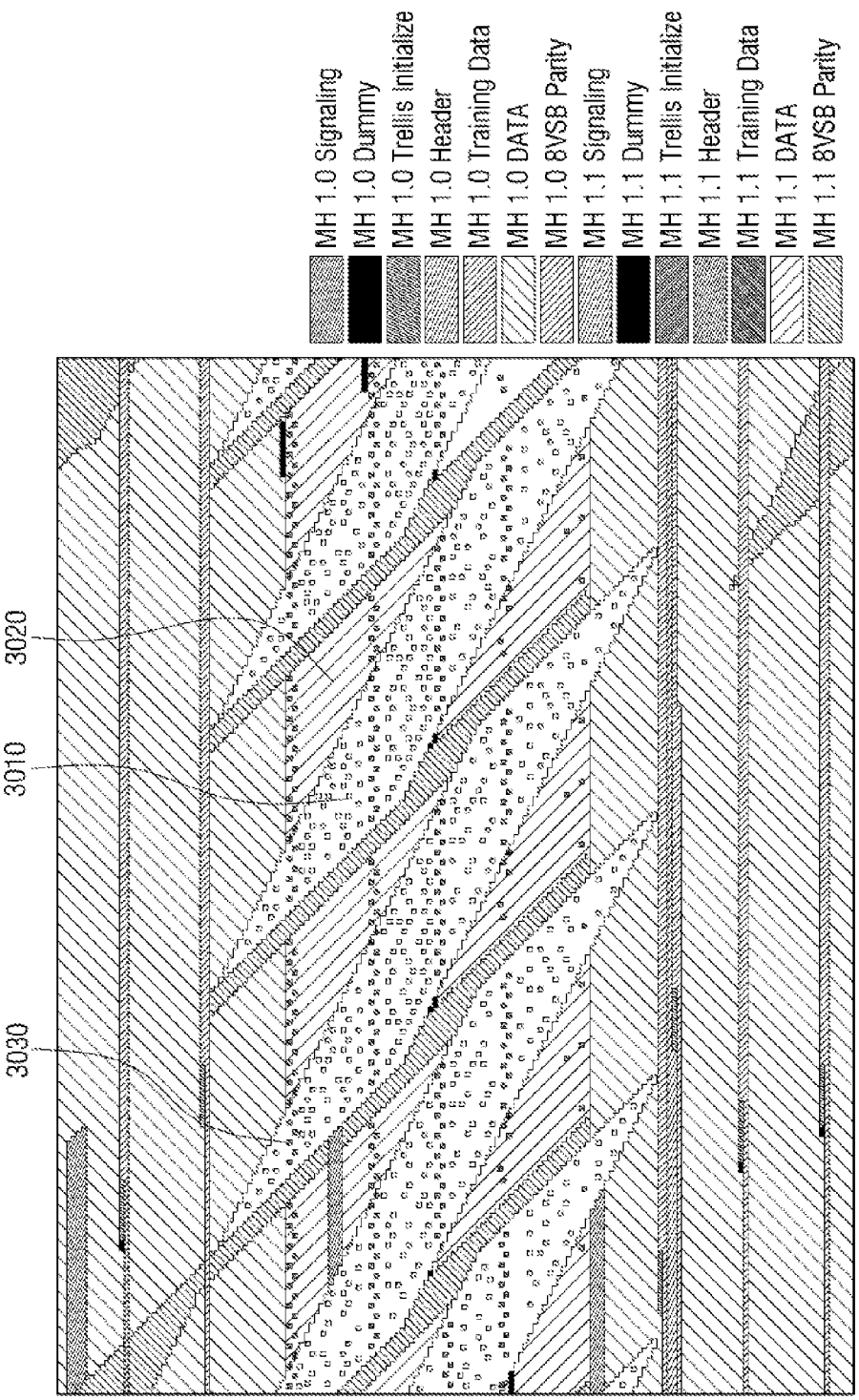
FIG. 30 is a view illustrating a state where the stream of FIG. 29 is interleaved.

FIG. 30 is a stream configuration after interleaving in mode 1.

According to FIG. 30, in a normal data region, new mobile data 3010 and new known data 3030 are arranged. Especially, the known data is arranged discontinuously in this region, forming a long training sequence format which is similar to a long training sequence format in the body region.

Mobile data 2950 arranged in the head/tail region in FIG. 29 corresponds to mobile data 3020 arranged in the head/tail region in FIG. 30, and known data 2955 arranged together with mobile data 2950 forms known data 3030 having a similar long training sequence format together with the known data in the second region in FIG. 30.

Figure 31:
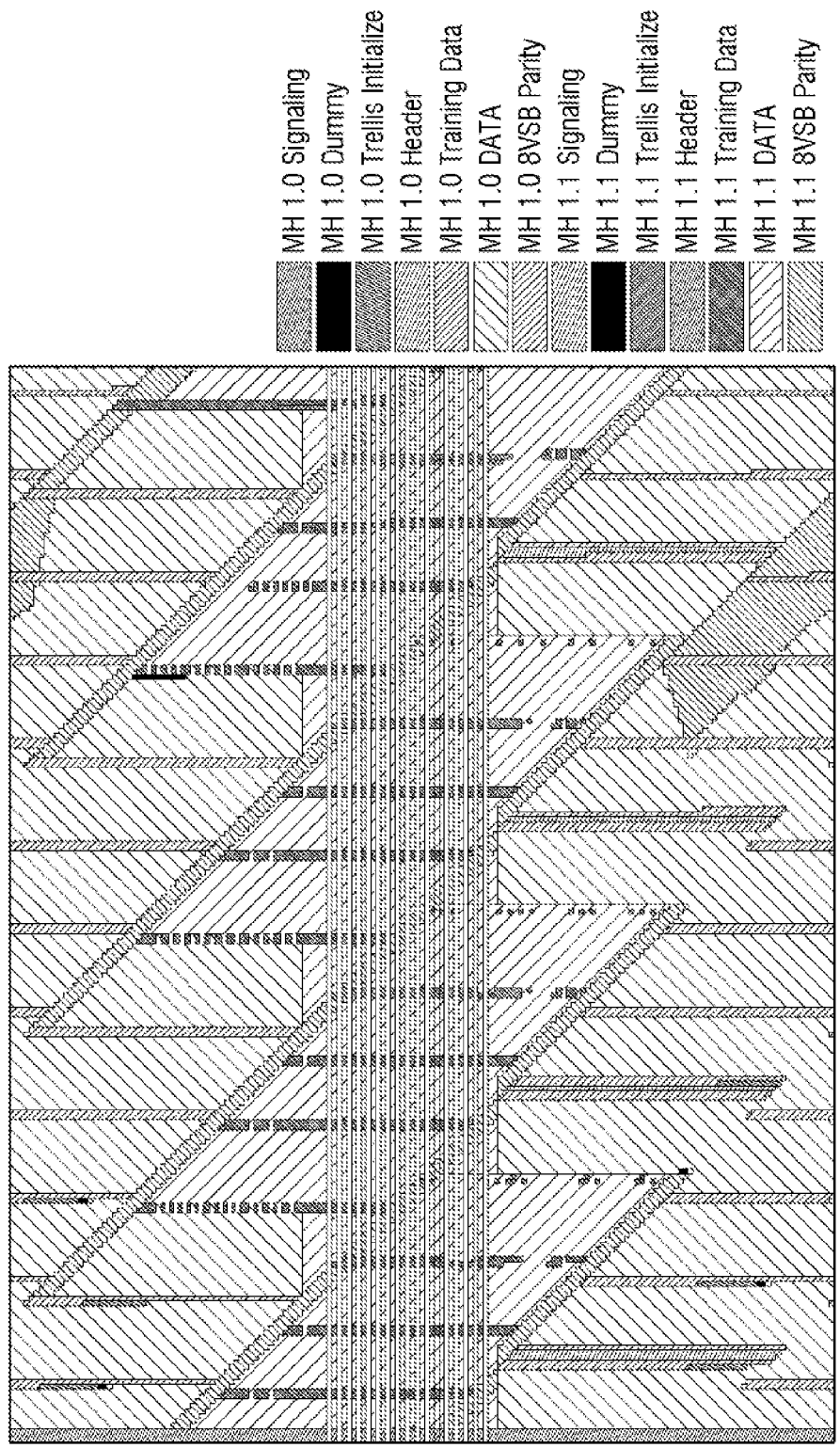
FIG. 31 is a view illustrating a pattern where mobile data is arranged in a normal data region according to a second mode.

FIG. 31 is a stream configuration illustrating a state where the group formatter 130 arranged mobile data and known data according to the second mode, under an exemplary embodiment of transmitting new mobile data using the second region and the head/tail region.

FIG. 31 illustrates a state where the ratio of new mobile data included in the second region has increased compared to FIG. 29. Compared to FIG. 29, FIG. 31 is a state where a portion taken up by new mobile data and new known data has increased.

Figure 32:
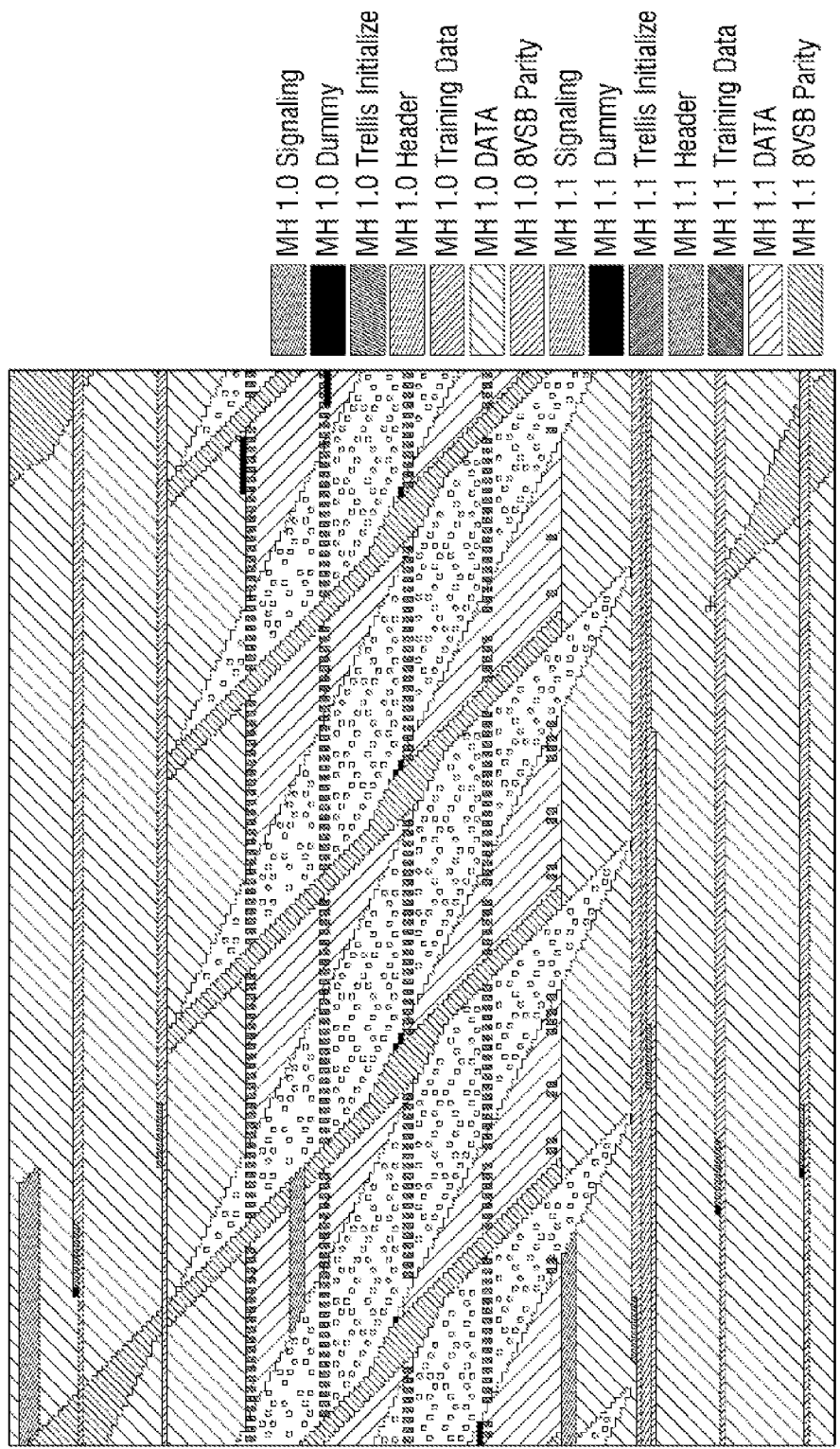
FIG. 32 is a view illustrating a state where the stream of FIG. 31 is interleaved.

FIG. 32 is a state where the stream of FIG. 31 has been interleaved. According to FIG. 32, new known data in the second region forms a similar long training sequence in a more dense form, compared to new known data in the second region of FIG. 30.

Figure 33:
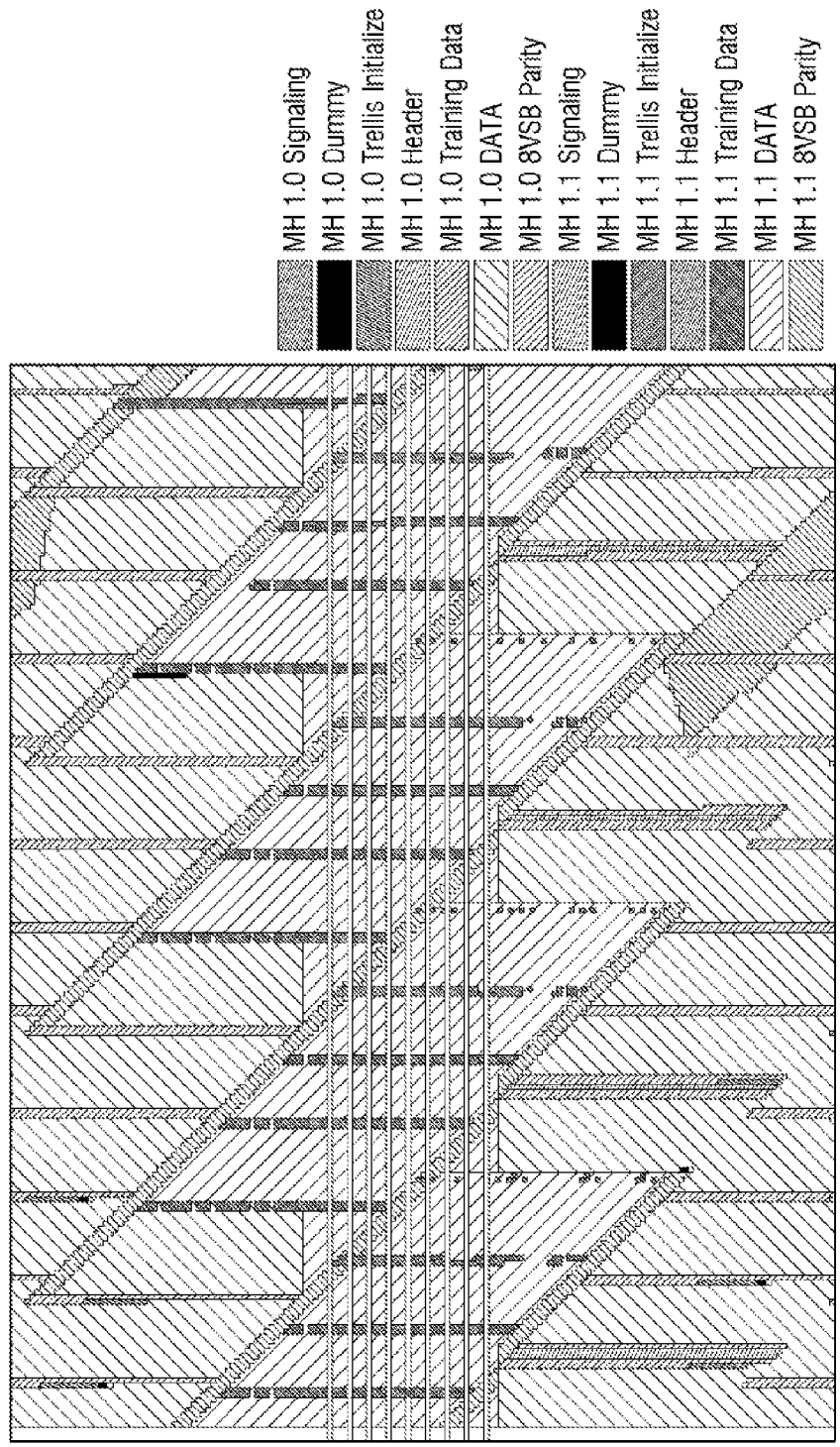
FIG. 33 is a view illustrating a pattern where mobile data is arranged in a normal data region according to a third mode.

FIG. 33 is a stream configuration illustrating a state where the group formatter 130 arranged mobile data and known data according to the third mode, under an exemplary embodiment which transmits new mobile data using the second region and the head/tail region. In addition, FIG. 34 is a state where the stream of FIG. 33 is interleaved.

Figure 34:
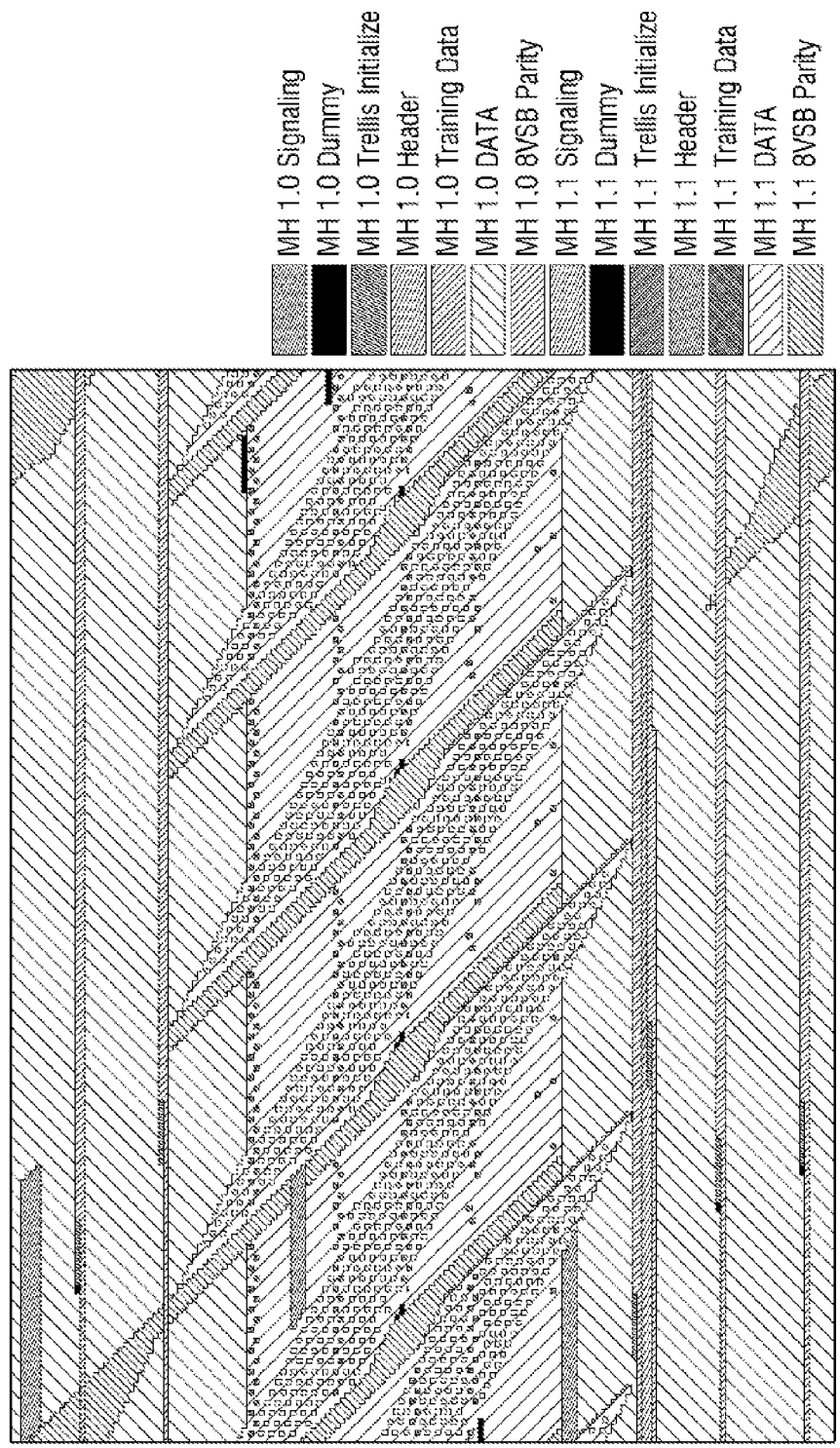
FIG. 34 is a view illustrating a state where the stream of FIG. 33 is interleaved.

FIG. 33 and FIG. 34 do not have anything particular besides that the density of arrangement of mobile data and known data became higher compared to mode 1 and mode 2, and thus, a further explanation is omitted.

Figure 35:
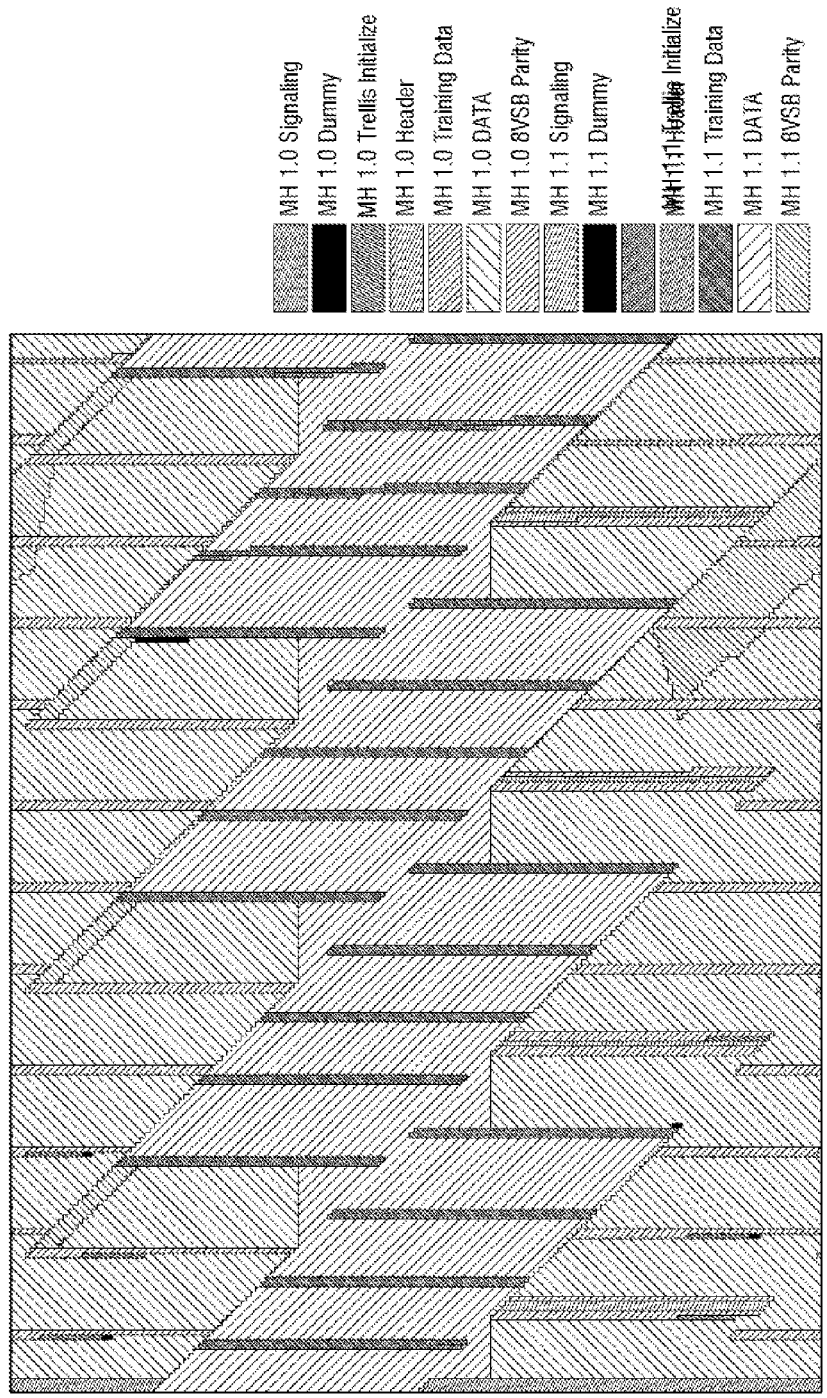
FIG. 35 is a view illustrating a pattern where mobile data is arranged in a normal data region according to a fourth mode.

FIG. 35 illustrates a stream configuration according to the fourth mode which uses the entire normal data region, under an exemplary embodiment which may use both the entire packets allocated to normal data and the packet region allocated to existing mobile data corresponding to the head/tail region.

According to FIG. 35, in the second region and its surrounding region, new known data is arranged in a vertical direction, and the remaining portion is filled with new mobile data.

Figure 36:
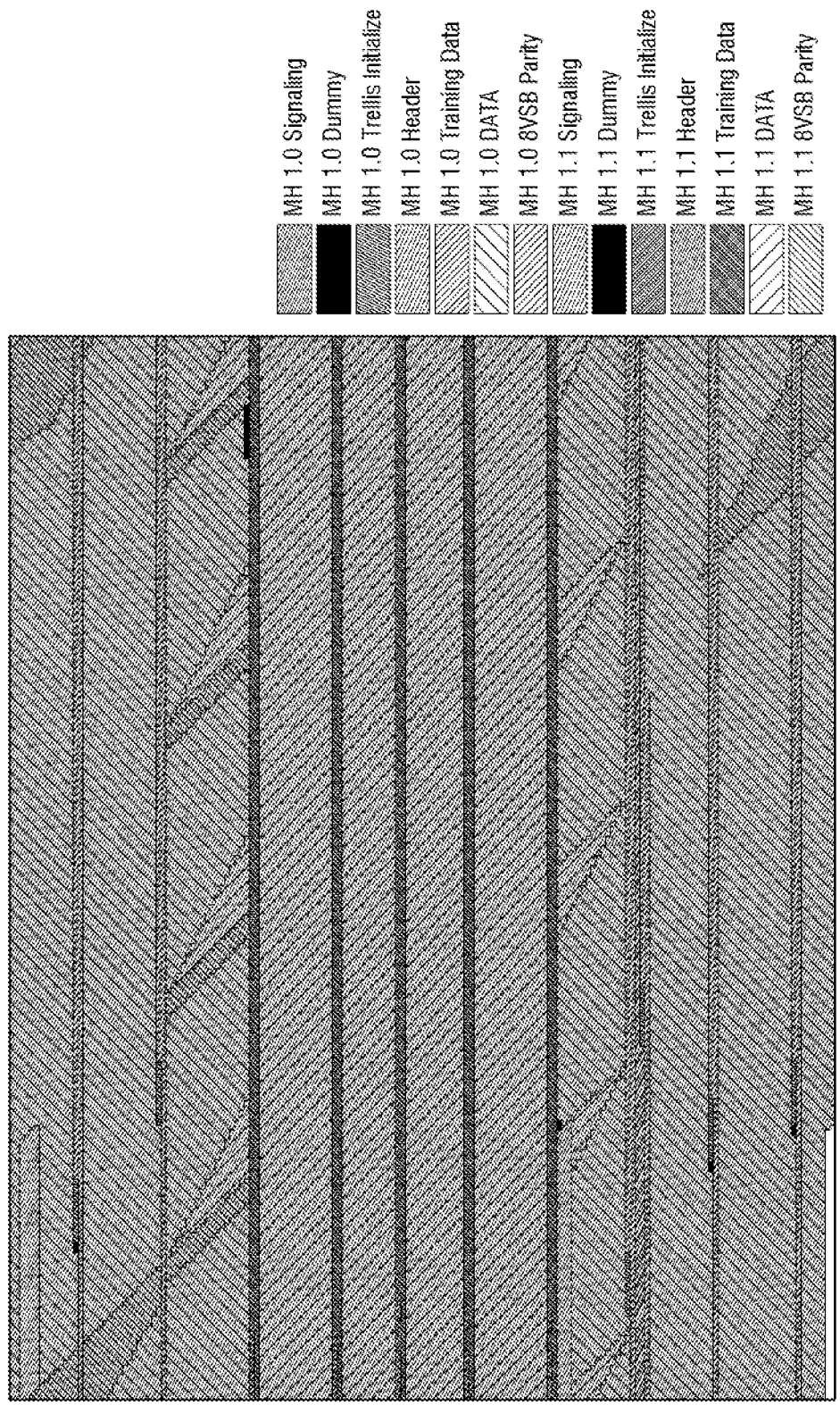
FIG. 36 is a view illustrating a state where the stream of FIG. 35 is interleaved.

FIG. 36 illustrates a state where the stream of FIG. 35 is interleaved. FIG. 36 illustrates a state where the entire head/tail region and normal data region are filled with new mobile data and new known data, and especially, where new known data is arranged in a long training sequence format.

Meanwhile, in this region, the known data may be embodied to be inserted little by little repeatedly in a cycle of a plurality of patterns, and to be dispersed type known data after interleaving.

FIGS. 37A to 37D illustrate methods of inserting new mobile data into the second region, that is, packets allocated to normal data (for example, 38 packets), in the first to fourth modes (mode 1 to mode 4). For convenience of explanation, hereinbelow, new mobile data will be referred to as ATSC mobile 1.1 data (or 1.1 version data), and existing mobile data as ATSC mobile 1.0 data (or 1.0 version data).

Figure 37A:
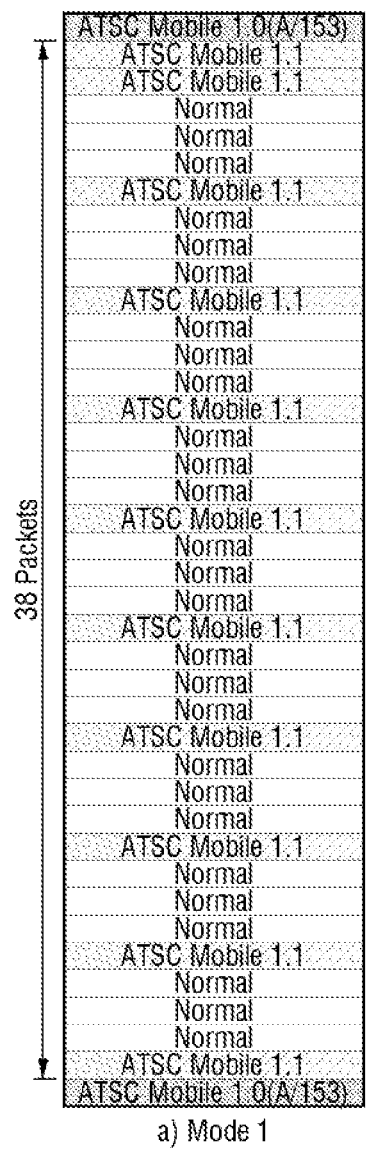

FIG. 37A illustrates the first mode, in which each 1.1 version data is arranged in first and final packets, and between these two packets, one 1.1 version data packet and three normal data packets are arranged repeatedly. Accordingly, a total of 11 packets may be used in transmitting 1.1 version data, that is, new mobile data.

Figure 37B:
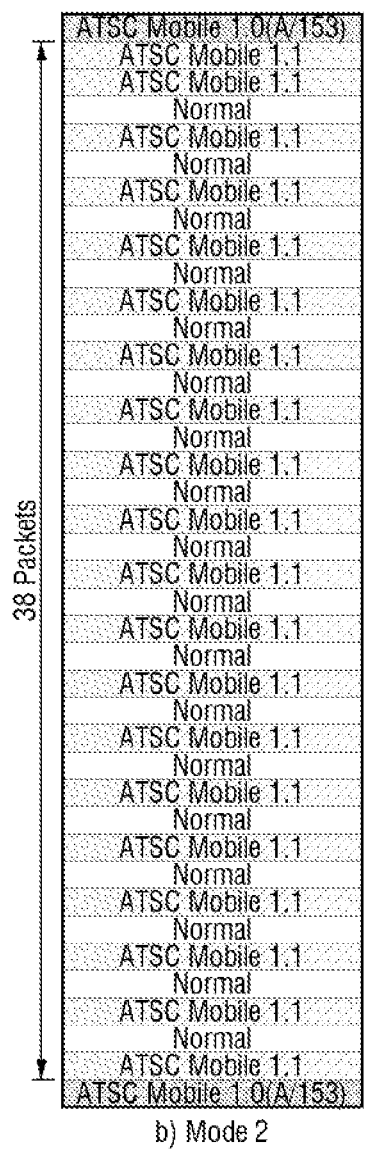

FIG. 37B illustrates the second mode, in which each 1.1 version data is arranged in first and final packets, and between these two packets, one 1.1 version data packet and one normal data packet is arranged repeatedly in turns. Accordingly, a total of 20 packets may be used in transmitting 1.1 version data that is, new mobile data.

Figure 37C:
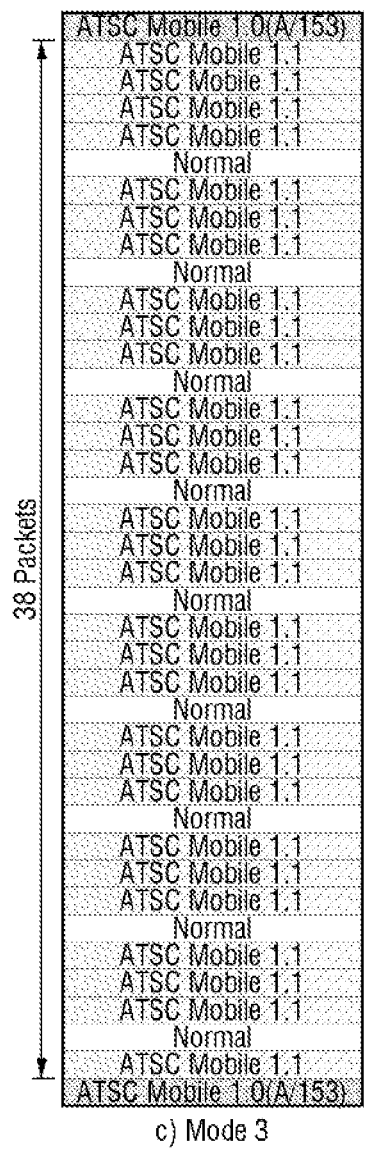

FIG. 37C illustrates the third mode, in which each 1.1 version data is arranged in first and final packets, and between these two packets, three 1.1 version data packets and one normal data packet are arranged repeatedly in turns.

Figure 37D:
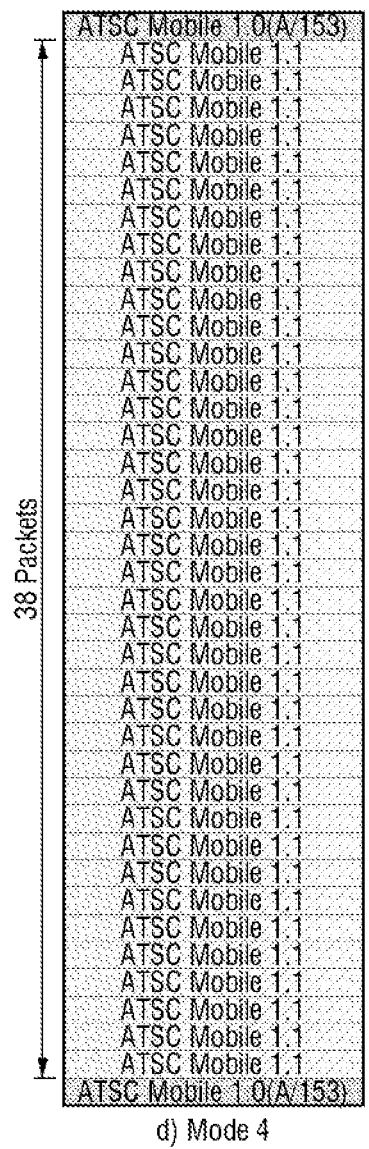

FIG. 37D illustrates the fourth mode, in which the entire packets corresponding to the second region are used in transmitting 1.1 version data.

In the aforementioned modes, 1/4, 2/4, 3/4, and 4/4 of the entire packets of the second region are used in transmitting mobile data in the first to fourth modes, respectively. Since the total number of packets is 38, that is, not a multiple a 4, it is possible to divide the modes by fixing some of the packets for transmitting new mobile data or normal data, and dividing the remaining packets in the aforementioned ratios. That is, according to FIGS. 37A to 37C, the remaining 36 packets other than the first and final packets, that is, a predetermined number of packets among 38 packets, 1.1 version data may be included in ratios of 1/4, 2/4, and 3/4, respectively.

FIGS. 38A~38D illustrates a mobile data arrangement pattern according to another exemplary embodiment.

FIGS. 38A~38D, two 1.1 version data are arranged in central two packets which are located, at a center of 38 packets, and 1.1 version data and normal data are arranged according to a ratio determined under each mode.

Figure 38A:
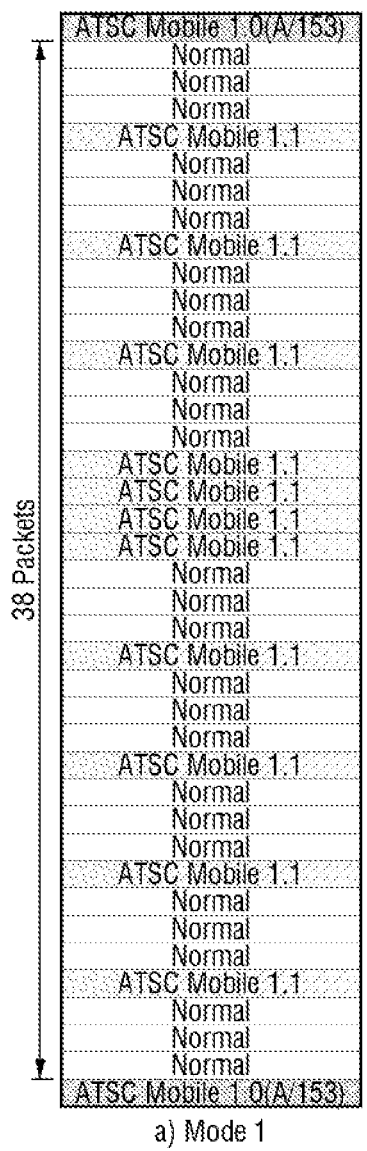

FIG. 38A illustrates the first mode, in which mobile data is arranged in the central two packets in 38, packets, and, in the remaining packets, three normal data packets and one 1.1 version data packet are repeated in the upper side and the lower side, respectively.

Figure 38B:
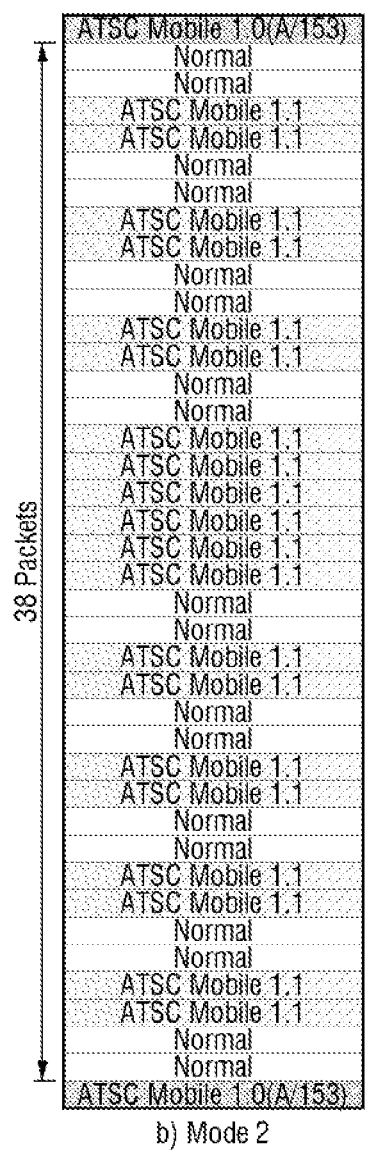

FIG. 38B illustrates the second mode, in which mobile data is arranged in the central two packets in 38 packets, and, in the remaining packets, two normal data packets and two 1.1 version data packets are repeated in the upper side and the lower side, respectively.

Figure 38C:
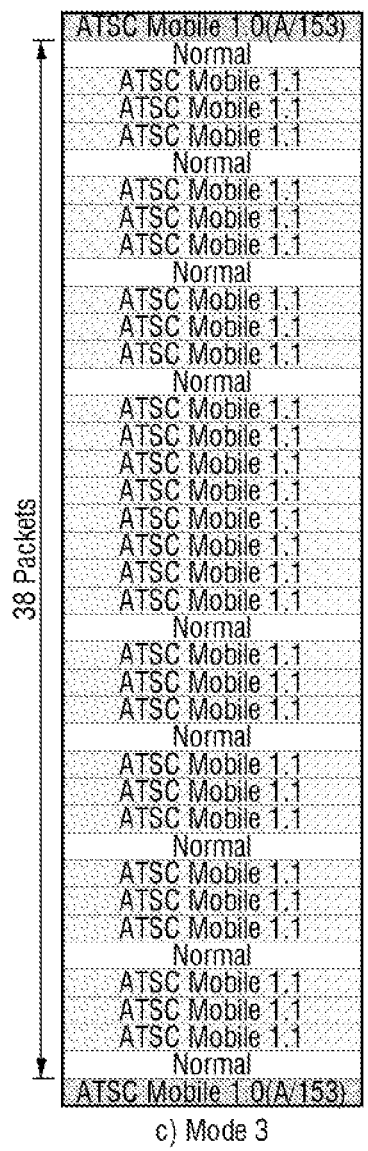

FIG. 38C illustrates the third mode, in which mobile data is arranged in the central two packets in 38 packets, and, in the remaining packets, one normal data packet and three 1.1 version data packets are repeated in the upper side and, the lower side, respectively.

Figure 38D:
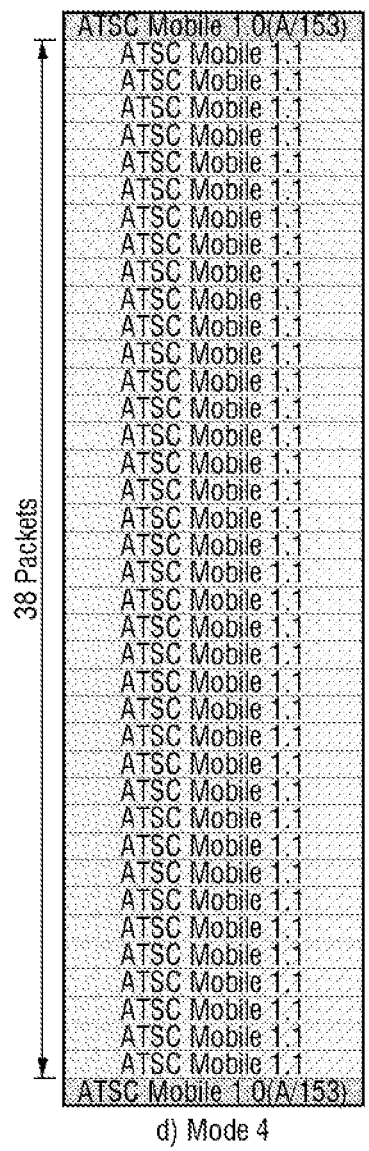

FIG. 38D illustrates the fourth mode, in which the entire packets are arranged, for the 1.1 version data, and this becomes the same format as in the fourth mode in FIG. 37D.

FIGS. 39A~39D illustrate exemplary embodiments where 1.1 version data is arranged from the central packet of 38 packets to the upper and lower side packets consecutively in the stream.

Figure 39A:
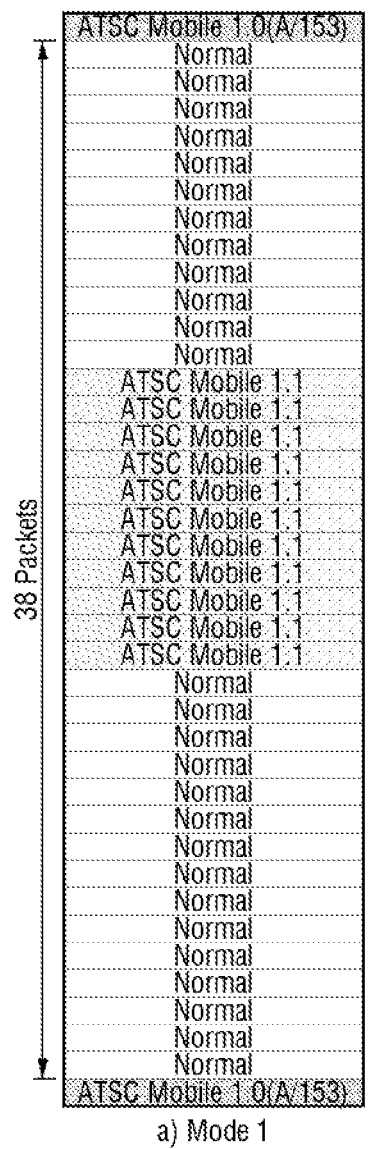

FIG. 39A illustrates the first mode, in which 11 packets among 38 packets, that is, the entire packets of the second region, are arranged in an upper and lower side direction from the center, consecutively.

Figure 39B:
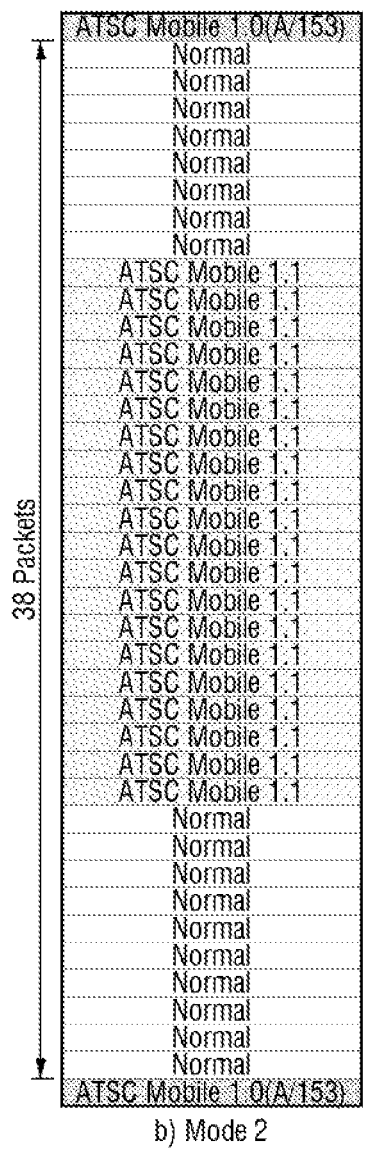
Figure 39C:
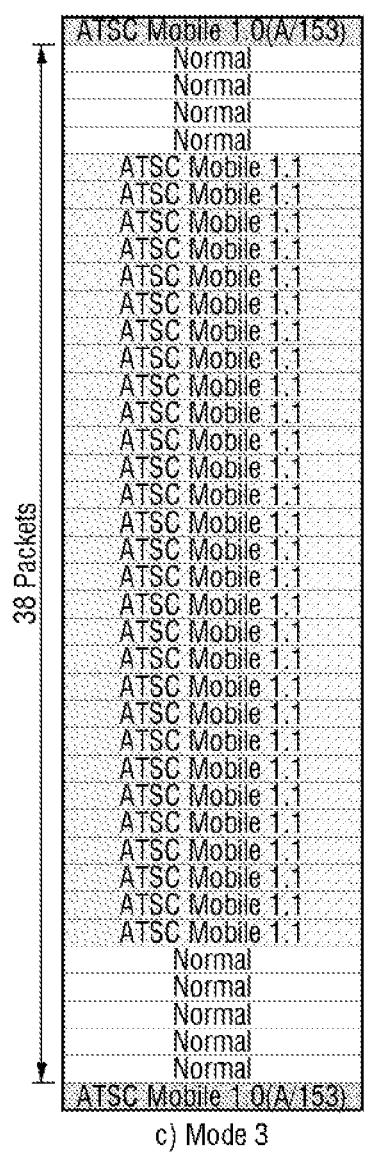
Figure 39D:
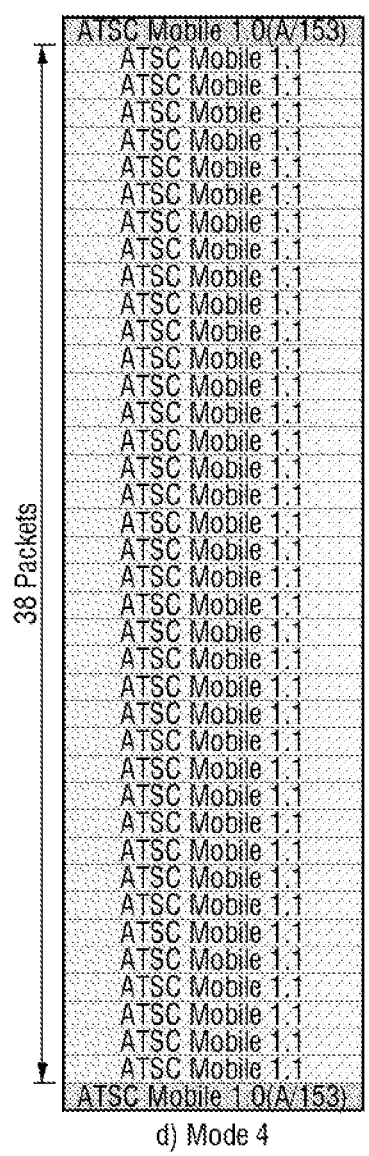

FIG. 39B illustrates the second mode, in which a total of 20 packets are arranged in upper and lower side directions from the center, consecutively. FIG. 39C illustrates the third mode, in which a total of 30 packets are arranged in upper and lower side directions from the center, consecutively. FIG. 39D illustrates the fourth mode, in which the entire packets are filled with 1.1 version data.

FIGS. 40A~40D illustrate a stream configuration of exemplary embodiments where mobile data is filled in a central direction from the uppermost and lowermost packets, which is opposite to FIGS. 39A~39D.

FIG. 40A illustrates the first mode, in which four 1.1 version data packets are arranged in downward and upward directions starting from the uppermost and lowermost packets, respectively, and the remaining packets are filled with normal data.

FIG. 40B illustrates the second mode, in which eight 1.1 version data packets are arranged in downward and upward directions starting from the uppermost and lowermost packets, respectively, and the remaining packets are filled with normal data.

Figure 40C:
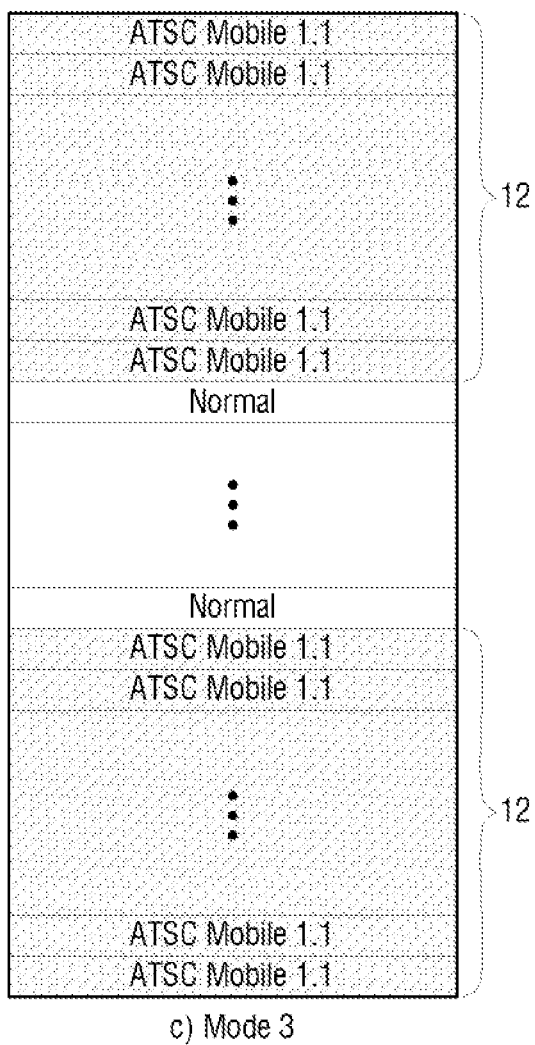

FIG. 40C illustrates the third mode, in which twelve 1.1 version data packers are arranged in downward and upward directions starting from the uppermost and lowermost packets, respectively, and the remaining packets are filled with normal data.

The packet pattern under the fourth mode in these exemplary embodiments is the same as FIGS. 37, 38, and 39, and thus, its illustration is omitted.

Meanwhile, in FIGS. 37A to 40C, there is no illustration on inserting known data but known data may be inserted into some region of the same packets where mobile data is arranged, into some regions of different packets, or into the entire payload region. The method of inserting known data was illustrated above, and thus, further illustration is omitted in FIGS. 37A to 40C.

As aforementioned, mobile data may be filled in the normal data region of each slot in various formats. Therefore, the slot's format may differ according to the frame mode and the setting state of the mode.

As aforementioned, in a state where four modes have been provided, each slot where mobile data is arranged in the first mode to the fourth mode (mode 1 to mode 4) may be referred to as a first type slot to a fourth type slot, respectively.

A digital broadcasting transmitter may form a same type of slot from each slot, but on the contrary, a stream may be configured to repeat different types of slots.

That is, as in FIG. 41, the data preprocess 100 may arrange mobile data such that one type 1 slot and three type 0 slots are arranged repeatedly in turns. The type 0 slot may be a slot where normal data is arranged in packets allocated to normal data.

Such a slot type may be defined by using a particular portion of the existing signaling data, for example, TPC or FIC.

Meanwhile, in a state where the frame mode is set as the second frame mode as aforementioned, a mode for a setting state of a mode may be set as one of a plurality of modes such as the first to fourth modes. A slot corresponding to each mode may be referred to as type 1-1, type 1-2, type 1-3, and type 1-4 slots, respectively.

That is, the type 1-1 slot refers to a slot where 38 packets are allocated to the first mode, the type 1-2 slot refers to a slot where 38 packets are allocated to the second mode, the type 1-3 slot refers to a slot where 38 packets are allocated to the third mode, and the type 1-4 slot refers to a slot where 38 packets are allocated to the fourth mode.

FIGS. 42A~42F illustrate examples of streams where such various types of slots are arranged repeatedly.

FIG. 42A illustrates a stream where a type 0 slot and types 1-1, 1-2, 1-3, and 1-4 slots are repeated consecutively.

FIG. 42B illustrates a stream where a type 1-4 slot and a type 0 slot is repeated in turns. As aforementioned, the fourth mode is a mode which fills the entire normal data region with mobile data, and thus, FIG. 42B refers to a situation where a slot where the entire normal data region is used by mobile data and a slot where the entire normal data region is used by normal data is arranged in turns.

Besides, various types of slots may be arranged repeatedly in turns in various methods as in FIGS. 42C~42F. Especially, FIG. 42F illustrates that the entire slots are uniformed into one type.

Figure 43:
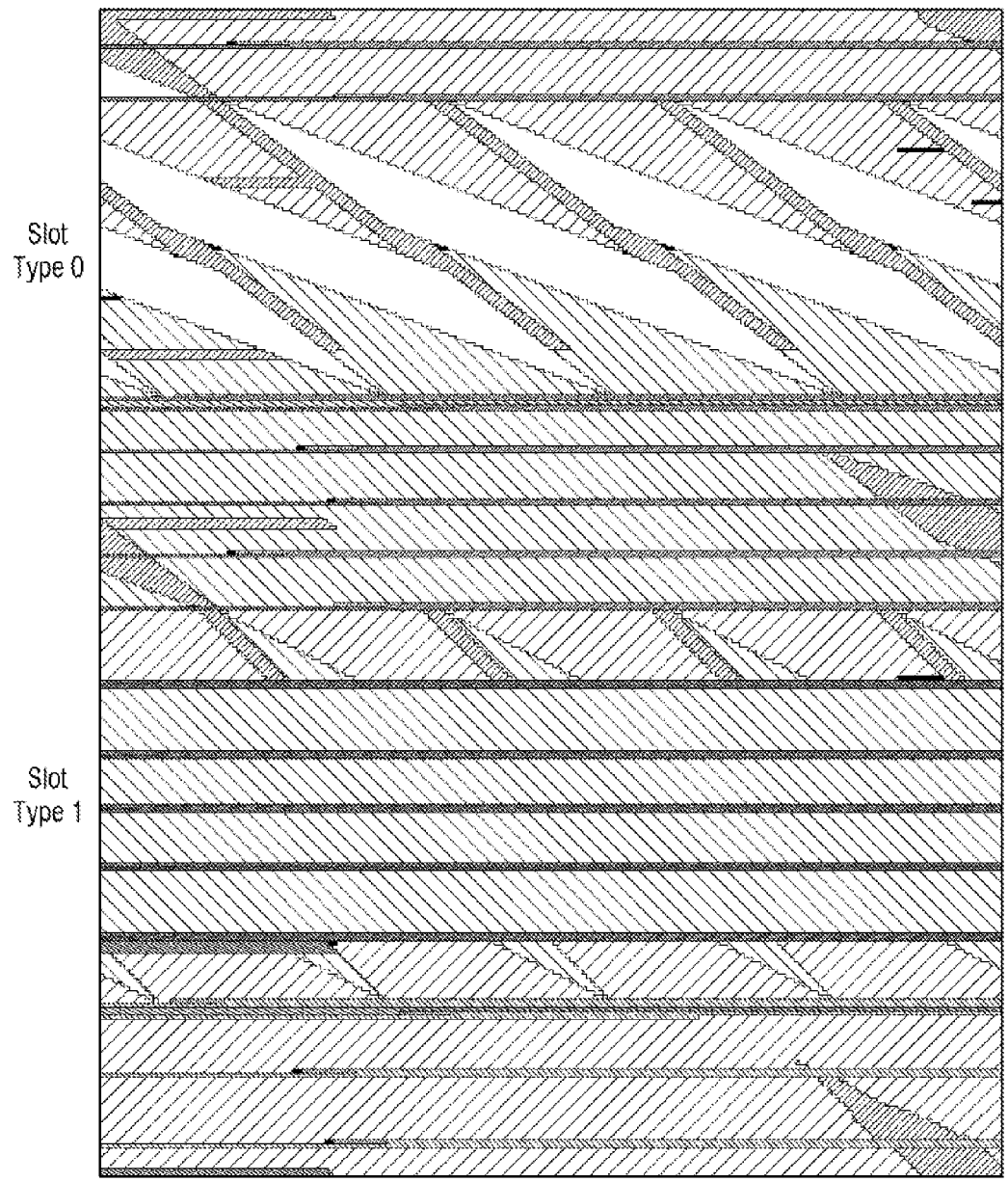

FIG. 43 illustrates a steam configuration according to FIG. 42B. According to FIG. 43, in the type 0 slot, normal data region is used for normal data, but in the type 1 slot, the entire normal data region is used for mobile data, while at the same time, known data is arranged in a long training sequence format. As such, slots may be embodied in various formats.

FIGS. 44 to 47 illustrate stream configurations for explaining a block allocating method in the first mode to the fourth mode (mode 1 to mode 4). As aforementioned, the first region and the second region may each be divided into a plurality of blocks.

The data preprocessor 100 may perform block coding in combination units of one block or a plurality of blocks according to a preset block mode.

Figure 44:
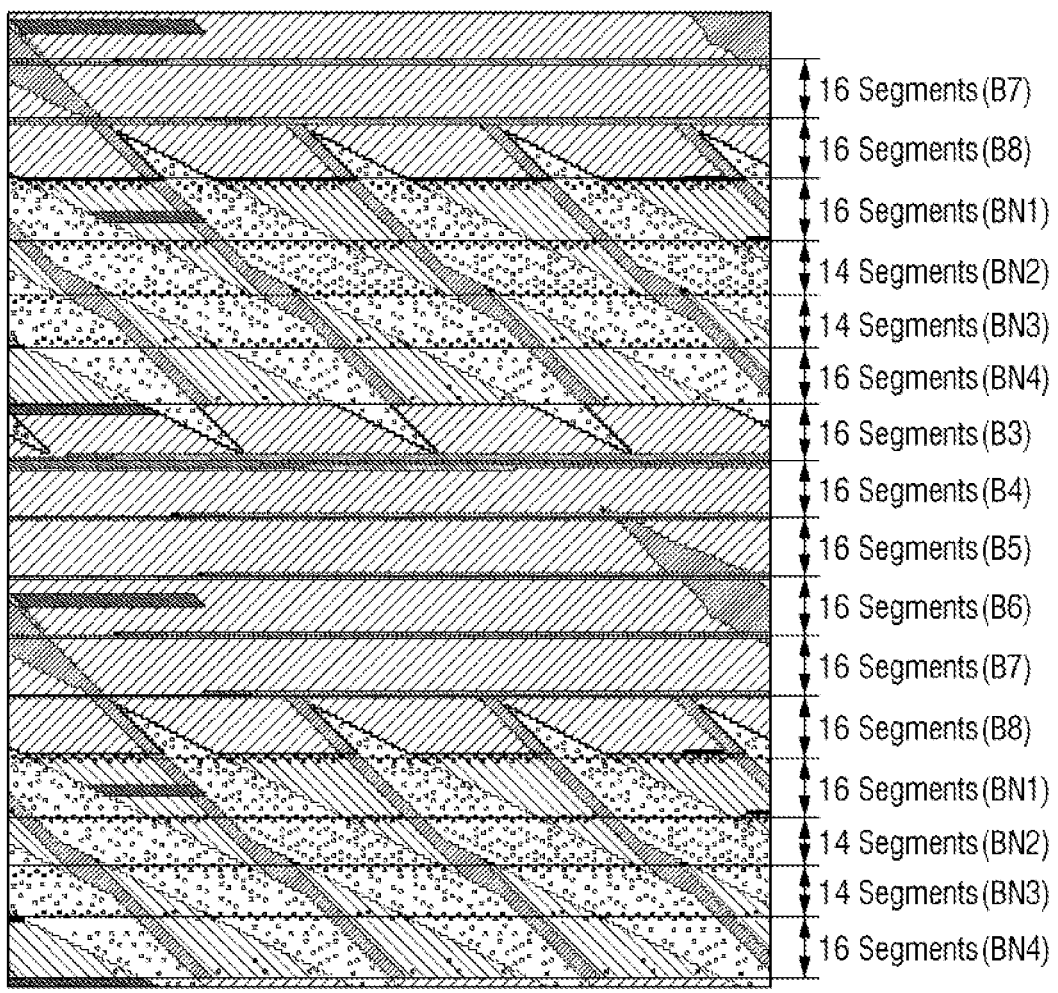
FIGS. 44 to 47 are views explaining a block allocating method according to various exemplary embodiments.

FIG. 44 illustrates block division under the first mode. According to FIG. 44, the body region is divided into B3 to B8, and the head/tail region is divided into BN1 to BN4.

Figure 45:
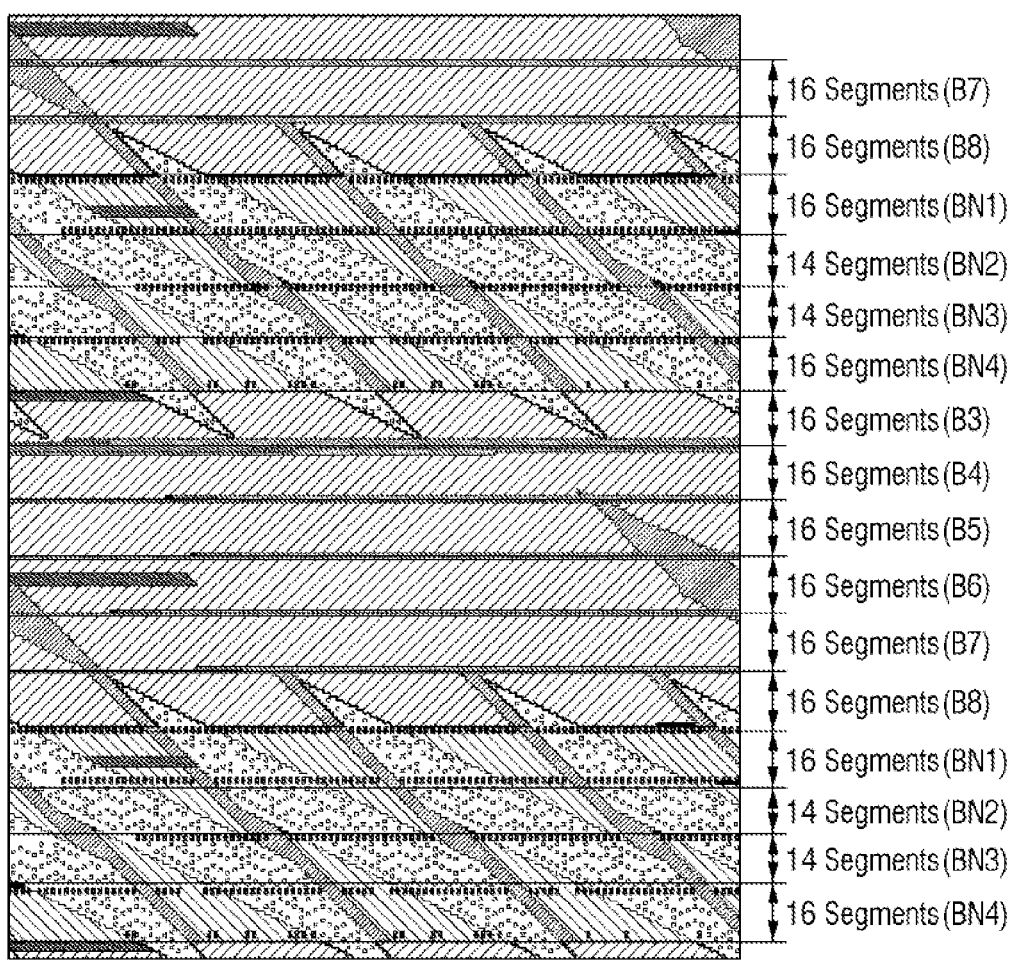
Figure 46:
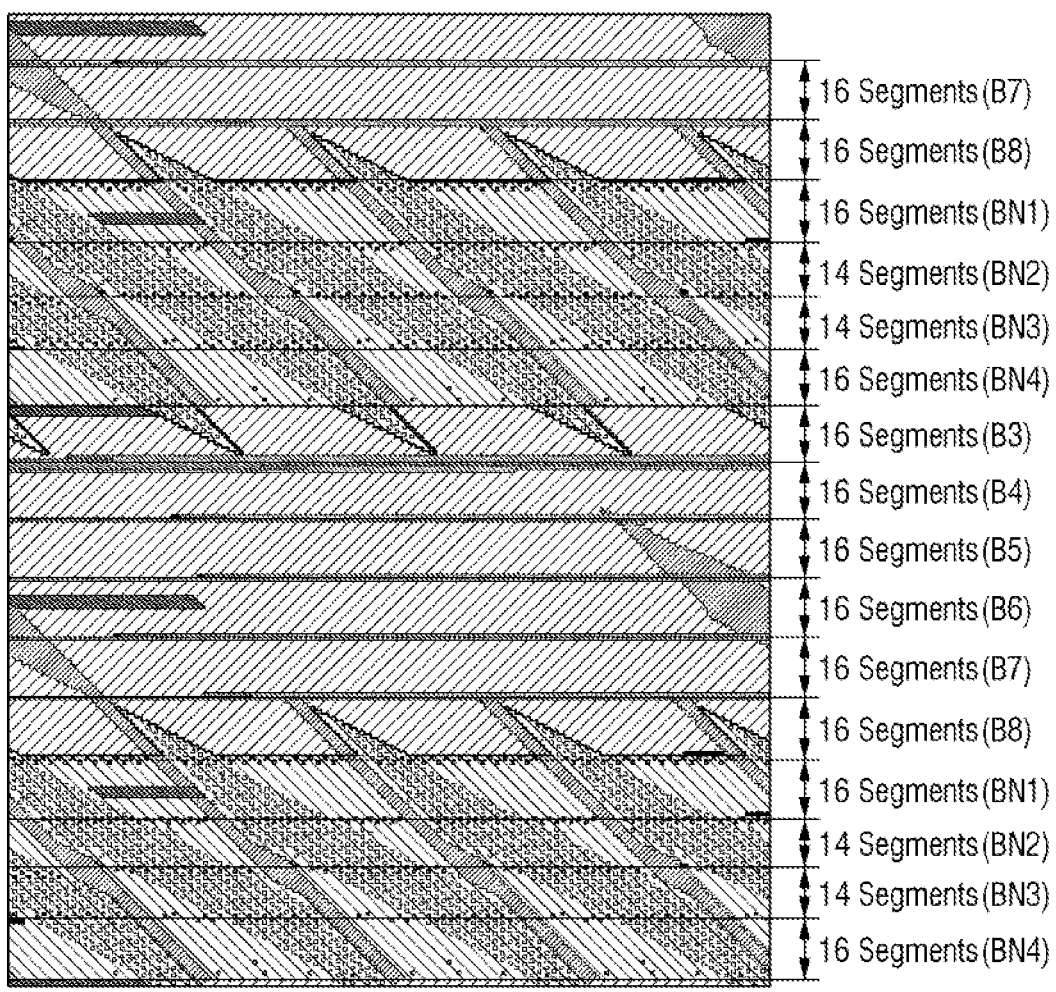

FIG. 45 and FIG. 46 illustrate block division under the second mode and the third mode, respectively. As in FIG. 44, the body region and head/tail region are each divided no a plurality of blocks.

Figure 47:
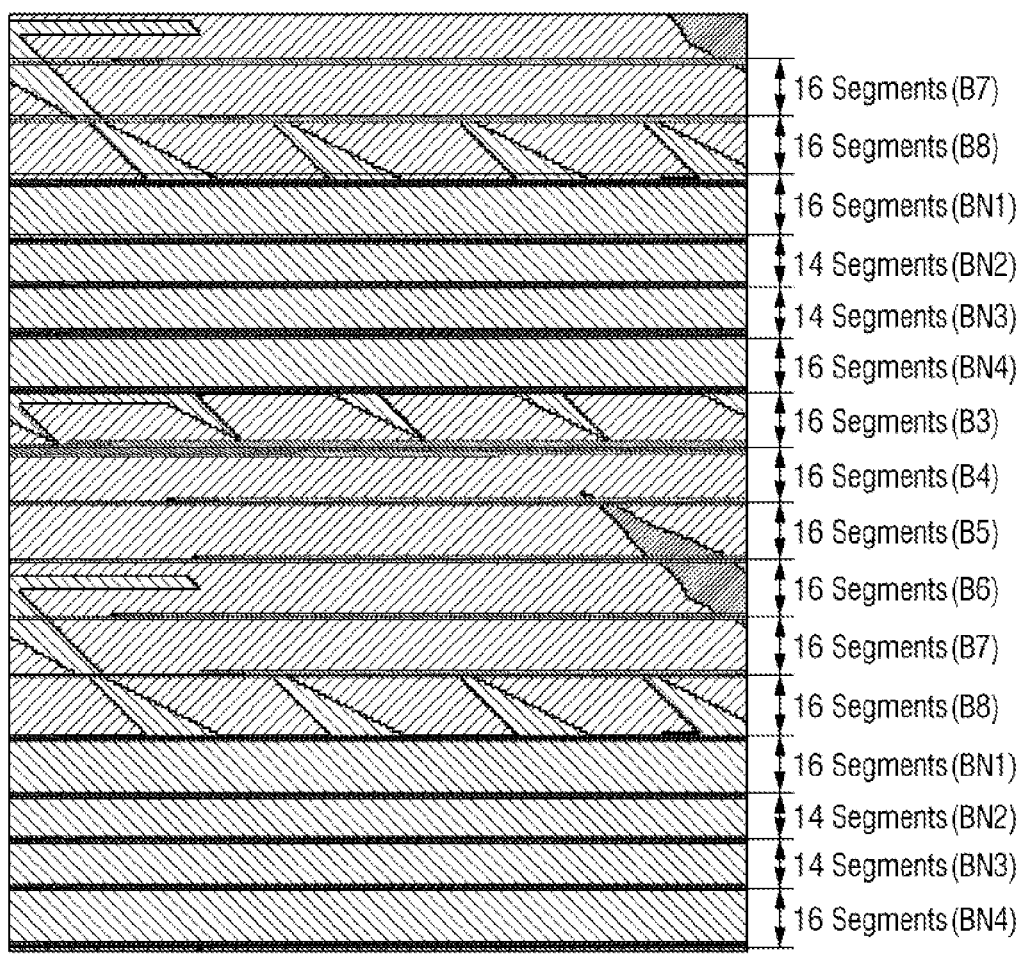

Meanwhile, FIG. 47 illustrates block division under the fourth mode where the head/tail region is fully filled with mobile data, for example, new mobile data. As the normal data region is completely filled with mobile data, an MPEG header in the body region and a parity portion of the normal data becomes unnecessary, and thus, these portions are defined as BN5 (now shown) in FIG. 47. As such, compared to FIGS. 44 to 46, in FIG. 47, the head/tail region is divided into BN1 to BN5.

As aforementioned, the block processor 120 of the data preprocessor 100 converts an input RS frame into block units. That is, as illustrated in FIG. 7, the block processor 120 includes a first converter 121, and the first converter 121 combines mobile data in the RS frame according to a preset block mode, and outputs SCCC blocks.

The block mode may be set in various ways.

For example, in a state where the block mode is set to 0, each block, that is BN1, BN2, BN3, BN4, or BN5 is output as one SCCC block, becoming a unit of SCCC coding.

On the other hand, in a case where the block mode is set to 1, the blocks are added up to form an SCCC block. More specifically, BN1 and BN3 becomes an SCBN1 block, BN2 and BN4 becomes an SCBN2 block, and BN5 may become an SCB3 block by itself.

Meanwhile, besides new mobile data arranged in the second region, existing mobile data arranged in the first region may be combined into one or in a plurality, and be block-coded. This is the same as the ATSC-MH standard, and thus, explanation thereof will be omitted.

Information on the block mode may be included in existing signaling data, or in a region provided in new signaling data to be notified to a receiver. The receiver may check the information on the notified block mode, adequately decode a stream, and restore an original stream.

Meanwhile, as aforementioned, data to be block-coded may be combined and form an RS frame. That is, the frame encoder 110 within the data preprocessor 100 adequately combines each frame portions so that the block processor 120 can adequately block-code, and form an RS frame.

More specifically, SCBN1 may be combined with SCBN2 to form RS frame 0, and SCBN3 may be combined with SCBN4 to form RS frame 1.

SCBN1 SCBN2, SCBN3, and SCBN4 may be combined to form RS frame 0, while SCBN5 forms RS frame 1 by itself.

SCBN1 SCBN2, SCBN3, SCBN4 and SCBN5 may form one RS frame.

Besides the above, a block corresponding to existing mobile data may be combined with a block to be newly added (SCBN1 to SCBN5) to form an RS frame.

Figure 48:
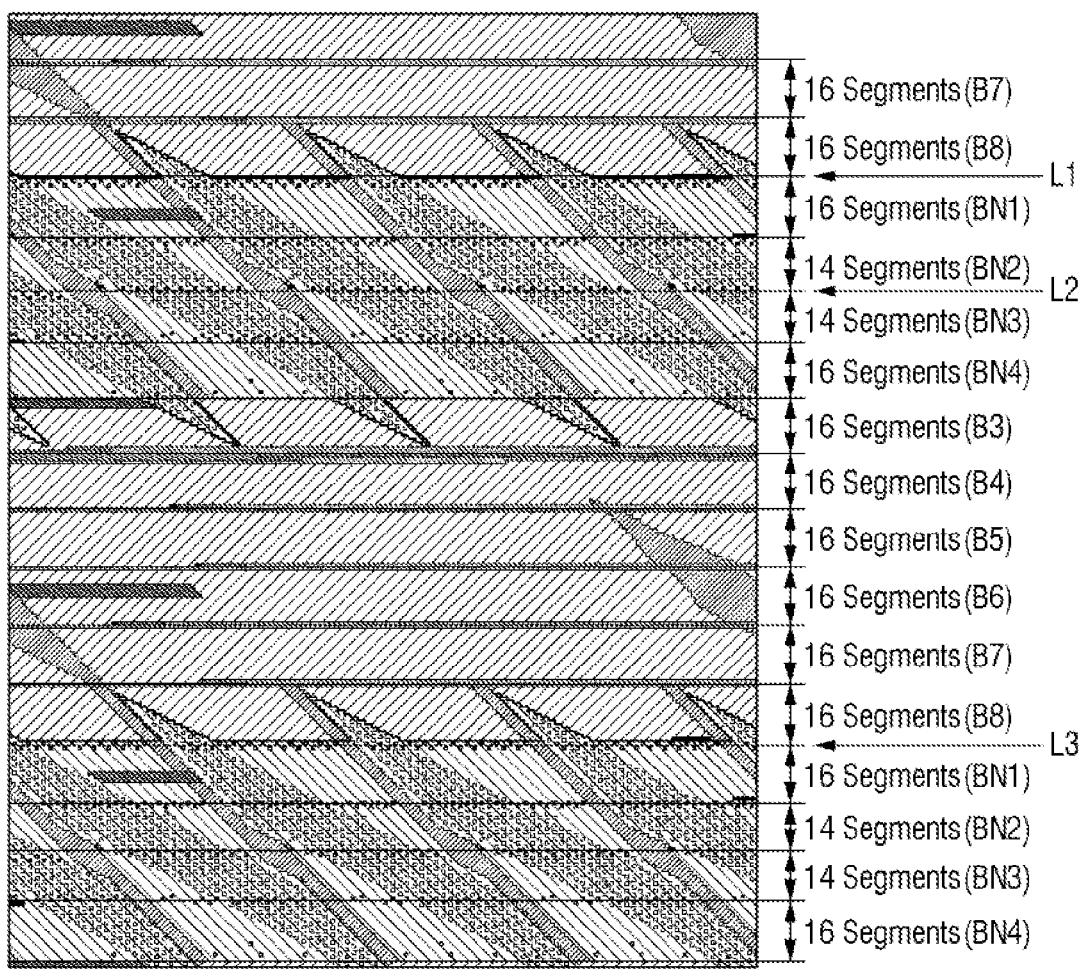
FIG. 48 is a view explaining various exemplary embodiments which define a starting point of an RS frame.

FIG. 48 illustrates various other methods which define a starting point of an RS frame, According to FIG. 48, a transmission stream is divided into a plurality of blocks. In the existing ATSC-MH standard, an RS frame is divided between BN2 and BN3. However, as mobile data and known data are inserted in the normal data region as in the exemplary embodiments, a starting point of an RS frame may be defined differently.

As an example, an RS frame may start based on a boundary between BN1 and B8, a boundary between BN2 and BN3 similarly to the existing ATSC-MH standard, or a boundary between B8 and BN1. The starting point of the RS frame may be determined differently according to a combination state of block coding.

Meanwhile, configuration information about the aforementioned RS frame may be included in a region provided in existing signaling, data or new signaling, data, and be provided to a receiver.

As aforementioned, since new mobile data and new known data are inserted into a region where normal data is originally allocated and into a region where existing mobile data is allocated, various kinds of information needs to be notified to a receiver. To transmit such information, the digital broadcasting transmitter may use a reserve bit in a TPC region of the existing ATSC-MH standard, or newly obtain a signaling data region and transmit new signaling data through this region. Since the newly provided signaling data region needs to be in a same location in all modes, it is located at the head/tail region.

Figure 49:
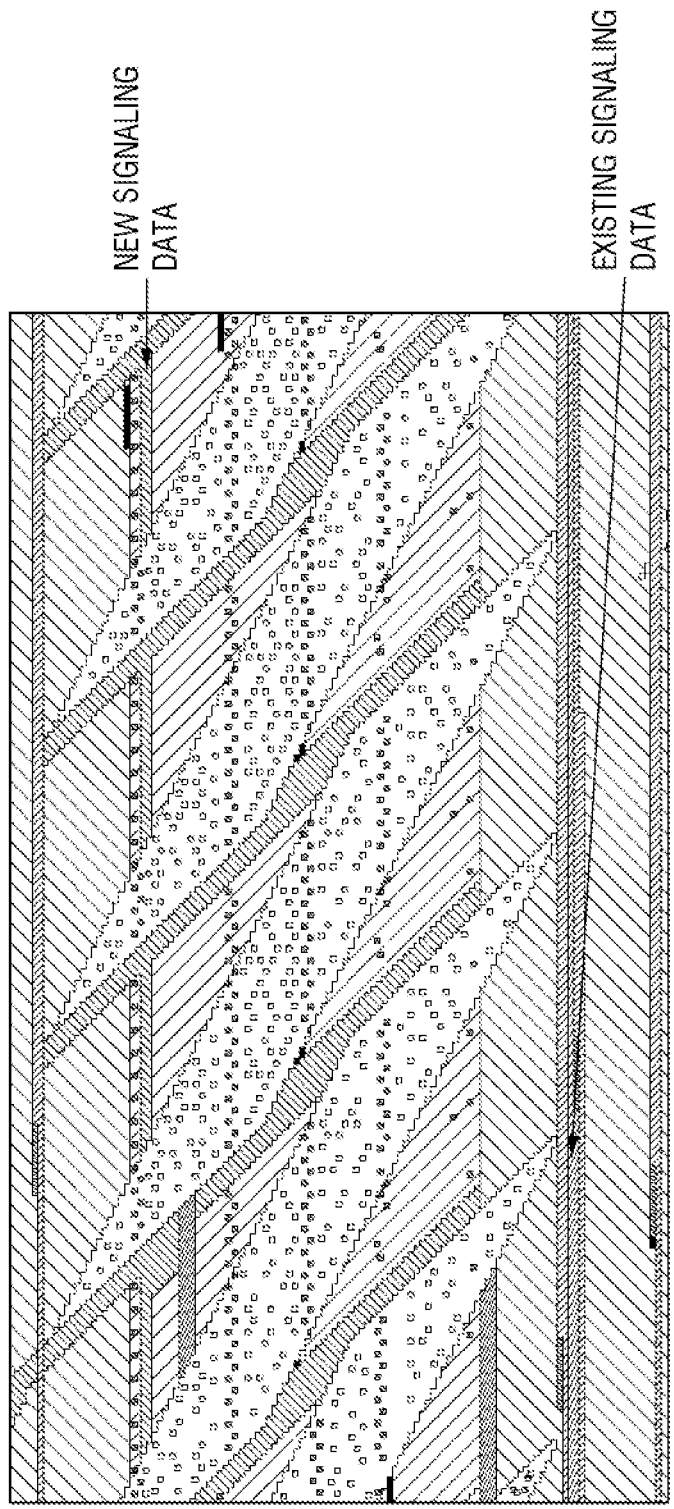
FIG. 49 is a view explaining an inserting location of signaling data.

FIG. 49 is a stream configuration illustrating an existing signaling data arrangement location and a new signaling data arrangement location.

According to FIG. 49, existing signaling data is arranged in a long training sequence in the body region, and new signaling data is arranged in the head/tail region. New signaling data encoded in the signaling encoder 150 is inserted by the group formatter 130 into a preset location as the location illustrated in FIG. 49.

Meanwhile, the signaling encoder 150 may use a code different from a related art signaling encoder or perform coding by a different code rate, improving performance.

That is, a method of using a ⅛ PCCC code in addition to an existing RS code, or a method of using an RS+¼ PCCC code while sending the same data twice to obtain the same effect as the previous method may be used.

Meanwhile, as aforementioned, since known data is included in transmission stream, initialization on memories inside a trellis encoder must be performed right before trellis encoding is performed on the known data.

In a case where a long training sequence is provided as in mode 4 (the fourth mode), it is possible to process a corresponding sequence by one initialization. However, there is difficulty in a case where known data is arranged discontinuously as in the other modes because initialization must be performed many times. In addition, when memories are initialized to "0" by initialization, it becomes difficult to make a symbol as mode 4.

Considering the above, in order to be able to make a symbol which is to mode 4 as much as possible even in mode 1 to mode 3, trellis encoder memory values (that is, register values) in mode 4 at the same location may be loaded to a trellis encoder without a trellis reset. To this end, the memory stored values of a trellis encoder in mode 4 may be stored in table formats, and trellis encoding may be performed by a location value corresponding to the stored values. Otherwise, an additional trellis encoder which operates in a mode 4 method may be provided to utilize a value obtained in this additional trellis encoder.

As aforementioned, the normal data region and the existing mobile data region in a transmission stream may be efficiently used to provide mobile data services in various methods. Accordingly, a stream which is more suitable to mobile data transmission may be generated, compared to the existing ATSC-MH standard.

[Signaling]

Meanwhile, as new mobile data and new known data are added to transmission stream as aforementioned, there needs to be a technology for notifying a receiver so that these data can be processed. Notifying may be made in various methods.

A data field sync (also referred to as a field sync) used for existing mobile data may be used to notify existence of new mobile data.

Figure 50:
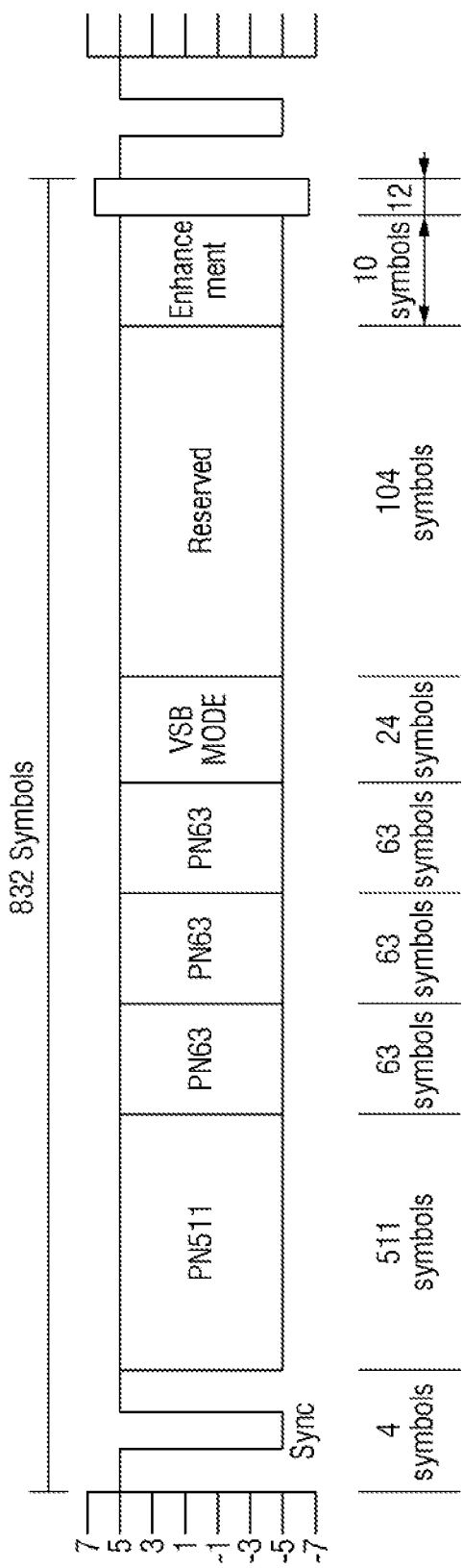
FIG. 50 is a view illustrating an example of a data field sync configuration for transmitting signaling data.

FIG. 50 illustrates an example of a configuration of a data field sync. According to FIG. 50, the data field sync consists of a total of 832 symbols, of which 104 symbols correspond to a reserve region. In the reserve region, the 83th to the 92nd symbols, that is, a total of 10 symbols, correspond to an enhancement region.

In a case where only 1.0 version data is included, in an odd number data field, the 85th symbol is set to +5, while the remaining symbols in the 10 symbols are set to −5. In an even number data field, the symbol of the odd number data field becomes the opposite.

Meanwhile, when 1.1 version data is included, in an odd number data field, the 85th and 86th symbols are set to +5, while the remaining symbols in the 10 symbols are set to −5. That is, whether or not 1.1 version data is included in a stream may be notified by using the 86th symbol.

Meanwhile, whether or not 1.1 version data is included may be notified, by other symbols in the enhancement region. That is, by setting one or a plurality of symbols except the 85th symbol to +5 or another value, whether or not 1.1 version data is included in a stream may be notified. For example, the 87th symbol may be used.

The data field sync may be created by the controller 310 in FIG. 3, the signaling encoder 150 in FIG. 4, or an additionally provided field sync generator not shown), and be provided to the sync multiplexer 470 in FIG. 4, thereby multiplexing a stream by the sync multiplexer 470.

As a second method, whether or not 1.1 version data exists may be notified by using a TPC. A TPC may use a syntax as in the following table.

TABLE 1

| Syntax | No. of Bits | Format |
|---|---|---|
| TPC_data { | | |
|     sub-frame_number | 3 | uimsbf |
|     slot_number | 4 | uimsbf |
|     parade_id | 7 | uimsbf |
|     starting_group_number | 4 | uimsbf |
|     number_of_groups_minus_1 | 3 | uimsbf |
|     parade_repetition_cycle_minus_1 | 3 | uimsbf |
|     rs_frame_mode | 2 | bslbf |
|     rs_code_mode_primary | 2 | bslbf |
|     rs_code_mode_secondary | 2 | bslbf |
|     sccc_block_mode | 2 | bslbf |
|     sccc_outer_code_mode_a | 2 | bslbf |
|     sccc_outer_code_mode_b | 2 | bslbf |
|     sccc_outer_code_mode_c | 2 | bslbf |
|     sccc_outer_code_mode_d | 2 | bslbf |
|     fic_version | 5 | uimsbf |
|     parade_continuity_counter | 4 | uimsbf |
|     total_number_of_groups | 5 | uimsbf |
|     reserved | 21 | bslbf |
|     tpc_protocol_version | 5 | bslbf |
| } | | |

As in Table 1, there is a reserved region in TPC information. Therefore, it is possible to signal, using a bit or a plurality of bits of the reserved area, whether or not new mobile data is included in packets allocated to normal data, that is the second region, us location, whether or not new known data is added, and an additional location of the new known data, etc.

Information being inserted can be expressed as in the following table 2.

TABLE 2

| Necessary field | Bits (changeable) |
|---|---|
| 1.1 frame mode | 3 |
| 1.1 mobile mode | 2 |
| 1.1 SCCC block mode | 2 |
| 1.1 SCCCBM1 | 2 |
| 1.1 SCCCBM2 | 2 |
| 1.1 SCCCBM3 | 2 |
| 1.1 SCCCBM4 | 2 |
| 1.1 SCCCBM5 | 2 |

In Table 2, the 1.1 frame mode is information which indicates whether packets allocated to normal data is used for normal data, or for new mobile data, that is, for 1.1 version data.

The 1.1 mobile mode is information which indicates in which pattern mobile data is arranged in packets allocated to normal data. That is, one of the four modes as the aforementioned may be indicated, by writing one of "00", "01", "10", and "11" using two bits. Accordingly, a stream may be arranged in various formats as in FIGS. 29, 31, 33, 35, 37, 38, 39, and 40, and a receiver may check mode information, and check an arrangement location of mobile data.

The 1.1 SCCC block mode is information illustrating a block mode regarding 1.1 version data. Besides this, 1.1 SCCCBM1 to 1.1 SCCCBM5 are information illustrating coding units of 1.1 version data.

Besides the information indicated in Table 2, various information which enables a receive adequately detect and decode new mobile data may be added, and the number of bits allocated to each information may be changed when necessary. In addition, the location of each field may be arranged in a different order from Table 2 as well.

Meanwhile, it is possible to notify through FIC information so that a receiver which receives a stream including new mobile data could perceive whether or not new mobile data is included.

That is, a receiver for 1.1 version use which receives and processes new mobile data should be able to process 1.0 version data and 1.1 version data, whereas a receiver for 1.0 version use should be able to disregard 1.1 version data.

Accordingly, an existing FIC segment syntax may be changed to obtain a region for notifying whether or not 1.1 version data is included, in a stream.

An existing FIC segment syntax can be configured as in the following table.

TABLE 3

| Syntax | No. of Bits | Format |
|---|---|---|
| FIC_segment_header( ) { | | |
|   FIC_segment_type | 2 | uimsbf |
|   reserved | 2 | '11' |
|   FIC_chunk_major_protocol_version | 2 | uimsbf |
|   current_next_indicator | 1 | bslbf |
|   error_indicator | 1 | bslbf |
|   FIC_segment_num | 4 | uimsbf |
|   FIC_last_segment_num | 4 | uimsbf |
| } | | |

An FIC segment as in Table 3 may be changed as in the following table so that it could notify whether or not there is data for 1.1 version use.

TABLE 4

| Syntax | No. of Bits | Format |
|---|---|---|
| FIC_segment_header( ) { | | |
|   FIC_segment_type | 2 | uimsbf |
|   current_next_indicator | 1 | bslbf |
|   error_indicator | 1 | bslbf |
|   FIC_chunk_major_protocol_version | 2 | uimsbf |
|   FIC_segment_num | 5 | uimsbf |
|   FIC_last_segment_num | 5 | uimsbf |
| } | | |

According to Table 4, instead of the reserved region, FIC_segment_num and FIC_last_segment_num are expanded to five bits, respectively.

In Table 4, by adding "01" to the value of the FIC_segment_type, it is possible to notify whether or not there is data for 1.1 version use. That is, if the FIC_segment_type is set to "01", a receiver for 1.1 version use may decode the FIC information, and process 1.1 version data. In this case, a receiver for 1.0 version use cannot detect the FIC information. On the contrary, when the FIC_segment_type is defined as "00" or a null segment, the receiver for 1.0 version use decides the FIC information, and processes existing mobile data.

Meanwhile, instead of changing the existing FIC syntax, it is possible to notify whether or not there is data for 1.1 version use by using a portion of its region, that is, a reserved region, while maintaining the syntax of FIC chunk.

In a case where the FIC forms a maximum FIC chunk, a maximum of 16 bits may be formed. It is possible to change a portion of the syntax forming, the FIC chunk to illustrate a state of data for 1.1 version use.

More specifically, as in the following table, it is possible to add "MH 1.1 service_status" to the reserve region among the service ensemble loop.

TABLE 5

| Syntax | No. of Bits | Format |
|---|---|---|
| FIC_chunk_payload( ){ | | |
|   for(i=0; i<num_ensembles; i++){ | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++){ | | |
|       MH_service_id | 16 | uimsbf |
|       MH1.1_service_status | 2 | uimsbf |
|       reserved | 1 | '1' |
|       multi_ensemble_service | 2 | uimsbf |
|       MH_service_status | 2 | uimsbf |
|       SP_indicator | 1 | bslbf |
|     } | | |
|   } | | |
|   FIC_chunk_stuffing( ) | | var |
| } | | |

According to Table 5, two bits among three bits in the reserved region may be used to indicate an MH 1.1_service_status. The MH 1.1_service_status may be data which indicates whether or not there is 1.1 version data in a stream.

Besides the MH 1.1_service_status, an MH 1.1_ensemble_indicator may be added. That is, the syntax of the FIC chunk may be formed as follows.

TABLE 6

| Syntax | No. of Bits | Format |
|---|---|---|
| FIC_chunk_payload( ){ | | |
|   for(i=0; i<num_ensembles; i++){ | | |
|     ensemble_id | 8 | uimsbf |
|     MH1.1_ensemble_indicator | 1 | bslbf |
|     reserved | 2 | '11' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++){ | | |
|       MH_service_id | 16 | uimsbf |
|       MH1.1_service_status_extension | 2 | uimsbf |
|     reserved | | '1' |
|       multi_ensemble_service | 2 | uimsbf |
|       MH_service_status | 2 | uimsbf |
|       SP_indicator | 1 | bslbf |
|     } | | |
|   } | | |
|   FIC_chunk_stuffing( ) | | var |
| } | | |

According to Table 6, one bit among three bits in the first reserved region is allocated to an MH 1.1_ensemble_indicator. The MH 1.1_ensemble_indicator refers to information on an ensemble which is a service unit of 1.1 version data. In Table 6, two bits among three bits of the second reserved region may be used to indicate an MH 1.1_service_status_extension.

In a case of a service for 1.1 version use, an ensemble protocol version may be changed as in Table 7 below to use a value allocated to a reserved of the 1.0 version to indicate the 1.1 version.

TABLE 7

| Syntax | No. of Bits | Format |
|---|---|---|
| FIC_chunk_payload( ){ | | |
|   for(i=0; i<num_ensembles; i++){ | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++){ | | |
|       MH_service_id | 16 | uimsbf |
|       reserved | 3 | '111' |
|       multi_ensemble_service | 2 | uimsbf |
|       MH_service_status | 2 | uimsbf |
|       SP_indicator | 1 | bslbf |
|     } | | |
|   } | | |
|   FIC_chunk_stuffing( ) | | var |
| } | | |

As in Table 8, signaling data may be transmitted by changing the ensemble loop header extension length among the syntax field of the FIC chunk, adding an ensemble extension to the syntax field of the FIC chunk payload, and adding an MH 1.1_service_to the service loop reserved three bits among the syntax of the FIC chunk payload.

TABLE 8

| Syntax | No. of Bits | Format |
|---|---|---|
| FIC_chunk_payload( ){ | | |
|   for(i=0; i<num_ensembles; i++){ | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     reserved | 3 | uimsbf |
|     ensemble_extension | 5 | |
|     num_MH_services | 8 | uimsbf |
|     for (j=0; j<num_MH_services; j++){ | | |
|       MH_service_id | 16 | uimsbf |
|       MH_service_status_extention | 2 | |
|   reserved | 1 | |
|       reserved | 3 | '111' |
|       multi_ensemble_service | 2 | uimsbf |
|       MH_service_status | 2 | uimsbf |
|       SP_indicator | 1 | bslbf |
|     } | | |
|   } | | |
|   FIC_chunk_stuffing( ) | | var |
| } | | |

As in Table 9 below, an MH_service_loop_extension_length of the syntax field of the FIC chunk header may be changed, and an information field regarding an MH 1.1_service status may be added to the payload field of the FIC chunk.

TABLE 9

| Syntax | No. of Bits | Format |
|---|---|---|
| FIC_chunk_payload( ){ | | |
|   for(i=0; i<num_ensembles; i++){ | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++){ | | |
|       MH_service_id | 16 | uimsbf |
|       reserved | 3 | '111' |
|       multi_ensemble_service | 2 | uimsbf |
|       MH_service_status | 2 | uimsbf |
|       SP_indicator | 1 | bslbf |
|       reserved | 5 | uimsbf |
|       MH1.1_Detailed_service_Info | 3 | uimsbf |
|     } | | |
|   } | | |
|   FIC_chunk_stuffing( ) | | var |
| } | | |

As aforementioned, signaling data may be provided to a receiver using various regions such as a field sink, TPC information, and FIC information.

Meanwhile, signaling data may be inserted into a region other than these regions. That is, signaling data may be inserted into a packet payload portion of existing data. In this case, it is possible to configure a stream such that the FIC information records existence of 1.1 version data or a location at which signaling data can be identified, and signaling data for 1.1 version use is additionally provided, so that this signaling data can be detected and used by a receiver for 1.1 version data.

In addition, such signaling data may be formed as an additional stream, and be transmitted to a receiver using an additional channel other than the stream transmitting channel.

In addition, it is obvious that signaling data may include other information that can signal at least one of various information such as whether or not existing or new mobile data is included, allocation of such mobile data, whether or not known data is added, an additional location of the known data, an arrangement pattern of mobile data and known data, a block mode, and a coding unit.

As discussed thus far, a digital broadcasting transmitter which uses signaling data may be embodied to include a data preprocessor which arranges at least one of mobile data and known data at least a portion of a normal data region of entire packets of a stream, and a multiplexer which generates a transmission stream which includes mobile data and signaling data. A detailed configuration of the data preprocessor may be embodied as one of the aforementioned various exemplary embodiments. Some elements may be omitted, added or changed. Especially, the signaling data is provided by a signaling encoder, a controller, or a field sync generator, and may be inserted into the transmission stream by a multiplexer or a sync multiplexer. In this case, the signaling data is data for notifying at least one of whether or not mobile data is arranged and an arrangement pattern, and may be embodied as a data field sync, TPC information or FIC information.

[Digital Broadcasting Receiver]

As aforementioned, the digital broadcasting transmitter may transmit a transmission stream which includes new mobile data arranged in a portion or the entirety of packets allocated to normal data of an existing stream configuration, and a portion of the entirety of packets allocated to existing mobile data.

A digital broadcasting receiver which receives this transmission stream may receive at least one of existing mobile data, normal data, and new mobile data.

When streams of the aforementioned various structures are received, a digital broadcasting receiver for processing only existing normal data checks signaling data, and detects and decodes normal data. As aforementioned, in a case where a stream is formed by a mode which does not include normal data at all, this receiver is not able to receive and process the stream.

When a stream of the aforementioned various structures is received, a digital broadcasting receiver for 1.0 version use may check signaling data, and detect and decode existing mobile data. If mobile data for 1.1 version use is arranged in the entire regions, this receiver for 1.0 version use may not be able to receive and process the 1.1 version data.

On the other hand, a digital broadcasting receiver for 1.1 version use may not only detect and process the data for 1.1 version use but also the data for 1.0 version use. In this case, if there is a decoding block for processing normal data, this receiver may also receive and process normal data.

Figure 51:
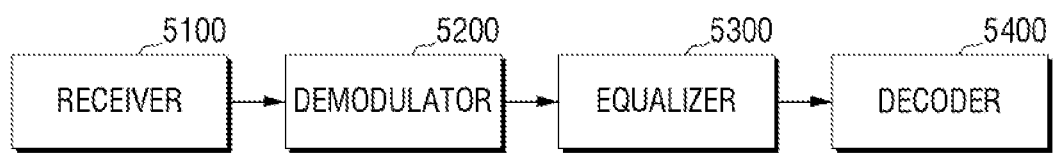
FIGS. 51 to 53 are views illustrating a configuration of a digital broadcasting receiver according to various exemplary embodiments.

FIG. 51 is a block diagram illustrating an example of a configuration of a digital broadcasting receiver according to an exemplary embodiment. In this digital broadcasting receiver, many elements correspond to the configuration of various digital broadcasting transmitters of FIGS. 2 to 4, and are arranged in a corresponding manner. For convenience of explanation, FIG. 51 only illustrates elements necessary for receiving.

According to FIG. 51, the digital broadcasting receiver includes a receiver 5100, a demodulator 5200, an equalizer 5300, and a decoder 5400.

The receiver 5100 receives a transmission stream transmitted from a digital broadcasting transmitter through an antenna, a cable, etc.

The demodulator 5200 demodulates the transmission stream received through the receiver 5100. A frequency, a clock signal, etc. of the signal received through the receiver 5100 are synchronized with the digital broadcasting transmitter as they pass the demodulator 5200.

The equalizer 5300 equalizes the demodulated transmission stream.

The demodulator 5200 and the equalizer 5300 may perform synchronization and equalization more quickly using known data included in the transmission stream, especially known data added together with mobile data.

The decoder 5400 detects mobile data in the equalized stream, and decodes the detected mobile data.

Inserting a location and a size of mobile data and known data may be notified by signaling data included in the transmission stream or signaling data received through an additional channel.

The decoder 5400 checks the location of mobile data suitable to the digital broadcasting receiver using signaling data, and detects mobile data at that location, and decodes the detected mobile data.

The decoder 5400 may be embodied in various ways according to exemplary embodiments.

That is, the decoder 5400 may include two decoders such as a trellis decoder (not illustrated) and a convolution decoder (not illustrated). These two decoders my perform exchanging of mutual decoding reliability information, improving performance. An output of the convolution decoder may be the same as an input of the RS encoder of the transmitter.

Figure 52:
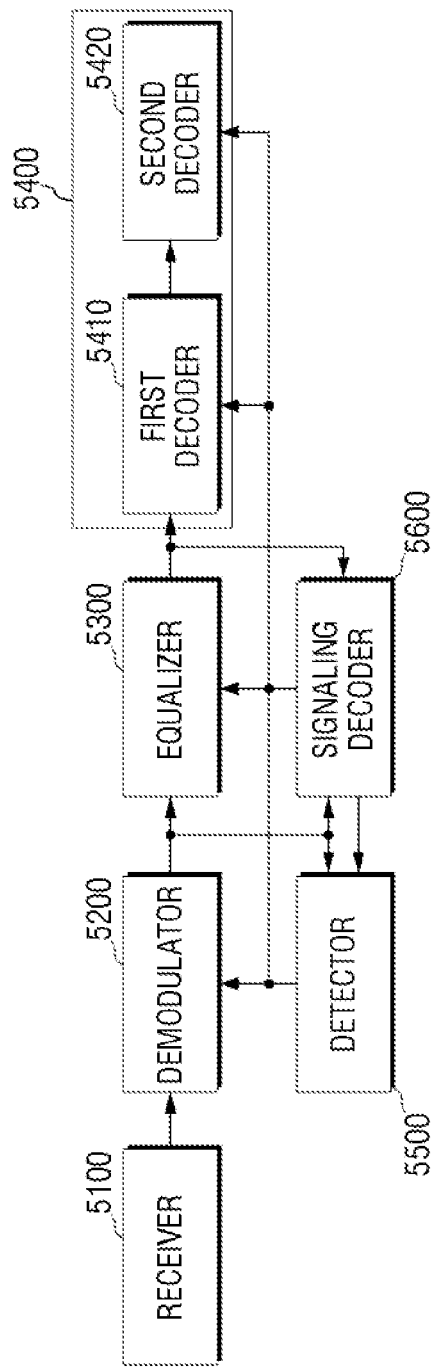

FIG. 52 is a block diagram of an example of a detailed configuration of a digital broadcasting receiver, according to an exemplary embodiment.

According to FIG. 52, the digital broadcasting receiver may include a receiver 5100, a demodulator 5200, an equalizer 5300, a decoder 5400, a detector 5500, and a signaling decoder 5600.

Functions of the receiver 5100, the demodulator 5200, and the equalizer 5300 are the same as FIG. 51, and thus a further explanation is omitted.

The decoder 5400 may include a first decoder 5410 and a second decoder 5420.

The first decoder 5410 performs decoding on at least one of existing mobile data and new mobile data. The first decoder 5410 may perform SCCC decoding which is decoding in block units.

The second decoder 5420 performs RS decoding on the stream decoded in the first decoder 5410.

The first and second decoders 5410, 5420 may process mobile data using an output value of the signaling decoder 5600.

That is, the signaling decoder 5600 may detect and decode signaling data included the stream. More specifically, the signaling decoder 5600 demultiplexes a reserved region, a TPC information region, an FIC information region, etc. in a field sync from the transmission stream. Accordingly, it is possible to convolutionally decode and RS decode the demultiplexed portion, derandomize it, and then restore the signaling data. The restored signaling data is provided to elements of the digital broadcasting receiver, that is, the demodulator 5200, the equalizer 5300, the decoder 5400, and the detector 5500. The signaling data may include various information that are used by these configurations, that is, block mode information, mode information, known data insertion pattern information, and a frame mode, etc. The types and functions of these information were described in detail earlier, and thus, is omitted hereinafter.

Various information such as a coding rate of mobile data, a data rate, a inserting location, a type of an error correction code, information of a primary service, information necessary for supporting time slicing, description on mobile data, information relevant to changing mode information, information for supporting an Internet protocol (IP) service may be provided to the receiver in formats of signaling data or other additional data.

In describing the configuration of the receiver in reference to FIG. 52, it is assumed that signaling; data is included in the stream. If, however, a signaling data signal is transmitted through an additionally provided channel, the signaling decoder 5600 may decode such a signaling data signal and provide the aforementioned information.

The detector 5500 detects known data in the stream using known data insertion pattern information provided in the signaling decoder 5600. In this case, besides new known data added together with new mobile data, known data added together with existing mobile data may be processed as well.

More specifically, as illustrated in FIGS. 22 to 36, known data may be inserted into at least one region among a body region and a head/tail region of mobile data, in various locations and various formats. Information on the insertion pattern of known data, that is, a location, a starting point, and a length, may be included in signaling data. The detector 5500 may detect known data at an adequate location according to the signaling data, and provide it to the demodulator 5200, the equalizer 5300, and the decoder 5400 etc.

Figure 53:
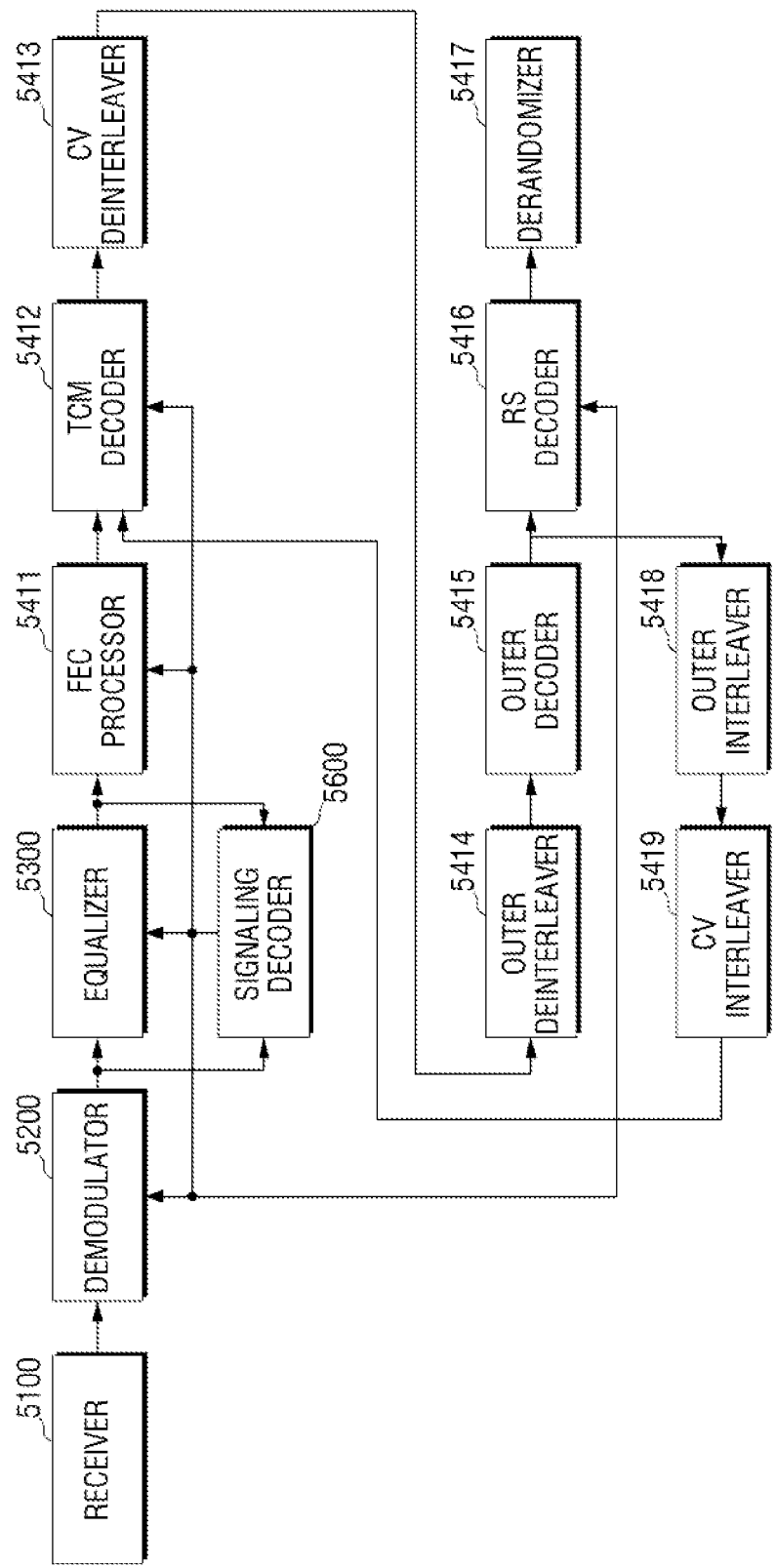

FIG. 53 illustrates an example of a detailed configuration of a broadcasting receiver according to another exemplary embodiment.

According to FIG. 53, the digital broadcasting receiver includes a receiver 5100, a demodulator 5200, an equalizer 5300, an FIC processor 5411, a trellis coded modulation (TCM) decoder 5412, a convolutional (CV) deinterleaver 5412, an outer deinterleaver 5414, an outer decoder 5415, an RS decoder 5416, a derandomizer 5417, an outer interleaver 5418, a CV interleaver 5419, and a signaling decoder 5600.

The receiver 5100, the demodulator 5200, the equalizer 5300, and the signaling decoder 5600, etc. were explained in FIG. 52, and thus, a repeated explanation is omitted. Unlike in FIG. 52, illustration on the detector 5550 is omitted in FIG. 53. That is, according to this exemplary embodiment, each element may detect known data using signaling data decoded in the signaling decoder 5600.

The FEC processor 5411 performs forward error correction on the transmission stream equalized in the equalizer 5300. The FEC processer 5411 may use information on a location or an insertion pattern of known data provided in the signaling decoder 5600, to detect the known data in the transmission stream and use it in the forward error correction. The known data (also referred to as a supplemental reference signal (SRS)) may not be used in the forward error correction, according to an exemplary embodiment.

In FIG. 53, decoding on mobile data is performed after FEC processing is made. That is, FEC processing; is made on the entire transmission stream. However, after only mobile data is detected from the transmission stream, FIC is performed on that mobile data only, according to an exemplary embodiment.

The TCM decoder 5412 detects mobile data from the transmission stream output from the FEC processer 5411, and performs trellis decoding. In this case, if it is a state where mobile data has already been detected from the FEC processer 5411 and forward error correction has been done only on that portion, the TCM decoder 5412 may perform trellis decoding on the input data right away.

The CV interleaver 5413 performs convolution interleaving on the trellis decoded data. As aforementioned, the configuration of the digital broadcasting receiver corresponds to the configuration of the digital broadcasting transmitter which configured and processed the transmission stream, and thus, the CV deinterleaver 5413 may not be necessary according to the structure of the transmitter.

The outer deinterleaver 5414 performs outer deinterleaving on the convolution deinterleaved data. Then, the outer decoder 5415 performs decoding, to remove the parity added to the mobile data.

Meanwhile, according to circumstances, the process from the TCM decoder 5412 to the outer decoder 5415 may be performed repeatedly more than once, to improve reception performance of the mobile data. For repeated performing of the process, the decoded data from the outer decoder 5415 may be provided by an input the TCM decoder 5412 through the outer interleaver 5418 and the CV interleaver 5419. Herein, the CV interleaver 5419 may not be needed depending on the structure of the transmitter.

As such, the trellis decoded data is provided to the RS decoder 5416. The RS decoder 5416 may decode the provided data, and the derandomizer 5417 may perform derandomization. Through this process, the stream regarding the mobile data, especially, 1.1 version data may be processed.

Meanwhile, as aforementioned, in a case where the digital broadcasting receiver is for 1.1 version use, 1.0 version data besides the 1.1 version data may be processed together.

That is, at least one of the FEC processor 5411 and TCM decoder 5412 may detect the entire mobile data except normal data, and perform processing thereon.

In addition, in a case where the digital broadcasting receiver is a public use receiver, it may be provided with all of a block for processing normal data, a block for 1.0 version data processing, and a block for 1.1 version data processing. In this case, a plurality of processing routes may be provided at a rear end of the equalizer 5300, each of the aforementioned blocks may be arranged in each processing route, and data suitable for the transmission stream may be included by selecting at least one processing route according to a control of a controller (not illustrated) additionally provided.

In addition, as aforementioned, in the transmission stream, mobile data may be arranged in a different pattern for each slot. That is, various slots such as a first slot where normal data is included, a second slot where new mobile data is included in an entire normal data region, a third slot where new mobile data is included in a portion of the normal data region, and a fourth slot where new mobile data is included in the normal data region and an existing mobile data region may be configured repeatedly according to a preset pattern.

The signaling decoder 5600 decodes signaling data, and notifies information such as frame mode information or mode information to each element. Therefore, each element, especially, the FEC processor 5411 or the TCM decoder 5412 detects mobile data in a determined location regarding each slot and processes the detected mobile data.

FIGS. 51 to 53 omitted illustration on a controller, but a controller which provides an adequate control signal to each block using the decoded signaling data may be further included. Such a controller may control tuning operations of the receiver 5100 at a user's choice.

The receiver for 1.1 version use may selectively provide 1.1 version data or 1.1 version data at a user's choice. In addition, if a plurality of 1.1 version services are provided, one of these services may be provided at a user's choice.

The digital broadcasting receiver in FIGS. 51 to 53 may be embodied as a set-top box or a TV, but it may also be embodied as various types of devices that are portable such as a mobile phone, a PDA, an MP3 player, an electronic dictionary, and a notebook computer. In addition, although not illustrated in FIGS. 51 to 53, it may also include elements that scale or convert the decoding result data adequately and output on a screen in formats of sound and image data.

Meanwhile, a method of composing a stream of the digital broadcasting transmitter and a method for processing a stream of the digital broadcasting receiver according to exemplary embodiments may be explained using the aforementioned block diagram and stream configuration chart.

That is, the method of composing the stream of the digital broadcasting transmitter may include a step of arranging mobile data in at least one portion of packets allocated to normal data of among entire packets composing the stream, and at multiplexing step of inserting normal data into the stream where mobile data is arranged and composing the transmission stream.

The step of arranging the mobile data may be performed by the data preprocessor 100 illustrated in FIGS. 2 to 4.

Mobile data may be arranged in various locations by itself or together with normal data and existing mobile data as in the aforementioned various exemplary embodiments. That is, mobile data and known data may be arranged in various methods as in FIGS. 15 to 40.

In addition, the multiplexing step multiplexes normal data which has been separately processed from mobile data together with mobile data, and compose a transmission stream.

After receiving various processing procedures such as RS encoding, trellis encoding, sync multiplexing, and demodulating, the composed transmission stream is transmitted to the receiver. Processing of the transmission stream may be performed by various elements of the digital broadcasting transmitter illustrated in FIG. 4.

The various exemplary embodiments of the method of composing a stream are related to various operations of the aforementioned digital broadcasting transmitter. Therefore, an illustration of a flowchart of the stream composing method is omitted.

Meanwhile, a stream processing method of the digital broadcasting receiver according to an exemplary embodiment is divided into a first region which is allocated to existing mobile data, and a second region which is allocated to normal data, and in at least one portion of the second region, a receiving step of receiving a transmission stream where mobile data is arranged separately from existing mobile data, a demodulating step of demodulating the received transmission stream, an equalizing step of equalizing the demodulated transmission stream, and a decoding step of decoding at least one of existing mobile data and new mobile data from the equalized transmission stream may be included.

The transmission stream received in this method may be one that has been composed and transmitted in the digital broadcasting transmitter according to the aforementioned various exemplary embodiments. That is, the transmission stream may be in formats where the mobile data is arranged in various ways as in FIGS. 15 to 21 and FIGS. 29 to 40. In addition, known data may also be arranged in various formats as illustrated in FIGS. 22 to 28.

The various exemplary embodiments regarding the stream processing method relate to various exemplary embodiments of the aforementioned digital broadcasting receiver. Therefore, an illustration on a flowchart of the stream processing method is also omitted.

Meanwhile, the various examples of configurations of various streams illustrated in FIGS. 15 to 40 are not limited to one configuration, but may be switched to different configurations according to circumstances. That is, the data preprocessor 100 may apply various frame modes, modes, and block modes, etc. and arrange mobile data and known data, and perform block coding by a control signal provided from an additionally provided controller or an externally input control signal. Accordingly, a digital broadcasting provider becomes able to provide data, especially, mobile data in various sizes.

In addition, the aforementioned new mobile data, that is, 1.1 version data may be the same data as the existing mobile data, that is 1.0 version data, or different data input from another source. Accordingly, a user of the digital broadcasting receiver becomes able to view various types of data that the user wants to view.

Other Exemplary Embodiments

Meanwhile, the aforementioned various exemplary embodiments may be changed in various ways.

For example, the block processor 140 in FIG. 4 may adequately combine existing mobile data arranged in the stream with normal data, new mobile data, and new known data and perform block coding. Herein, new mobile data and new known data may be arranged in not only at least a portion of a normal data region allocated to normal data, but also in at least a portion of existing mobile data region allocated to existing mobile data. That is, it may be in a state where normal data, new mobile data, and existing mobile data are all included.

Figure 54:
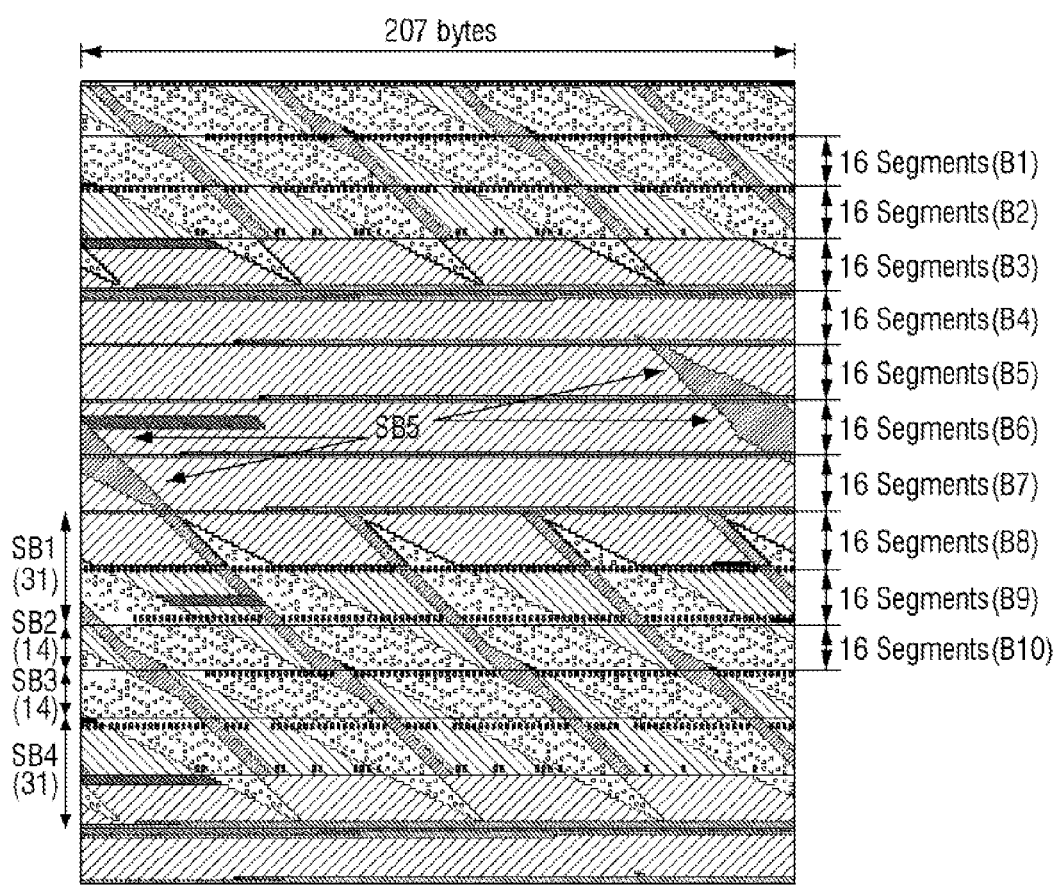
FIG. 54 is an example of a stream format after interleaving.

FIG. 54 is an example of a stream format after interleaving. According to FIG. 54, the stream which includes a mobile data group consists of 208 data segments. Of these segments, the first five segments correspond to RS parity data and are excluded from the mobile data group. Accordingly, the mobile dam group of a total of 203 data segments is divided into 15 mobile data blocks. More specifically, it includes blocks B1 to B10 and SB1 to SB5. Of these, blocks B1 to B10 may correspond to mobile data arranged in an existing mobile data region as illustrated in FIG. 8. On the other hand, blocks SB1 to SB5 may correspond to new mobile data arranged in a normal data region. SB5 includes an MPEG header and an RS parity for backward compatibility.

Each of B1 to B10 may consist of 16 segments, each of SB1 and SB4 may consist of 31 segments, and each of SB2 and SB3 may consist of 14 segments.

These blocks, that is B1 to B10 and SB1 to SB5 may be combined in various formats and be block-encoded.

That is, as aforementioned, a block mode may be set in various ways such as "00", "01", etc. Each SCB block when the block mode is set as "00" and an SCCC output block length (SOBL) and an SCCC input block length (SIBL) regarding each SCB block are as follows:

TABLE 10

| SCCC Block | SOBL | SIBL | |
|---|---|---|---|
| | | ½ rate | ¼ rate |
| SCB1 (B1) | 528 | 264 | 132 |
| SCB2 (B2) | 1536 | 768 | 384 |
| SCB3 (B3) | 2376 | 1188 | 594 |
| SCB4 (B4) | 2388 | 1194 | 597 |
| SCB5 (B5) | 2772 | 1386 | 693 |
| SCB6 (B6) | 2472 | 1236 | 618 |
| SCB7 (B7) | 2772 | 1386 | 693 |
| SCB8 (B8) | 2508 | 1254 | 627 |
| SCB9 (B9) | 1416 | 708 | 354 |
| SCB10 (B10) | 480 | 240 | 120 |

According to table 10, B1 to B10 become SCB1 to SCB10.

Meanwhile, each SCB block when the block mode is set to "01", and SOBL and SIBL regarding each SCB block are as follows:

TABLE 11

| SCCC Block | SOBL | SIBL ½ rate | SIBL ¼ rate |
|---|---|---|---|
| SCB1 (B1 + B6) | 3000 | 1500 | 750 |
| SCB2 (B2 + B7) | 4308 | 2154 | 1077 |
| SCB3 (B3 + B8) | 4884 | 2442 | 1221 |
| SCB4 (B4 + B9) | 3804 | 1902 | 951 |
| SCB5 (B5 + B10) | 3252 | 1626 | 813 |

According to Table 11, B1 and B6 are combined to form one SCB1, and B2 and B7, B3 and B8, B4 and B9, and B5 and B10 are combined to form SCB2, SCB3, SCB4, and SCB5, respectively. In addition, the input block length differs according to whether the rate is ½ or ¼.

Meanwhile, combining B1 to B10 and forming an SCB block may be an operation when new mobile data is not arranged, that is, an operation in a core mobile mode (CMM).

In a scalable full channel mobile mode (SFCMM) mode where new mobile data is arranged, each block may be combined differently and form an SCB block. That is, existing mobile data and new mobile data may be combined together, performing a SCCC block coding. Tables 12 and 13 below illustrate examples of blocks that are combined differently according to an RS frame mode and a slot mode.

TABLE 12

| | RS Frame Mode | | | |
|---|---|---|---|---|
| | 00 | | 01 | |
| | SCCC Block Mode | | | |
| | 00 | 01 | 00 | 01 |
| | Description | | | |
| SCB | Separate SCCC Block Mode SCB input, M/H Blocks | Paired SCCC Block Mode SCB input, M/H Blocks | Separate SCCC Block Mode SCB input, M/H Blocks | Paired SCCC Block Mode SCB input, M/H Blocks |
| SCB1 | B1 | B1 + B6 + SB3 | B1 | B1 + SB3 + B9 + SB1 |
| SCB2 | B2 | B2 + B7 + SB4 | B2 | B2 + SB4 + B10 + SB2 |
| SCB3 | B3 | B3 + B8 | B9 + SB1 | |
| SCB4 | B4 | B4 + B9 + SB1 | B10 + SB2 | |
| SCB5 | B5 | B5 + B10 + SB2 | SB3 | |
| SCB6 | B6 | | SB4 | |
| SCB7 | B7 | | | |
| SCB8 | B8 | | | |
| SCB9 | B9 + SB1 | | | |
| SCB10 | B10 + SB2 | | | |
| SCB11 | SB3 | | | |
| SCB12 | SB4 | | | |

In Table 12, the RS frame mode refers to information for notifying whether one ensemble is included in one slot (when the RS frame mode is "00") or a plurality of ensembles such as a primary ensemble and a secondary ensemble are included in one slot (when the RS frame mode is "01"). In addition, the SCCC block mode refers to information notifying whether it is a mode which performs individual SCCC block processing as in the aforementioned block mode or a mode which combines a plurality of blocks and performs SCCC block processing.

Table 12 illustrates the case when the slot mode is "00". The slot mode refers to information which represents a standard which differentiates a start and an end of a slot. That is, the slot mode "00" means refers to a mode where a portion including B1 to B10 and SB1 to SB5 regarding the same slot is divided as one slot, and the slot mode "01" refers to a mode where B1 and B2 are sent to a previous slot, and B1 and B2 of the subsequent slot are included in the current slot, and a portion consisting of a total of 15 blocks is divided as one slot. The slot mode may be changed to other various terms according to the version of the standard document. For example, it may be referred to as a Block extension mode.

According to Table 12, when the RS frame mode is "00" and the SCCC block mode is "00", B1 to B8 are used as SCB1 to SCB8, respectively, B9 and SB1 are combined to form SCB9, B10 and SB2 are also combined to form SCB10, and SB3 and SB4 are used as SCB11 and SCB12, respectively. On the other hand, when the SCCC block mode is "01", B1, B6, and SB3 are combined and used as SCB1, B2+B7+SB4 is used as SCB2, and B3+B8, B4+B9+SB1 and B5+B10+SB2 are used as SCB3, SCB4, and SCB5, respectively.

On the other hand, in a case where the RS frame mode is "01", when the SCCC block mode is "00", B1, B2, B9+SB1, B10+SB2, SB3, and SB4 are used as SCB1 to SCB6, respectively. In addition, when the SCCC block mode is "01", B1+SB3+B9+SB1 is used as SCB1, and B2+SB4+B10+SB2 is used as SCB2.

Besides the above, in a case where the slot mode is "01", and new mobile data is arranged, according to the aforementioned first, second, and third modes, the SCCC block may be combined as in the following table.

TABLE 13

| | RS Frame Mode | | | |
|---|---|---|---|---|
| | 00 | | 01 | |
| | SCCC Block Mode | | | |
| | 00 | 01 | 00 | 01 |
| | Description | | | |
| SCB | Separate SCCC Block Mode SCB input, M/H Blocks | Paired SCCC Block Mode SCB input, M/H Blocks | Separate SCCC Block Mode SCB input, M/H Blocks | Paired SCCC Block Mode SCB input, M/H Blocks |
| SCB1 | B1 + SB3 | B1 + B6 + SB3 | B1 + SB3 | B1 + SB3 + B9 + SB1 |
| SCB2 | B2 + SB4 | B2 + B7 + SB4 | B2 + SB4 | B2 + SB4 + B10 + SB2 |
| SCB3 | B3 | B3 + B8 | B9 + SB1 | |
| SCB4 | B4 | B4 + B9 + SB1 | B10 + SB2 | |
| SCB5 | B5 | B5 + B10 + SB2 | | |
| SCB6 | B6 | | | |
| SCB7 | B7 | | | |
| SCB8 | B8 | | | |
| SCB9 | B9 + SB1 | | | |
| SCB10 | B10 + SB2 | | | |

According to Table 13, B1 to B10 and SB1 to SB5 may be combined in various ways according to a setting state of the SCCC block mode, etc.

Meanwhile, in a case where the slot mode is "01", and new mobile data is arranged in an entire normal data region according to the aforementioned fourth mode, an SCB block may be composed in various combinations as in the following table.

TABLE 14

| | RS Frame Mode | | | |
|---|---|---|---|---|
| | 00 | | 01 | |
| | SCCC Block Mode | | | |
| | 00 | 01 | 00 | 01 |
| | Description | | | |
| SCB | Separate SCCC Block Mode SCB input, M/H Blocks | Paired SCCC Block Mode SCB input, M/H Blocks | Separate SCCC Block Mode SCB input, M/H Blocks | Paired SCCC Block Mode SCB input, M/H Blocks |
| SCB1 | B1 + SB3 | B1 + B6 + SB3 + SB5 | B1 + SB3 | B1 + SB3 + B9 + SB1 |
| SCB2 | B2 + SB4 | B2 + B7 + SB4 | B2 + SB4 | B2 + SB4 + B10 + SB2 |
| SCB3 | B3 | B3 + B8 | B9 + SB1 | |
| SCB4 | B4 | B4 + B9 + SB1 | B10 + SB2 | |
| SCB5 | B5 | B5 + B10 + SB2 | | |
| SCB6 | B6 + SB5 | | | |
| SCB7 | B7 | | | |
| SCB8 | B8 | | | |
| SCB9 | B9 + SB1 | | | |
| SCB10 | B10 + SB2 | | | |

As aforementioned, each of the existing mobile data, normal data, and new mobile data may be divided into blocks, and each block may be combined in various ways to form an SCCC block. Accordingly, formed SCCC blocks are combined to form an RS frame.

The aforementioned combination and coding of blocks may be performed in the data preprocessor 100 illustrated in various exemplary embodiments. More specifically, it is possible to combine the blocks and perform block coding in the block processor 120 in the data preprocessor 100. Explanation on processing besides the combination methods was already made in the aforementioned various exemplary embodiments, repeated explanation is omitted.

Meanwhile, a coding rate of coding the SCCC block, that is an SCCC outer code rate may be determined differently according to the outer code mode. More specific explanation is as in the following table.

TABLE 15

| SCCC outer code mode | Description |
|---|---|
| 00 | The outer code rate of a SCCC Block is ½ rate |
| 01 | The outer code rate of a SCCC Block is ¼ rate |
| 10 | The outer code rate of a SCCC Block is ⅓ rate |
| 11 | Reserved |

As disclosed in Table 15, the SCCC outer code mode may be set in various ways as "00", "01", "10", and "11". When the SCCC outer code mode is "00", SCCC block is coded in a ½ code rate, when the SCCC outer code mode is "01", an SCCC block is coded in a ¼ code rate, when the SCCC outer code mode is 10, an SCCC block is coded in a ⅓ code rate. Such code rates may be changed variously according to the versions of the standard. A newly added code rate may be applied to the SCCC outer code mode "11". Meanwhile, a matching relationship between the aforementioned SCCC outer code modes and the code rates may be changed. The data preprocessor 100 may code an SCCC block in an adequate code rate according to a setting state of an outer code mode. The setting state of the outer code mode may be notified from the controller 310 or other elements, or be confirmed through an additional signaling channel. Meanwhile, the ⅓ code rate receives one bit and outputs three bits, and a format of an encoder may be configured in various ways. For example, it may be configured in a combination of a ½ code rate and a ¼ code rate, and also by puncturing an output of a 4-state convolution encoder.

Meanwhile, information such as the number of added existing or new mobile data packets, or code rates, etc. is signaling information and is transmitted to a receiver.

For example, such signaling information may be transmitted using a reserved region of a TPC. In this case, it is possible to embody "Signaling in Advance" by transmitting information of a current frame in some sub frames, and transmitting information on a next frame in the other sub frames. That is, a predetermined TPC parameter and FIC data may be signaled in advance.

Figure 55:
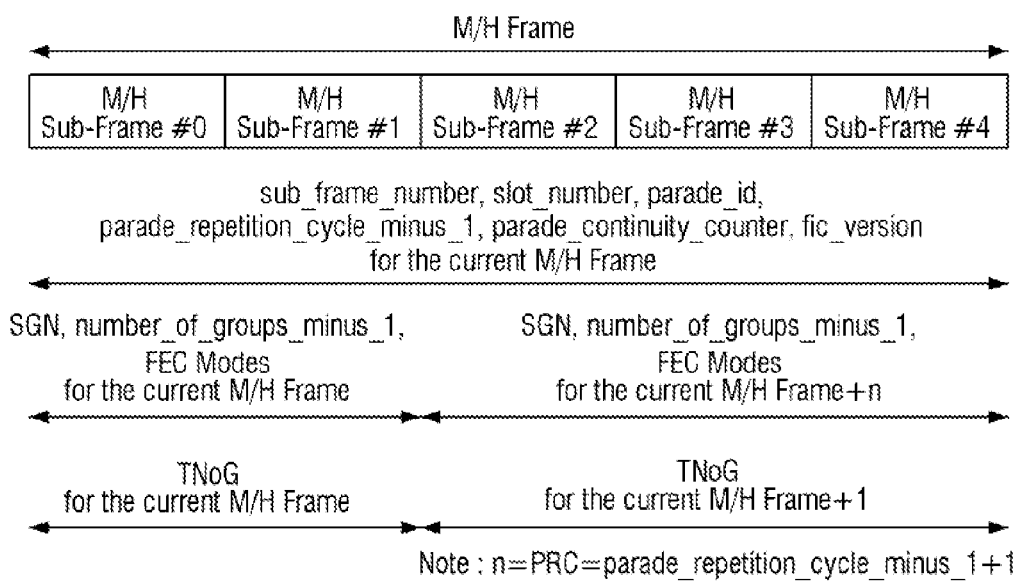
FIG. 55 is a view explaining an example of a method of signaling information on a next frame.

More specifically, as illustrated in FIG. 55, one M/H frame may be divided into five sub-frames: sub_frame_number, slot_number, parade_id, parade_repetition_cycle_minus_1, parade_continuity_counter, and fic_version. In addition, TPC parameters such as added slot modes, etc. as aforementioned may transmit information an a current frame in five sub-frames. Meanwhile. TPC parameters such as SGN, number_of_groups_minus 1, FEC Modes, TNoG, and the number of added existing or new mobile data packets, and a code rate, etc. may be recorded differently according to the number of the sub-frames. That is, in sub-frames #0 and #1, information on the current frame may be transmitted, and in sub-frames #2, #3, and #4, information on the next frame where a parade repetition cycle (PRC) has been considered may be transmitted. In the case of TNoG, in sub-frames #0 and #1, only the information on the current frame may be transmitted, and in sub-frames #2, #3, and #4, both the information on the current frame and the information on the next frame may be transmitted.

More specifically, the TPC information may be configured as in the following table 16,

TABLE 16

| Syntax | No. of Bits | Format |
|---|---|---|
| TPC_data { | | |
|   sub-frame_number | 3 | uimsbf |
|   slot_number | 4 | uimsbf |
|   parade_id | 7 | uimsbf |
|   if(sub-frame_number ≤ 1){ | | |
|     current_starting_group_number | 4 | uimsbf |
|     current_number_of_groups_minus_1 } | 3 | uimsbf |
|   if(sub-frame_number ≥ 2){ | | |
|     next_starting_group_number | 4 | uimsbf |
|     next_number_of_groups_minus_1 } | 3 | uimsbf |
|   parade_repetition_cycle_minus_1 | 3 | uimsbf |
|   if(sub-frame_number ≤ 1){ | | |
|     current_rs_frame_mode | 2 | bslbf |
|     current_rs_code_mode_primary | 2 | bslbf |
|     current_rs_code_mode_secondary | 2 | bslbf |
|     current_sccc_block_mode | 2 | bslbf |
|     current_sccc_outer_code_mode_a | 2 | bslbf |
|     current_sccc_outer_code_mode_b | 2 | bslbf |
|     current_sccc_outer_code_mode_c | 2 | bslbf |
|     current_sccc_outer_code_mode_d } | 2 | bslbf |
|   if(sub-frame_number ≥ 2){ | | |
|     next_rs_frame_mode | 2 | bslbf |
|     next_rs_code_mode_primary | 2 | bslbf |
|     next_rs_code_mode_secondary | 2 | bslbf |
|     next_sccc_block_mode | 2 | bslbf |
|     next_sccc_outer_code_mode_a | 2 | bslbf |
|     next_sccc_outer_code_mode_b | 2 | bslbf |
|     next_sccc_outer_code_mode_c | 2 | bslbf |
|     next_sccc_outer_code_mode_d } | 2 | bslbf |

TABLE 16-continued

| Syntax | No. of Bits | Format |
|---|---|---|
| fic_version | 5 | uimsbf |
| parade_continuity_counter | 4 | uimsbf |
| if(sub-frame_number ≤ 1){ | | |
|     current_TNoG | 5 | uimsbf |
|     reserved } | 5 | bslbf |
| if(sub-frame_number ≥ 2){ | | |
|     next_TNoG | 5 | uimsbf |
|     current_TNoG } | 5 | uimsbf |
| if(sub-frame_number ≤ 1){ | | |
|     current_sccc_outer_code_mode_e | 2 | bslbf |
|     current_scalable_mode } | 2 | uimsbf |
| if(sub-frame_number ≥ 2){ | | |
|     next_sccc_outer_code_mode_e | 2 | bslbf |
|     next_scalable_mode } | 2 | uimsbf |
| slot mode | 2 | uimsbf |
| reserved | 10 | bslbf |
| tpc_protocol_version | 5 | bslbf |
| } | | |

As disclosed in Table 16, in a case where the sub-frame number is 1 or less, that is, in #0 and #1, various information on a current M/H is transmitted, and when the sub-frame number is 2 or more, that is, in #2, #3, and #4, the information on the next frame where the PRC has been considered is transmitted. Accordingly, it becomes able to know the information on the next frame, improving the processing speed.

Meanwhile, the configuration of a receiver may be changed according to such changes in the exemplary embodiments. That is, the receiver may decode data which has been combined in various ways and has been block-coded according to a block mode, and restore existing mobile data, normal data, and new mobile data, etc. In addition, it is possible to check in advance signaling information on the next frame, and prepare processing according to the checked information.

More specifically, in the digital broadcasting receiver having a configuration as in FIG. 51, the receiver 5100 combines data arranged in an existing mobile data region and new mobile data arranged in a normal data region in block units and receives a stream configured by SCCC coding.

Herein, the stream is divided into frame units, and one frame is divided into a plurality of sub-frames. In addition, in at least one portion of the plurality of sub-frames, signaling information on the current frame may be included, and in the remaining sub-frames of the plurality of sub-frames, signaling information on the next frame where the PRC has been considered may be included. For example, among a total of five sub-frames, in sub-frames #0 and #1, information on the current frame may be included, and in sub-frames #2, #3, and #4, information on the next frame where the PRC has been considered may be included.

In addition, the aforementioned stream may be a stream which has been SCCC coded by one of the rates of a ½ rate, a ⅓ rate, and a ¼ rate.

When the aforementioned stream is transmitted, the demodulator 5200 demodulates the stream, and the equalizer 5300 equalizes the demodulated stream.

The decoder 5400 decodes at least one of existing mobile data and new mobile data from the equalized stream. In this case, it is possible to prepare for processing the next frame in advance using the frame information included in each sub-frame.

As aforementioned, the digital broadcasting receiver may adequately process the stream transmitted from the digital broadcasting transmitter according to various exemplary embodiments. Explanation and illustration on the stream processing method of the digital broadcasting receiver are omitted.

The configuration of the receiver according to the aforementioned variously changed exemplary embodiments is also similar to the configuration of other exemplary embodiments, and thus, explanation and illustration thereon are also omitted.

Although exemplary embodiments have been shown and described, it would be appreciated by those skilled in the art that changes may be made in these embodiments without departing from the principles and spirit of the inventive concept, the scope of which is defined in the claims and their equivalents.

What is claimed is:

1. A stream processing method of a digital broadcasting transmitter, the method comprising:
   generating a transport stream comprising a first data area, in which first mobile data is placed, and a second data area in which second mobile data is variably placed according to mode;
   performing serially concatenated convolution code (SCCC) coding on the transport stream; and
   transmitting, by a transmitter apparatus, the SCCC coded transport stream,
   wherein the SCCC coding is performed by at least one of a ½ rate, a ⅓ rate, and a ¼ rate.

2. The method according to claim 1, wherein the first mobile data and second mobile data are arranged differently according to at least one of a setting state of a Reed Solomon (RS) frame mode, a block mode and a slot mode.

3. The method according to claim 1, wherein a rate of the SCCC coding is applied differently according to a setting state of an SCCC outer code mode.

4. The method according to claim 1, wherein the stream is divided into frame units,
   wherein one frame is divided into a plurality of sub-frames, and
   wherein, in at least a portion of the plurality of sub-frames, signaling information on a current frame is included, while in remaining sub-frames of the plurality of sub frames, signaling information on a next frame is included.

5. A digital broadcasting transmitter comprising:
   a data preprocessor which generates a transport stream including a first data area, in which first mobile data is placed, and a second data area, in which second mobile data is variably placed according to mode, and performs serially concatenated convolution code (SCCC) coding on the transport stream; and
   a transmitter which transmits the SCCC coded transport stream,
   wherein the SCCC coding is performed by at least one of a ½ rate, a ⅓ rate, and a ¼ rate.

6. The digital broadcasting transmitter according to claim 5, wherein the first mobile data and second mobile data are arranged differently according to at least one of a setting state of a Reed Solomon (RS) frame mode, a block mode and a slot mode.

7. The digital broadcasting transmitter according to claim 5, wherein a rate of the SCCC coding is applied differently according to a setting state of an SCCC outer code mode.

8. The digital broadcasting transmitter according to claim 5, wherein the stream is divided into frame units,
   wherein one frame is divided into a plurality of sub-frames, and wherein, in at least a portion of the plurality of sub-frames, signaling information on a current frame is included, while in remaining sub-frames of the plurality of sub frames, signaling information on a next frame is included.

9. A stream processing method of a digital broadcasting receiver, the method comprising:
receiving a stream generated by including a first data area, in which first mobile data is placed, and a second data area, in which second mobile data is variably placed according to mode, and performing serially concatenated convolution code (SCCC) coding on the stream;
demodulating the stream;
equalizing the demodulated stream; and
decoding at least one of the first mobile data and the second mobile data from the equalized stream,
wherein the SCCC coding is performed by at least one of a ½ rate, a ⅓ rate, and a ¼ rate.

10. The method according to claim 9, wherein the stream is divided into frame units,
wherein one frame is divided into a plurality of sub-frames, and
wherein, in at least a portion of the plurality of sub-frames, signaling information on a current frame is included, while in remaining sub-frames of the plurality of sub frames, signaling information on a next frame is included.

11. A digital broadcasting receiver comprising:
a receiver which receives a stream generated by including a first data area, in which first mobile data is placed, and a second data area, in which second mobile data is variably placed according to mode, and performing serially concatenated convolution code (SCCC) coding on the stream;
a demodulator which equalizes the demodulated stream; and
a decoder which decodes at least one of the first mobile data and the second mobile data from the equalized stream,
wherein the SCCC coding is performed by at least one of a ½ rate, a ⅓ rate, and a ¼ rate.

12. The digital broadcasting receiver according to claim 11, wherein the stream is divided into frame units,
wherein one frame is divided into a plurality of sub-frames, and
wherein, in at least a portion of the plurality of sub-frames, signaling information on a current frame is included, while in remaining sub-frames of the plurality of sub frames, signaling information on a next frame is included.

* * * * *